United States Patent
Yamanaka et al.

(10) Patent No.: US 11,028,988 B2
(45) Date of Patent: Jun. 8, 2021

(54) LIGHT SOURCE DEVICE AND LIGHTING DEVICE

(71) Applicant: Panasonic Intellectual Property Management Co., Ltd., Osaka (JP)

(72) Inventors: Kazuhiko Yamanaka, Osaka (JP); Hideki Kasugai, Shiga (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 48 days.

(21) Appl. No.: 16/184,125

(22) Filed: Nov. 8, 2018

(65) Prior Publication Data

US 2019/0097095 A1 Mar. 28, 2019

Related U.S. Application Data

(63) Continuation of application No. PCT/JP2017/016707, filed on Apr. 27, 2017.

(30) Foreign Application Priority Data

May 13, 2016 (JP) .............................. JP2016-097487

(51) Int. Cl.
*H01L 33/50* (2010.01)
*G02B 5/02* (2006.01)
(Continued)

(52) U.S. Cl.
CPC .............. *F21S 41/16* (2018.01); *F21S 41/176* (2018.01); *F21S 41/192* (2018.01);
(Continued)

(58) Field of Classification Search
CPC .......... F21S 41/16; F21S 41/25; F21S 41/365; F21S 41/321; F21S 41/285; F21S 41/176;
(Continued)

(56) References Cited

U.S. PATENT DOCUMENTS 7,250,715 B2 * 7/2007 Mueller ............. C09K 11/0883
313/485
9,611,426 B2 * 4/2017 Iba ......................... C04B 35/117
(Continued)

FOREIGN PATENT DOCUMENTS

JP 2012-089316 A 5/2012
JP 2013-26094 A 2/2013
(Continued)

OTHER PUBLICATIONS

Extended European Search Report issued in corresponding European Patent Application No. 17795981.4, dated Mar. 29, 2019.
(Continued)

*Primary Examiner* — Natalia A Gondarenko
(74) *Attorney, Agent, or Firm* — McDermott Will & Emery LLP

(57) ABSTRACT

A light source device includes a semiconductor light-emitting device which emits coherent excitation light, and a wavelength conversion element which is spaced from the semiconductor light-emitting device, generates fluorescence by converting the wavelength of the excitation light emitted from semiconductor light-emitting device, and generates scattered light by scattering the excitation light. The wavelength conversion element includes a support member, and a wavelength converter disposed on the support member. The wavelength converter includes a first wavelength converter, and a second wavelength converter which is disposed around the first wavelength converter to surround the first wavelength converter in a top view of the surface of the support member on which the wavelength converter is disposed. The ratio of the intensity of fluorescence to that of scattered light is lower in the second wavelength converter than in the first wavelength converter.

20 Claims, 35 Drawing Sheets

(51) Int. Cl.

| | | |
|---|---|---|
| *G02B 27/10* | (2006.01) | |
| *F21S 41/16* | (2018.01) | |
| *F21S 41/32* | (2018.01) | |
| *F21S 41/20* | (2018.01) | |
| *F21V 9/38* | (2018.01) | |
| *F21S 45/70* | (2018.01) | |
| *F21S 41/176* | (2018.01) | |
| *F21S 41/19* | (2018.01) | |
| *F21S 41/39* | (2018.01) | |
| *F21V 9/32* | (2018.01) | |
| *H01S 5/00* | (2006.01) | |
| *F21S 41/365* | (2018.01) | |
| *F21V 9/45* | (2018.01) | |
| *F21V 13/14* | (2006.01) | |
| *F21V 7/24* | (2018.01) | |
| *H01S 5/02326* | (2021.01) | |
| *F21Y 115/30* | (2016.01) | |
| *H01S 5/0683* | (2006.01) | |
| *H01S 5/068* | (2006.01) | |
| *H01S 5/323* | (2006.01) | |
| *H01S 5/02251* | (2021.01) | |
| *H01S 5/02255* | (2021.01) | |

(52) U.S. Cl.
CPC ............ *F21S 41/285* (2018.01); *F21S 41/321* (2018.01); *F21S 41/365* (2018.01); *F21S 41/39* (2018.01); *F21S 45/70* (2018.01); *F21V 7/24* (2018.02); *F21V 9/32* (2018.02); *F21V 9/38* (2018.02); *F21V 9/45* (2018.02); *F21V 13/14* (2013.01); *G02B 5/0205* (2013.01); *G02B 27/1006* (2013.01); *H01L 33/502* (2013.01); *H01S 5/005* (2013.01); *H01S 5/02326* (2021.01); *F21Y 2115/30* (2016.08); *H01S 5/02251* (2021.01); *H01S 5/02255* (2021.01); *H01S 5/0683* (2013.01); *H01S 5/06825* (2013.01); *H01S 5/32341* (2013.01)

(58) Field of Classification Search
CPC .......... F21S 41/192; F21S 41/39; F21S 45/70; H01L 33/50–508; H01L 33/58; H01L 33/60; H01L 33/52; H01L 33/54; H01L 33/62; H01L 2933/0041; H01L 2933/0025; H01L 2933/005; H01L 2933/0058; H01L 2933/0091; H01L 2933/0083; H01S 5/0683; H01S 5/02292; H01S 5/02252; H01S 5/005; H01S 5/06825; H01S 5/32341; H01S 5/02284; F21V 9/32; F21V 9/38; F21V 9/45; F21V 7/24; F21V 13/14; F21Y 2115/30; G02B 5/0205; G02B 27/1006
USPC ...................................................... 257/98, 99
See application file for complete search history.

(56) References Cited

U.S. PATENT DOCUMENTS

| | | | |
|---|---|---|---|
| 2012/0074833 A1 | 3/2012 | Yuan et al. | |
| 2013/0100692 A1 | 4/2013 | Yokobayashi | |
| 2013/0250544 A1 | 9/2013 | Zink et al. | |
| 2013/0264937 A1* | 10/2013 | Sakuta | H01L 33/504 313/503 |
| 2014/0369064 A1* | 12/2014 | Sakaue | F21V 9/40 362/553 |
| 2017/0030532 A1* | 2/2017 | Ryohwa | C09K 11/025 |
| 2017/0329130 A1* | 11/2017 | Mitterlehner | F21S 41/14 |

FOREIGN PATENT DOCUMENTS

| | | |
|---|---|---|
| JP | 2013-089814 A | 5/2013 |
| JP | 2013-182918 A | 9/2013 |
| WO | 2012128384 A1 | 9/2012 |
| WO | 2013051623 A1 | 4/2013 |

OTHER PUBLICATIONS

International Search Report issued in Application No. PCT/JP2017/016707 dated Jul. 4, 2017, with English translation.

* cited by examiner

LIGHT SOURCE DEVICE AND LIGHTING DEVICE

CROSS REFERENCE TO RELATED APPLICATIONS

This application is a U.S. continuation application of PCT International Patent Application Number PCT/JP2017/016707 filed on Apr. 27, 2017, claiming the benefit of priority of Japanese Patent Application Number 2016-097487 filed on May 13, 2016, the entire contents of which are hereby incorporated by reference.

BACKGROUND

1. Technical Field

This disclosure relates to light source devices and lighting devices.

2. Description of the Related Art

Conventional light source devices including a semiconductor light-emitting device and a wavelength conversion element are proposed (see Japanese Unexamined Patent Application Publication No 2012-89316, for example). As a light source device of this type, the light source device disclosed in Japanese Unexamined Patent Application Publication No 2012-89316 will be described with reference to FIG. 39. FIG. 39 is a schematic view illustrating a conventional light source device. FIG. 39 illustrates a sectional view (a) and a top view (b) of the conventional light source device 1020.

As illustrated in the sectional view (a) of FIG. 39, light source device 1020 disclosed in Japanese Unexamined Patent Application Publication No 2012-89316 includes semiconductor light-emitting device 1005 which emits excitation light having a predetermined wavelength in a wavelength range from ultraviolet light to visible light, fluorescent layer 1002 which the excitation light from semiconductor light-emitting device 1005 enters, and light-reflective substrate 1006 disposed on a surface of fluorescent layer 1002 opposite to the surface thereof which the excitation light enters.

In this configuration, fluorescent layer 1002 is fixed to light-reflective substrate 1006 through bonding portion 1007.

Semiconductor light-emitting device 1005 and fluorescent layer 1002 are spaced from each other to form a reflective light source device 1020.

Fluorescent layer 1002 contains a fluorescent which is excited by the excitation light from semiconductor light-emitting device 1005, generating the fluorescence having a wavelength longer than the wavelength of the excitation light.

Absorber 1009 or a scattering unit is disposed around fluorescent layer 1002. Absorber 1009 absorbs the excitation light and the scattering unit scatters (thermally diffuses) the excitation light when the excitation light from semiconductor light-emitting device 1005 enters.

The excitation light entering fluorescent layer 1002 from semiconductor light-emitting device 1005 forms a beam on the incident surface of the fluorescent layer, the beam having a cross-sectional shape and a cross-sectional area substantially equal to those of the entire incident surface of the fluorescent layer.

It is proposed that such a configuration prevents unevenness in color in light emission points (light emission pattern) in fluorescent layer 1002.

SUMMARY

In the case where absorber 1009 is disposed around fluorescent layer 1002 in light source device 1020 disclosed in Japanese Unexamined Patent Application Publication No 2012-89316, the excitation light partially enters absorber 1009. Additionally, among the components of the emission light from fluorescent layer 1002, the fluorescence emitted from the lateral surface of fluorescent layer 1002, i.e., the surface of fluorescent layer 1002 in contact with absorber 1009 enters absorber 1009. As a result, absorber 1009 absorbs the excitation light and the fluorescence, reducing the light emission efficiency of the light source device.

In the case where a scattering unit in place of absorber 1009 is disposed around fluorescent layer 1002, the excitation light which enters the scattering unit is scattered on the surface of the scattering unit, and is emitted. As a result, without being mixed with the fluorescence, the excitation light is emitted from a surrounding region of the light emission region of light source device 1020. In the case where the light from such a light source device is projected to form an image, blue light of the excitation light is annularly projected around the white region of the central portion of the image. Such a phenomenon occurs even in the case where absorber 1009 is disposed around fluorescent layer 1002. This is because there is no material for absorber 1009 which is inexpensive and 100% absorbs the excitation light.

In the case where such a light source device is used as a lighting device, it is difficult to control the color distribution of the entire projected image.

Accordingly, an object of the present disclosure is to provide a light source device having high usage efficiency of excitation light and enabling free design of projected images and illuminance distribution and color distribution around the projected images, and a lighting device including the light source device.

To achieve the object above, the light source device according to the present disclosure is a light source device including a semiconductor light-emitting device which emits excitation light that is coherent; and a wavelength conversion element which is spaced from the semiconductor light-emitting device, generates fluorescence by converting a wavelength of the excitation light emitted from the semiconductor light-emitting device, and generates scattered light by scattering the excitation light. The wavelength conversion element includes a support member, and a wavelength converter disposed on the support member. The wavelength converter includes a first wavelength converter, and a second wavelength converter which is disposed around the first wavelength converter to surround the first wavelength converter in a top view of a surface of the support member on which the wavelength converter is disposed. The ratio of an intensity of the fluorescence to an intensity of the scattered light is lower in the second wavelength converter than in the first wavelength converter.

In such a configuration, the second wavelength converter is disposed around the first wavelength converter. For this reason, the luminance and spectrum of the emission light from the second wavelength converter can be freely designed by appropriately adjusting the configuration of the second wavelength converter. Accordingly, the emission of only the excitation light from the surrounding region of the light emission region can be prevented in the light source device in the case where the light emission region is formed mainly through irradiation of the first wavelength converter with the excitation light. Furthermore, the luminance distribution and color distribution in and around the light emission region can be freely designed. Accordingly, the illuminance distribution and color distribution of a projected image and a portion around the projected image can be freely designed. Moreover, the configuration above can reduce the loss of the excitation light and the fluorescence, compared to the case where the second wavelength converter is replaced with an absorber. In other words, the usage efficiency of the excitation light can be improved.

Furthermore, in the light source device according to the present disclosure, the first wavelength converter may have a second surface facing the support member, a first surface opposite to the second surface, and a lateral surface connecting the first surface to the second surface. The wavelength conversion element may include a reflective member which covers at least part of the second surface and at least part of the lateral surface.

Such a configuration can reflect the excitation light and the fluorescence traveling from the wavelength converter toward the support member, and the reflected excitation light and fluorescence can be used as emission light. Accordingly, the light source device can have improved conversion efficiency.

To achieve the object above, the light source device according to the present disclosure is a light source device including a semiconductor light-emitting device which emits excitation light that is coherent; and a wavelength conversion element which is spaced from the semiconductor light-emitting device, generates fluorescence by converting a wavelength of the excitation light emitted from the semiconductor light-emitting device, and generates transmission light by transmitting the excitation light. The wavelength conversion element includes a support member, and a wavelength converter disposed on the support member. The wavelength converter includes a first wavelength converter, and a second wavelength converter which is disposed around the first wavelength converter to surround the first wavelength converter in a top view of a surface of the support member on which the wavelength converter is disposed. The ratio of an intensity of the fluorescence to an intensity of the transmission light is lower in the second wavelength converter than in the first wavelength converter.

In such a configuration, the second wavelength converter is disposed around the first wavelength converter. For this reason, the luminance and spectrum of the emission light from the second wavelength converter can be freely designed by appropriately adjusting the configuration of the second wavelength converter. Accordingly, the emission of the excitation light from a region around the light emission region can be prevented in the light source device in the case where the light emission region is formed mainly through irradiation of the first wavelength converter with the excitation light. Furthermore, the luminance distribution and color distribution in and around the light emission region can be freely designed. Moreover, the configuration above can reduce the loss of the excitation light and the fluorescence, compared to the case where the second wavelength converter is replaced with an absorber. In other words, the usage efficiency of the excitation light can be improved.

Furthermore, in the light source device according to the present disclosure, a cross-sectional shape and a cross-sectional area of the excitation light on an incident surface of the first wavelength converter which the excitation light enters may be substantially equal to a shape and an area of the incident surface of the first wavelength converter.

Such a configuration can improve the uniformity of the luminance distribution in the central portion of the light emission region, and can prevent the emission of the excitation light from a region around the light emission region without being mixed with the fluorescence.

Furthermore, in the light source device according to the present disclosure, the first wavelength converter may include a first emitting region which the excitation light enters, and a cross-sectional shape and a cross-sectional area of the excitation light on an incident surface of the first emitting region which the excitation light enters may be substantially equal to a shape and an area of the incident surface of the first emitting region.

Such a configuration can improve the uniformity of the luminance distribution in the central portion of the light emission region, and can prevent the emission of the excitation light from a region around the light emission region without being mixed with the fluorescence.

Furthermore, in the light source device according to the present disclosure, the first wavelength converter may include a first emitting region which the excitation light enters and from which the transmission light is emitted, and a cross-sectional shape and a cross-sectional area of the excitation light on an incident surface of the first emitting region which the excitation light enters may be substantially equal to a shape and an area of the incident surface of the first emitting region.

Such a configuration can improve the uniformity of the luminance distribution in the central portion of the light emission region, and can prevent the emission of the excitation light from a region around the light emission region without being mixed with the fluorescence.

Furthermore, in the light source device according to the present disclosure, the first wavelength converter may be formed of a single fluorescent material.

In such a configuration, the first wavelength converter in the wavelength converter is made of a single material having a uniform refractive index. For this reason, the uniformity of the luminance distribution in the central portion of the light emission region can be improved through the multiple reflection of the excitation light inside the first wavelength converter.

Furthermore, in the light source device according to the present disclosure, the first wavelength converter may encapsulate a plurality of air voids.

In such a configuration, the first wavelength converter is made of a single material having a uniform refractive index, and contains air voids, which are a scattering body. For this reason, uneven light emission distribution can be prevented through the multiple reflection of the excitation light inside the first wavelength converter.

Furthermore, in the light source device according to the present disclosure, the first wavelength converter may contain fluorescent particles and a transparent bonding material.

In such a configuration, the first wavelength converter can scatter the excitation light at the interfaces between the fluorescent particles and the transparent bonding material, preventing an uneven light emission distribution.

Furthermore, in the light source device according to the present disclosure, the second wavelength converter may contain a fluorescent material different from the fluorescent material contained in the first wavelength converter.

Such a configuration enables free design such that the conversion efficiency into fluorescence and the spectrum of the emission light in the second wavelength converter are different from those in the first wavelength converter.

Furthermore, in the light source device according to the present disclosure, fluorescent particles contained in the second wavelength converter may have an average particle diameter different from an average particle diameter of fluorescent particles contained in the first wavelength converter.

Such a configuration enables free design such that the conversion efficiency into fluorescence in the second wavelength converter is different from that in the first wavelength converter.

Furthermore, in the light source device according to the present disclosure, the fluorescent particles contained in the first wavelength converter may have a volume proportion different from a volume proportion of the fluorescent particles contained in the second wavelength converter.

Such a configuration enables free design such that the conversion efficiency into fluorescence in the second wavelength converter is different from that in the first wavelength converter.

Moreover, the light source device according to the present disclosure includes a semiconductor light-emitting device which emits laser light, a wavelength conversion element which emits fluorescence after irradiation with the laser light emitted as excitation light from the semiconductor light-emitting device, a first filter which part of light components emitted from the wavelength conversion element enters, a first photodetector which the light components through the first filter enters, a second photodetector which light emitted from the wavelength conversion element enters, and a third photodetector which the excitation light enters.

In such a configuration, the light source device can detect the ratio of the quantity of the fluorescence to that of the scattered light in the emission light from the wavelength conversion element, and the ratio of the quantity of the fluorescence to that of the excitation light. Accordingly, a state of subtle abnormality inside the light source device can be detected during the operation of the light source device in the case where the position of a component included in the light source device is deviated.

Furthermore, the light source device according to the present disclosure may include a second filter which part of light components emitted from the wavelength conversion element enters, and light passing through the second filter may enter the second photodetector.

Furthermore, the light source device according to the present disclosure may include a reflective member which guides light emitted from the wavelength conversion element to the first detector.

Furthermore, the light source device according to the present disclosure may include a reflective member which guides light emitted from the wavelength conversion element to the second detector.

Furthermore, the light source device according to the present disclosure may include a converging member which converges laser light emitted from the semiconductor light-emitting device, and emits the laser light to the wavelength conversion element.

Furthermore, the first detector, the second detector, and the third detector may be disposed on a single substrate in the light source device according to the present disclosure.

Moreover, the lighting device according to the present disclosure includes the light source device described above.

The lighting device can provide the same effect as that of the light source device.

This disclosure can provide a light source device which can maintain high conversion efficiency and enables free design of luminance distribution and color distribution in and around a light emission region, and a lighting device including the light source device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Embodiments will now be described with reference to the drawings. The following embodiments will not limit the present disclosure. Numeral values, components, arrangements, positions, and connection forms of the components, steps, order of the steps, and the like shown in the embodiments below are only examples, and will not limit the present disclosure. The drawings are schematic or conceptual. Relations between thicknesses and widths of portions, ratios of dimensions of portions, and the like are not always the same as actual relations and ratios thereof. Even substantially identical portions may be represented with different dimensions or ratios according to the drawings. The duplication of description of substantially identical configurations will be omitted in some cases. Among the components of the embodiments below, the components not described in an independent claim representing the most superordinate concept of the present disclosure are described as arbitrary components.

A variety of modifications of the present embodiments conceived and made by persons skilled in the art without departing from the gist of the present disclosure are also included in the present disclosure. Moreover, at least part of multiple embodiments can be combined without departing from the gist of the present disclosure.

Through this specification, the term "above" does not indicate an upper direction (vertically upper direction) in absolute spatial recognition, and is used as a term defined by a relative positional relation in a laminate configuration based on the order of lamination. The term "above" is used not only in the case where two components are disposed at an interval and another component is interposed therebetween, but also in the case where two components are closely disposed in contact with each other.

Embodiment 1

The light source device according to Embodiment 1 will now be described with reference to the drawings.

Figure 1:
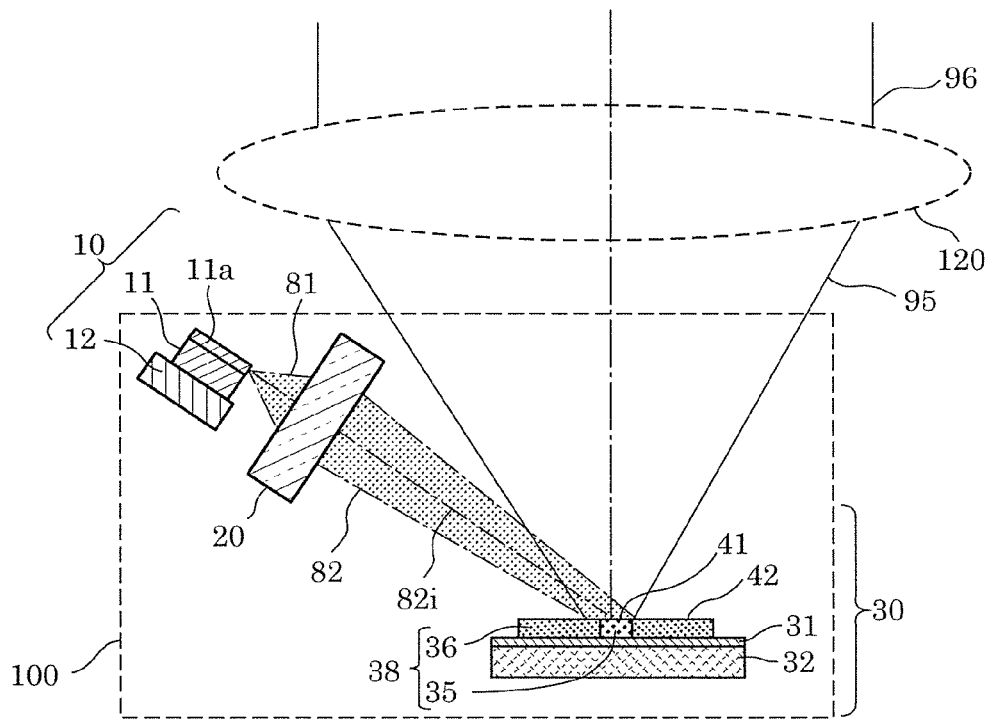
FIG. 1 is a schematic sectional view illustrating a schematic configuration of a light source device according to Embodiment 1.

FIG. 1 is a schematic sectional view illustrating a schematic configuration of light source device 100 according to the present embodiment.

As illustrated in FIG. 1, light source device 100 according to the present embodiment includes semiconductor light-emitting device 10, light converging optical system 20, and wavelength conversion element 30.

Semiconductor light-emitting device 10 is a device which emits coherent excitation light, and includes semiconductor light-emitting element 11.

Semiconductor light-emitting element 11 is a semiconductor laser element (such as a laser chip) composed of a nitride semiconductor, for example, and emits laser light having a peak wavelength in the range of wavelength of 380 nm to 490 nm as excitation light 81. As illustrated in FIG. 1, in the present embodiment, semiconductor light-emitting element 11 is mounted on support member 12 such as a silicon carbide substrate, and is mounted on a package not illustrated.

As an exemplary configuration, semiconductor light-emitting element 11 includes a substrate (which is a GaN substrate), and a lamination of a first clad, a light emission layer (which is an InGaN multi-quantum well layer), and a second clad disposed on the substrate.

Semiconductor light-emitting element 11 also includes optical waveguide 11a.

Electricity is input into semiconductor light-emitting element 11 from the outside of light source device 100. For example, laser light generated in optical waveguide 11a of semiconductor light-emitting element 11 and having a peak wavelength of 445 nm is emitted toward light converging optical system 20 as excitation light 81.

Light converging optical system 20 is an optical system which converges excitation light 81 emitted from semiconductor light-emitting element 11. Light converging optical system 20 can have any configuration which can converge excitation light 81. For example, one or several convex lenses can be used as light converging optical system 20, and more specifically, an optical system composed of a combination of an aspherical convex lens and a spherical convex lens can be used. Light converging optical system 20 converges excitation light 81 emitted from semiconductor light-emitting element 11 and having an emission angle in a horizontal direction and a vertical direction, and generates propagation light 82, which is excitation light that propagates through the space toward wavelength conversion element 30 while being collimated or converged. Propagation light 82 propagates along central axis 82i, and is emitted to wavelength conversion element 30. At this time, central axis 82i is set so as to form a predetermined angle with a normal line of the surface of wavelength conversion element 30 (i.e., the surface which propagation light 82 enters). The angle can be 60 degrees or more and 80 degrees or less.

Wavelength conversion element 30 is spaced from semiconductor light-emitting device 10. The element generates fluorescence by converting the wavelength of the excitation light emitted from semiconductor light-emitting device 10 and generates scattered light by scattering the excitation light. In the present embodiment, wavelength conversion element 30 is irradiated with propagation light 82 as excitation light. Wavelength conversion element 30 then converts the wavelength of at least part of the components of propagation light 82, and emits the components having the converted wavelengths. Hereinafter, wavelength conversion element 30 will be described with reference to FIG. 1 as well as FIGS. 2A, 2B, 2C, 2D, 2E, 2F, 2G, 2H, 2I, and 2J.

Figure 2A:
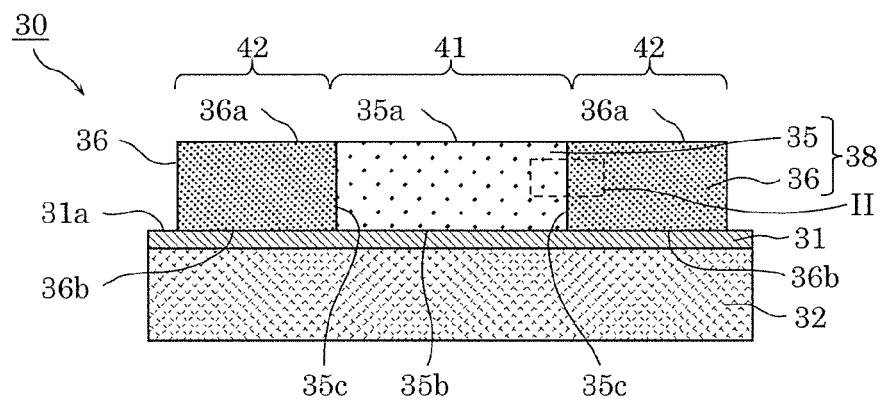
FIG. 2A is a schematic sectional view illustrating a schematic configuration illustrating a wavelength conversion element according to Embodiment 1.
Figure 2B:
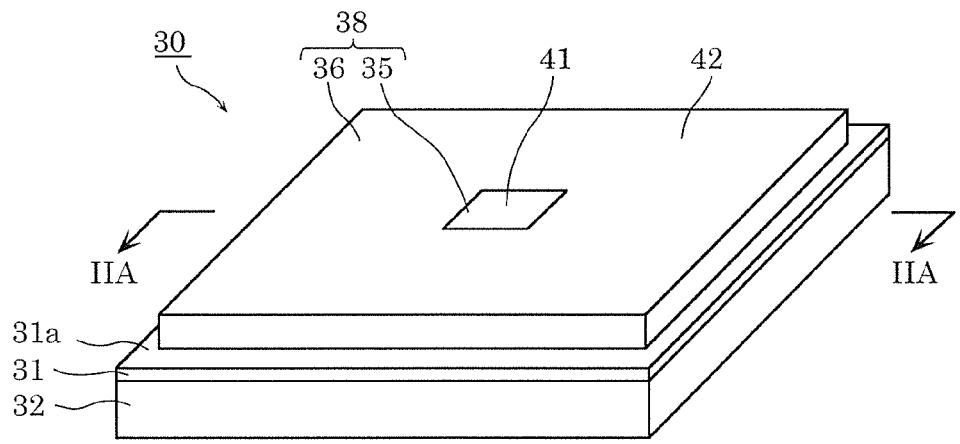
FIG. 2B is a schematic perspective view illustrating the schematic configuration of the wavelength conversion element according to Embodiment 1.
Figure 2C:
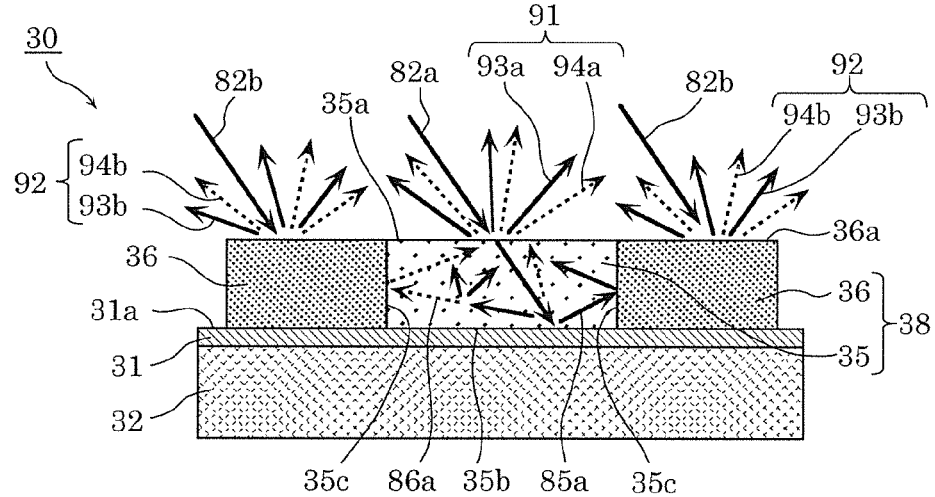
FIG. 2C is a schematic sectional view illustrating the function of the wavelength conversion element according to Embodiment 1.

FIG. 2A is a schematic sectional view illustrating a schematic configuration of wavelength conversion element 30 according to the present embodiment. FIG. 2B is a schematic perspective view illustrating the schematic configuration of wavelength conversion element 30 according to the present embodiment. FIG. 2C is a schematic sectional view illustrating the function of wavelength conversion element 30 according to the present embodiment. FIGS. 2D, 2E, 2F, 2G, 2H, 2I, and 2J each are a partially enlarged schematic sectional view illustrating one example of a schematic configuration of wavelength conversion element 30 according to the present embodiment. FIGS. 2D, 2E, 2F, 2G, 2H, 2I, and 2J illustrate enlarged sectional views each corresponding to the inside of frame II illustrated with a dashed line in FIG. 2A.

As illustrated in FIG. 1, wavelength conversion element 30 is irradiated with propagation light 82 emitted from semiconductor light-emitting element 11 and having a predetermined cross-sectional area and predetermined light distribution. As illustrated in FIG. 1 and FIGS. 2A to 2C, wavelength conversion element 30 includes support member 32, and wavelength converter 38 disposed on support member 32. Wavelength converter 38 includes first wavelength converter 35, and second wavelength converter 36 disposed around first wavelength converter 35 to surround the first wavelength converter in a top view of the surface of support member 32 on which wavelength converter 38 is disposed. First and second wavelength converters 35 and 36 contain a fluorescent material activated with a rare earth element. The fluorescent material absorbs at least part of the components of propagation light 82, and emits fluorescence having a wavelength different from that of propagation light 82 as light subjected to the wavelength conversion.

As illustrated in FIGS. 2A and 2C, in the present embodiment, first wavelength converter 35 has second surface 35b facing support member 32, first surface 35a opposite to second surface 35b, and lateral surface 35c connecting first surface 35a to second surface 35b. Wavelength conversion element 30 includes reflective member 31 covering at least part of second surface 35b and at least part of lateral surface 35c.

More specifically, as illustrated in FIG. 2B, wavelength conversion element 30 includes support member 32 in the form of a plate having a rectangular outer shape, for example, reflective member 31 disposed on support member 32, first wavelength converter 35, and second wavelength converter 36. First wavelength converter 35 is disposed in a central portion of surface 31a of reflective member 31, and second wavelength converter 36 is disposed around first wavelength converter 35.

As described above, first wavelength converter 35 has the surfaces, i.e., second surface 35b facing support member 32 (i.e., located on the side of support member 32), first surface 35a opposite to second surface 35b (i.e., located on the side opposite to support member 32), and lateral surface 35c connecting first surface 35a to second surface 35b. In the present embodiment, lateral surface 35c faces second wavelength converter 36.

Similarly, second wavelength converter 36 has the surfaces, i.e., second surface 36b facing support member 32, and first surface 36a opposite to second surface 35b.

In the present embodiment, first wavelength converter 35 is in contact with second wavelength converter 36 at lateral surface 35c.

At this time, the average refractive index of first wavelength converter 35 is different from that of second wavelength converter 36. In other words, the average refractive index varies at lateral surface 35c, that is, the interface between first wavelength converter 35 and second wavelength converter 36.

The configuration of first wavelength converter 35 and second wavelength converter 36 will now be more specifically described with reference to FIGS. 2D, 2E, 2F, 2G, 2H, 2I, and 2J. First wavelength converter 35, second wavelength converter 36, and their interface in the present embodiment can be implemented in several forms.

Figure 2D:
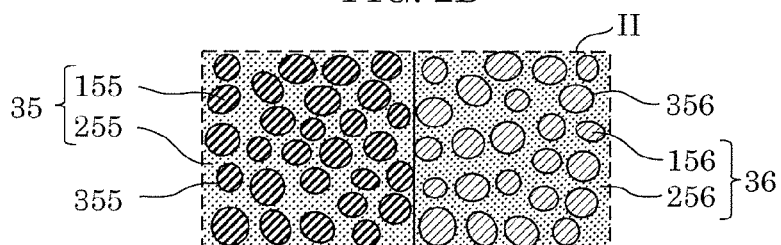
FIG. 2D is a partially enlarged, schematic sectional view illustrating one example of a schematic configuration of the wavelength conversion element according to Embodiment 1.

A first example will be initially described with reference to FIG. 2D. FIG. 2D is an enlarged view of first wavelength converter 35, second wavelength converter 36, and their interface of wavelength conversion element 30. First wavelength converter 35 contains fluorescent particles 155 and transparent bonding material 255, and second wavelength converter 36 contains fluorescent particles 156 and transparent bonding material 256. Here, at least one of the fluorescent particles and the transparent bonding material is different between first wavelength converter 35 and second wavelength converter 36. Such a configuration can vary the average refractive index of first wavelength converter 35 and that of second wavelength converter 36 at lateral surface 35c. In addition, the conversion efficiency can be freely designed such that the conversion efficiency into fluorescence in second wavelength converter 36 is different from that of first wavelength converter 35.

Figure 2E:
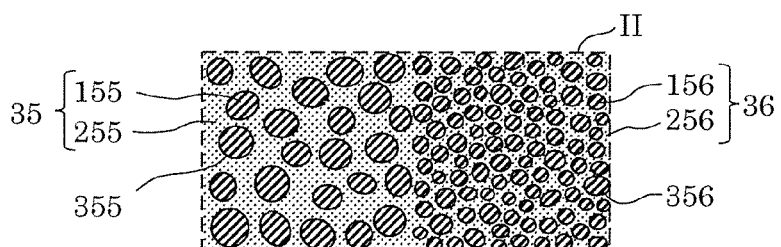
FIG. 2E is a partially enlarged, schematic sectional view illustrating one example of a schematic configuration of the wavelength conversion element according to Embodiment 1.

Another method may be used. That is, first wavelength converter 35 and second wavelength converter 36 each include fluorescent particles and a transparent bonding material, first wavelength converter 35 and second wavelength converter 36 are made of the same fluorescent particles and the same transparent bonding material, and the average particle diameter of the fluorescent particles or the volume proportion of the fluorescent particles (here, (volume of the fluorescent particles)/((volume of the fluorescent particles)+(volume of the transparent bonding material))), which is the mixing ratio of the fluorescent particles and the transparent bonding material, are different between first wavelength converter 35 and second wavelength converter 36. For example, as illustrated in FIG. 2E, fluorescent particles 155 and transparent bonding material 255 of first wavelength converter 35 are identical to fluorescent particles 156 and transparent bonding material 256 of second wavelength converter 36, respectively. It should be noted that fluorescent particles 156 of second wavelength converter 36 has an average particle diameter smaller than that of fluorescent particles 155 of first wavelength converter 35. Such a configuration can vary the average refractive index of first wavelength converter 35 and that of second wavelength converter 36 at lateral surface 35c.

Similarly, as illustrated in FIG. 2E, the volume proportion of the fluorescent particles contained in first wavelength converter 35 is reduced compared to the volume proportion of the fluorescent particles contained in second wavelength converter 36. Such a configuration can vary the average refractive index of first wavelength converter 35 and that of second wavelength converter 36 at lateral surface 35c.

In the examples illustrated in FIGS. 2D and 2E, first wavelength converter 35 contains fluorescent particles 155 and transparent bonding material 255. For this reason, excitation light (propagation light 82) can be scattered at the interface between fluorescent particles 155 and transparent bonding material 255, resulting in a reduction in unevenness of light emission distribution. Furthermore, in the example illustrated in FIG. 2D, second wavelength converter 36 contains a fluorescent material different from that in first wavelength converter 35. For this reason, the conversion efficiency and the spectrum can be freely designed such that the conversion efficiency into fluorescence in the second wavelength converter and the spectrum of the emission light are different from those in the first wavelength converter.

Figure 2F:
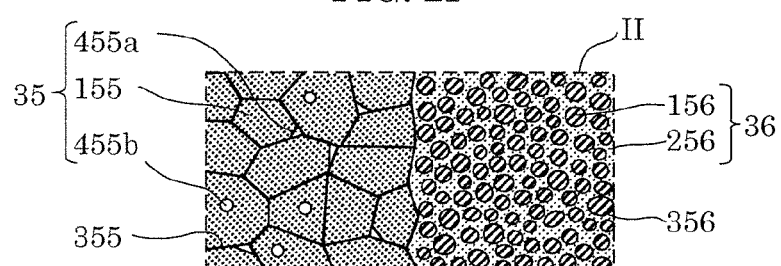
FIG. 2F is a partially enlarged, schematic sectional view illustrating one example of a schematic configuration of the wavelength conversion element according to Embodiment 1.

In another example, first wavelength converter 35 may be made of only a single fluorescent material, and second wavelength converter 36 may be formed of a mixture of fluorescent particles and a transparent bonding material. For example, as illustrated in FIG. 2F, first wavelength converter 35 is formed of a polycrystalline fluorescent material containing several different fluorescent particles 155. As a result, the average refractive index of first wavelength converter 35 is the refractive index of the polycrystalline fluorescent material. Such a configuration can vary the average refractive index of first wavelength converter 35 and that of second wavelength converter 36 at lateral surface 35c.

In the example above, first wavelength converter 35 formed of a single fluorescent material may encapsulate a plurality of air voids (air voids 455a and intraparticulate air voids 455b illustrated in FIG. 2F). In such a configuration, first wavelength converter 35 is formed of the same homogeneous material having the refractive index of the fluorescent material, and at the same time, can encapsulate air voids which serve as a scattering body. This configuration can readily provide wavelength conversion element 30 where the average refractive index of first wavelength converter 35 near lateral surface 35c is different from that of second wavelength converter 36.

In another example, first wavelength converter 35 may be formed of a ceramic composite containing a fluorescent phase and a matrix phase, and second wavelength converter 36 may be formed of a mixture of fluorescent particles and a transparent bonding material.

Figure 2G:
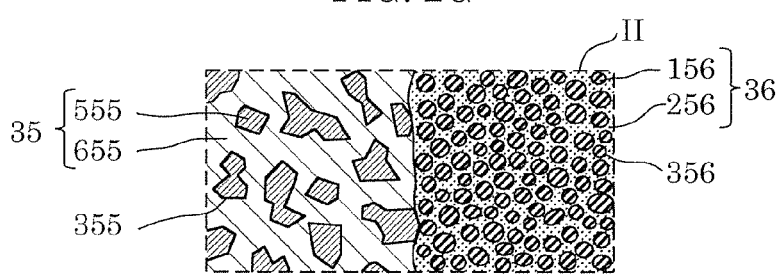
FIG. 2G is a partially enlarged, schematic sectional view illustrating one example of a schematic configuration of the wavelength conversion element according to Embodiment 1.
Figure 2H:
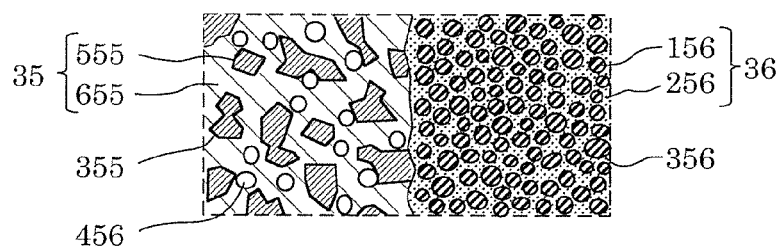
FIG. 2H is a partially enlarged, schematic sectional view illustrating one example of a schematic configuration of the wavelength conversion element according to Embodiment 1.

In the examples illustrated in FIGS. 2G and 2H, first wavelength converter 35 is composed of different fluorescent phases 555 and matrix phase 655, for example.

Such a configuration can vary the average refractive index of first wavelength converter 35 and that of second wavelength converter 36 at lateral surface 35c. Furthermore, excitation light can be scattered at interfaces 355 between fluorescent phases 555 and matrix phase 655.

Furthermore, in first wavelength converter 35 illustrated in FIG. 2H, voids 456 are disposed within matrix phase 655 or at the interface between fluorescent phase 555 and matrix phase 655. In such a configuration, first wavelength converter 35 can more readily scatter excitation light.

For example, besides the fluorescent particles, at least one of first wavelength converter 35 and second wavelength converter 36 may be composed of second particles 157 of inorganic transparent particles contained in the transparent bonding material. Such a configuration allows freer design of the average refractive index and the light scattering properties in the wavelength converter.

Figure 2I:
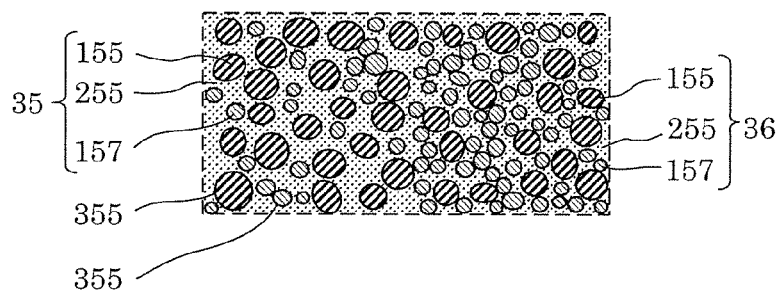
FIG. 2I is a partially enlarged, schematic sectional view illustrating one example of a schematic configuration of the wavelength conversion element according to Embodiment 1.

For example, in the configuration illustrated in FIG. 2I, first wavelength converter 35 contains second particles 157 identical to those in second wavelength converter 36. First wavelength converter 35 and second wavelength converter 36 contain at least one of fluorescent particles 155 and second particles 157 in different concentrations. In other words, the proportion of fluorescent particles 155 to second particles 157 in the wavelength converter is different between these wavelength converters. At this time, fluorescent particles 155 to be used may have a refractive index different from that of second particles 157 to be used.

In such a configuration, first wavelength converter 35 can have an average refractive index different from that of second wavelength converter 36.

For example, in FIG. 2I, second wavelength converter 36 contains a higher density of second particles 157. Such a configuration can more significantly increase the total amount of interface 355 between the transparent bonding material and the fluorescent particles and interface 355 between transparent bonding material and second particles in second wavelength converter 36 than that in first wavelength converter 35. As a result, the reflection of excitation light on lateral surface 35c can be enhanced.

Figure 2J:
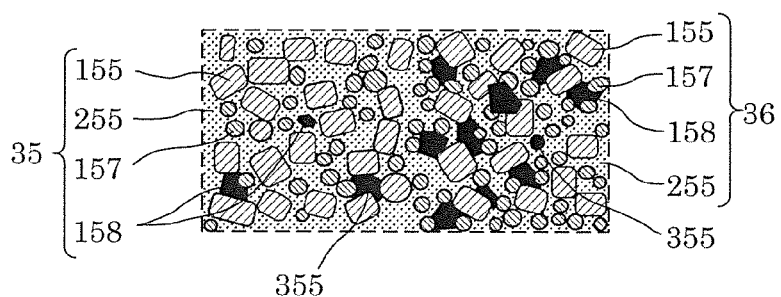
FIG. 2J is a partially enlarged, schematic sectional view illustrating one example of a schematic configuration of the wavelength conversion element according to Embodiment 1.

Furthermore, in an example illustrated in FIG. 2J, first wavelength converter 35 and second wavelength converter 36 contain voids 158. The proportion of the volume of voids 158 in the volume of the wavelength converter is different between first wavelength converter 35 and second wavelength converter 36. This can provide a configuration in which first wavelength converter 35 has an average refractive index different from that of second wavelength converter 36. Furthermore, the total area of interface 355 between voids 158 and one of transparent bonding material 255, fluorescent particles 155, and second particles 157 is different between first wavelength converter 35 and second wavelength converter 36. Accordingly, the degree of scattering of excitation light within the wavelength converter can be varied. For example, in FIG. 2J, second wavelength converter 36 has a larger amount of voids 158 than in first wavelength converter 35. Accordingly, the reflection of the excitation light can be enhanced on lateral surface 35c.

Here, first wavelength converter 35 includes first emitting region 41 which emits part of the components of incident propagation light 82 subjected to wavelength conversion. Second wavelength converter 36 includes second emitting region 42 which emits part or all of the components of propagation light 82 which do not enter first wavelength converter 35 and are subjected to wavelength conversion.

At this time, as illustrated in FIG. 2B, first surface 35a of first wavelength converter 35 has a rectangular shape, for example, seen from the entering side of propagation light 82 (in a top view of the surface of support member 32 on which wavelength converter 38 is disposed), and second wavelength converter 36 surrounds first wavelength converter 35. Accordingly, first emitting region 41 is a region corresponding to first surface 35a, and second emitting region 42 is a region corresponding to first surface 36a of second wavelength converter 36. In the present embodiment, first emitting region 41 corresponds to first surface 35a, and second emitting region 42 corresponds to first surface 36a.

At this time, first wavelength converter 35 and second wavelength converter 36 generate fluorescence by converting the wavelength of at least part of the components of incident propagation light 82, and emit the fluorescence from first surfaces 35a and 36a, respectively.

Specifically, as illustrated in FIG. 2C, incident light 82a, which is part of propagation light 82, enters first emitting region 41 of first surface 35a of first wavelength converter 35. Part of the components of incident light 82a is subjected to the wavelength conversion in first wavelength converter 35, and is emitted from first emitting region 41 as fluorescence (wavelength-converted light) 94a. The components of incident light 82a not subjected to the wavelength conversion in first wavelength converter 35 are scattered, and are emitted from first emitting region 41 as scattered light 93a. Accordingly, first emitting region 41 emits emission light 91, which is mixed light of fluorescence 94a and scattered light 93a.

Here, part of the components of incident light 82a which enters first wavelength converter 35 propagates inside first wavelength converter 35, and is converted into incident light 85a to be subjected to multiple reflection on second surface 35b and lateral surface 35c. At this time, as described above, lateral surface 35c is formed with the interface between first wavelength converter 35 and second wavelength converter 36 having different average refractive indices. For this reason, lateral surface 35c can facilitate the reflection of incident light 85a. In addition, first wavelength converter 35 also can facilitate of the multiple reflection of fluorescence 86a, which is generated by converting the wavelength of incident light 85a. Such multiple reflection of the excitation light and the fluorescence inside first wavelength converter 35 can generate emission light 91 having more uniform light emission intensity distribution in first emitting region 41 than in the case where first wavelength converter 35 and second wavelength converter 36 have the exact same configuration.

Second wavelength converter 36 also performs the wavelength conversion.

Incident light 82b, which is part of the components of propagation light 82 not entering first surface 35a, enters first surface 36a of second wavelength converter 36. Part of these components of incident light 82b is subjected to the wavelength conversion in second wavelength converter 36, and is emitted from second emitting region 42 as fluorescence 94b. The components of incident light 82b not subjected to the wavelength conversion in second wavelength converter 36 are scattered, and are emitted from second emitting region 42 as scattered light 93b. Accordingly, second emitting region 42 emits emission light 92, which is mixed light of fluorescence 94b and scattered light 93b.

Here, where the proportion of the luminous flux of the fluorescence emitted per unit quantity of incident light is defined as:

Wavelength conversion efficiency [lm/W] = [Expression 1]

$$\text{Conversion coefficient [lm/W]} \times \frac{\text{Quantity of wavelength-converted light [W]}}{\text{Quantity of incident light [W]}}$$

The wavelength conversion efficiency of second emitting region 42 is designed so as to be lower than the wavelength conversion efficiency of first emitting region 41. In the present embodiment, second wavelength converter 36 is designed such that the ratio of the intensity of the fluorescence to that of the scattered light is lower than the ratio of the intensity of the fluorescence to that of the scattered light in first wavelength converter 35. Here, in Expression 1, the conversion coefficient is coefficient S which converts the luminous flux of fluorescence according to the spectrum with a luminosity factor, and is calculated using the spectrum distribution $\Phi_e[\lambda]$ and the luminosity factor curve $K[\lambda]$ on the wavelength $\lambda$ [nm] from Expression 2:

$$S = \int_{380}^{780} K[\lambda] \Phi_e[\lambda] d\lambda \quad \text{[Expression 2]}$$

A specific configuration of wavelength conversion element 30 will now be described.

Wavelength conversion element 30 includes support member 32 including wavelength converter 38 (i.e., first wavelength converter 35 and second wavelength converter 36) on the main surface thereof. The main surface of support member 32 on which wavelength converter 38 is disposed can have a high reflectance to light having a wavelength of 380 nm to 780 nm. Furthermore, support member 32 may be formed of a material having high thermal conductivity. In such a configuration, support member 32 increases the proportion of the quantity of light emitted from first emitting region 41 to the quantity of light generated in first wavelength converter 35, and functions as a heat sink which dissipates heat generated in first wavelength converter 35.

Support member 32 is formed of a crystal material, a metallic material, or a ceramic material, for example. More specifically, support member 32 to be used can be formed of a crystal material such as silicon, sapphire, or diamond or a ceramic material such as aluminum nitride, silicon carbide, or diamond, and having a surface on which an optical film reflecting light having a wavelength of 380 nm to 780 nm is disposed. In the present embodiment, a silicon substrate is used as support member 32, and reflective member 31 is disposed on a main surface on which wavelength converter 38 is disposed. Reflective member 31 to be used can be a metal film made of Ag or Al. Support member 32 may be formed of a metallic material such as silver, copper, aluminum, or an alloy thereof.

As described with reference to FIGS. 2D, 2E, 2F, 2G, 2H, and 2I, first wavelength converter 35 and second wavelength converter 36 each contain a fluorescent material while having different average refractive indices. This configuration enables free design such that the conversion efficiency into fluorescence in second wavelength converter 36 is different from the conversion efficiency in first wavelength converter 35. A specific configuration and effect of first wavelength converter 35 and second wavelength converter 36 will be described with reference to FIGS. 2F and 2G.

First wavelength converter 35 contains a fluorescent substance, such as a garnet crystal fluorescent substance which is a YAG fluorescent substance represented by Ce-activated $A_3B_5O_{12}$ (where A contains one of Sc, Y, Sm, Gd, Tb, and Lu; B contains one of Al, Ga, and In), for example. More specifically, examples of usable fluorescent substances include monocrystalline compounds such as Ce-activated $Y_3Al_5O_{12}$, polycrystalline compounds illustrated in FIG. 2F, such as Ce-activated $Y_3Al_5O_{12}$, and ceramic YAG fluorescent substances illustrated in FIG. 2G, which are prepared by calcining a mixture of Ce-activated $Y_3Al_5O_{12}$ particles and $Al_2O_3$ particles. First wavelength converter 35 described above is fixed to the central portion of surface 31a of reflective member 31 with an adhesive (not illustrated), such as a silicone resin.

In contrast, although second wavelength converter 36 contains a YAG fluorescent substance similarly to first wavelength converter 35, second wavelength converter 36 is made of, for example, fluorescent particles having an average particle diameter (median diameter) D50 from 0.5 μm to 5 μm and mixed in a volume proportion of 50 vol % with a transparent bonding material such as silicone resin. Second wavelength converter 36 is disposed in close contact with lateral surface 35c of first wavelength converter 35. Such a second wavelength converter 36 can be readily formed by fixing first wavelength converter 35 to support member 32, applying a paste material for second wavelength converter 36 around first wavelength converter 35, and curing the paste material.

At this time, as fluorescent particles forming second wavelength converter 36, use of small fluorescent particles having an average particle diameter D50 of 0.5 μm to 5 μm can increase the surface area of the fluorescent particle per unit volume of second wavelength converter 36, compared to the case where fluorescent particles having an average particle diameter of 5 μm to 20 μm are used. Such a configuration can increase the area of interface 356 of second wavelength converter 36 having a difference in refractive index. Accompanied by this, the proportions of the scattering and the reflection of the incident light in second wavelength converter 36 can be increased more significantly than in those in first wavelength converter 35. Accordingly, the excitation light entering from the outside is reflected at a position shallower from the surface of second wavelength converter 36 than in the case of first wavelength converter 35, and is emitted to the outside. Accordingly, the excitation light can propagate inside second wavelength converter 36 through a shorter light path, thus achieving second wavelength converter 36 having a lower wavelength conversion efficiency than the wavelength conversion efficiency of first wavelength converter 35.

Furthermore, in the configuration described above, first wavelength converter 35 contains a monocrystalline or polycrystalline fluorescent substance having the same refractive index as that of the YAG fluorescent substance (refractive index of about 1.84 at a wavelength of 550 nm) and having a smaller refractive index distribution within first wavelength converter 35. A mixture of fluorescent particles 156, i.e., a YAG fluorescent substance which is a material for second wavelength converter 36, and transparent bonding material 256, which is a silicone resin (refractive index: about 1.4) is used to design such that first wavelength converter 35 and second wavelength converter 36 have different average refractive indices. As illustrated in FIG. 2C, in such a configuration, incident light 82a entering first wavelength converter 35 propagates inside first wavelength converter 35, and is subjected to wavelength conversion while being subjected to multiple reflection on lateral surface 35c and second surface 35b, which is a bonding surface to reflective member 31. Fluorescence 94a converted in first wavelength converter 35 also propagates inside first wavelength converter 35, and is emitted from first emitting region 41 while being subjected to multiple reflection on second surface 35b and lateral surface 35c. For this reason, even when incident light (propagation light) 82a entering first emitting region 41 has high location dependency of light intensity distribution, first emitting region 41 can emit uniform scattered light 93a and fluorescence 94a having low location dependency of light intensity distribution.

At this time, second wavelength converter 36 has larger scattering reflection of incident light and fluorescence near the interface than that in first wavelength converter 35. Accordingly, the multiple reflection of incident light and fluorescence on lateral surface 35c can be enhanced.

As illustrated in FIG. 2G, the above effect can also be achieved with first wavelength converter 35 including a ceramic fluorescent substance including a YAG fluorescent substance as fluorescent particles 155 and $Al_2O_3$ (refractive index: about 1.77) as transparent bonding material 255. This is because the fluorescent particles and the transparent bonding material in the ceramic fluorescent substance have a smaller difference in refractive index than that between the YAG fluorescent substance and the silicone resin (refractive index: about 1.4) of the mixture thereof contained in second wavelength converter 36. Such a configuration can facilitate the propagation of the incident light inside the first wavelength converter and the multiple reflection thereof on the lateral surface and the like.

The optical effect of wavelength conversion element 30 will now be described in more detail with reference to FIGS. 3 and 4.

Figure 3:
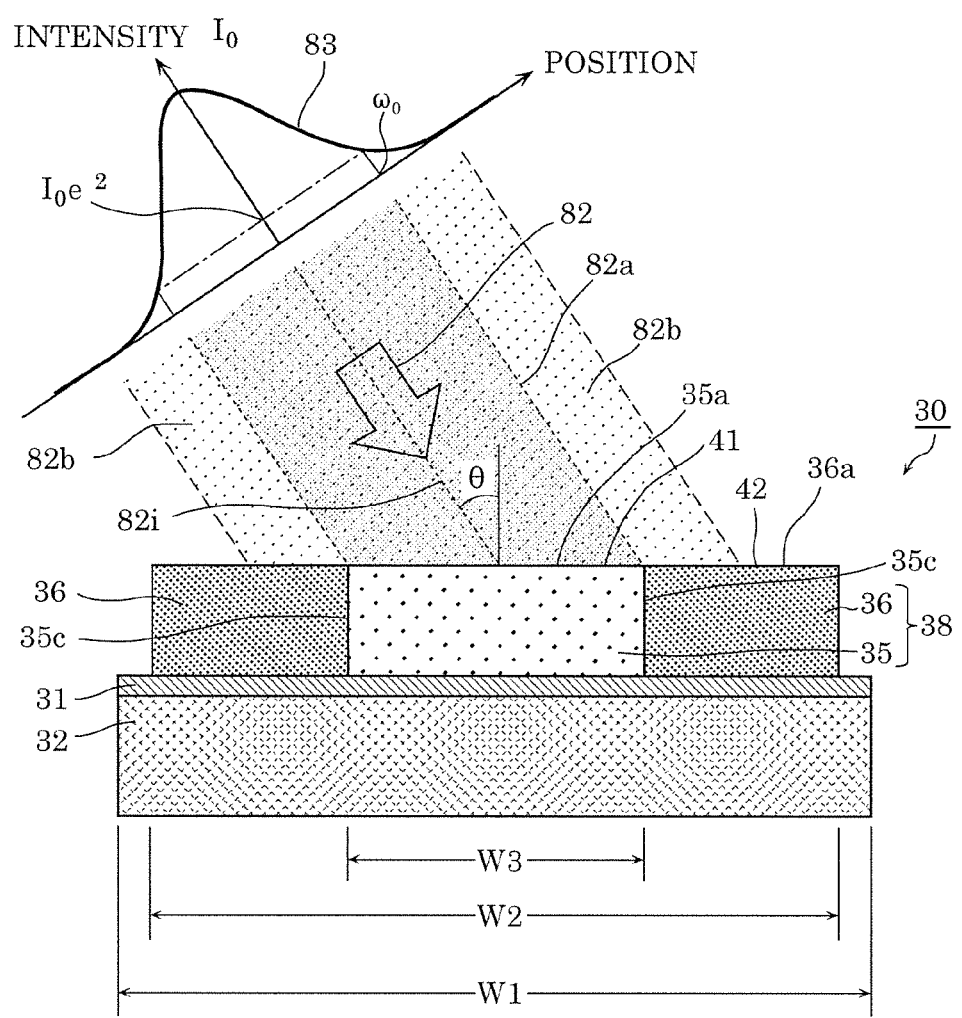
FIG. 3 is a schematic sectional view for illustrating the function of the wavelength conversion element according to Embodiment 1.

FIG. 3 is a schematic sectional view for illustrating a function of wavelength conversion element 30 according to the present embodiment. FIG. 4 illustrates graphs illustrating the schematic luminance distribution of the emitting region in wavelength conversion element 30 according to the present embodiment and a wavelength conversion element according to Comparative Example. Graph (a) of FIG. 4 illustrates the luminance distribution of first emitting region 41 and second emitting region 42 of wavelength conversion element 30 according to the present embodiment. Graph (b) of FIG. 4 illustrates the luminance distribution of the emitting region of the wavelength conversion element according to Comparative Example.

As illustrated in FIG. 3, wavelength conversion element 30 is irradiated with propagation light 82 from immediately above first wavelength converter 35 or from an appropriately oblique direction. At this time, wavelength conversion element 30 is irradiated with propagation light 82, for example, laser light having a central wavelength between 380 nm and 490 nm from a spatially distant position. The laser light which propagates from a spatially distant position usually has a large light intensity in central axis 82i, and the intensity continuously and mildly reduces at a position remoter from central axis 82i. In other words, the laser light which propagates from a spatially distant position has a Gaussian distribution as illustrated in light intensity distribution 83 of FIG. 3. At this time, among the components of propagation light 82, the components near central axis 82i having a high light intensity are excitation light, and the components of the excitation light emitted to first wavelength converter 35 are defined as incident light 82a. The components of the excitation light which is relatively remote from central axis 82i, has a light intensity lower than that near central axis 82i, and are not emitted to first wavelength converter 35 are defined as incident light 82b.

Here, assume that the two-dimensional intensity distribution in a cross-section vertical to the direction of central axis 82i of propagation light 82 has an ideal Gaussian distribution in a concentric form. In a cross-section containing central axis 82i of propagation light 82, a distance from a position where propagation light 82 has a maximum light intensity to a position where the light intensity of propagation light 82 is $1/e^2$ (about 13.5%) of the maximum value is defined as $\omega_0$. Also, the diameter in the cross-section of propagation light 82 is defined as $2\omega_0$. In other words, the width of the region in which the light intensity is equal to or higher than $1/e^2$ (about 13.5%) of the central intensity (peak intensity) is defined as $2\omega_0$.

At this time, as illustrated in FIG. 3, where the angle of incidence of propagation light 82 to first surface 35a of first wavelength converter 35 is defined as θ, the width of the region on first surface 35a having a light intensity equal to or higher than $1/e^2$ of the central intensity corresponds to $2\omega_0/\cos\theta$.

At this time, where width W3 of first wavelength converter 35 illustrated in FIG. 3 is set to be equal to or higher than $2\omega_0/\cos\theta$, the peak value of the light intensity of incident light 82b entering second wavelength converter 36 is 13.5% or less, i.e., 0 to 13.5% of the peak value of the light intensity of incident light 82a entering first wavelength converter 35.

The emission light from wavelength conversion element 30 in the case where propagation light 82 enters wavelength conversion element 30 as described above will be described with reference to FIG. 4.

Figure 4:
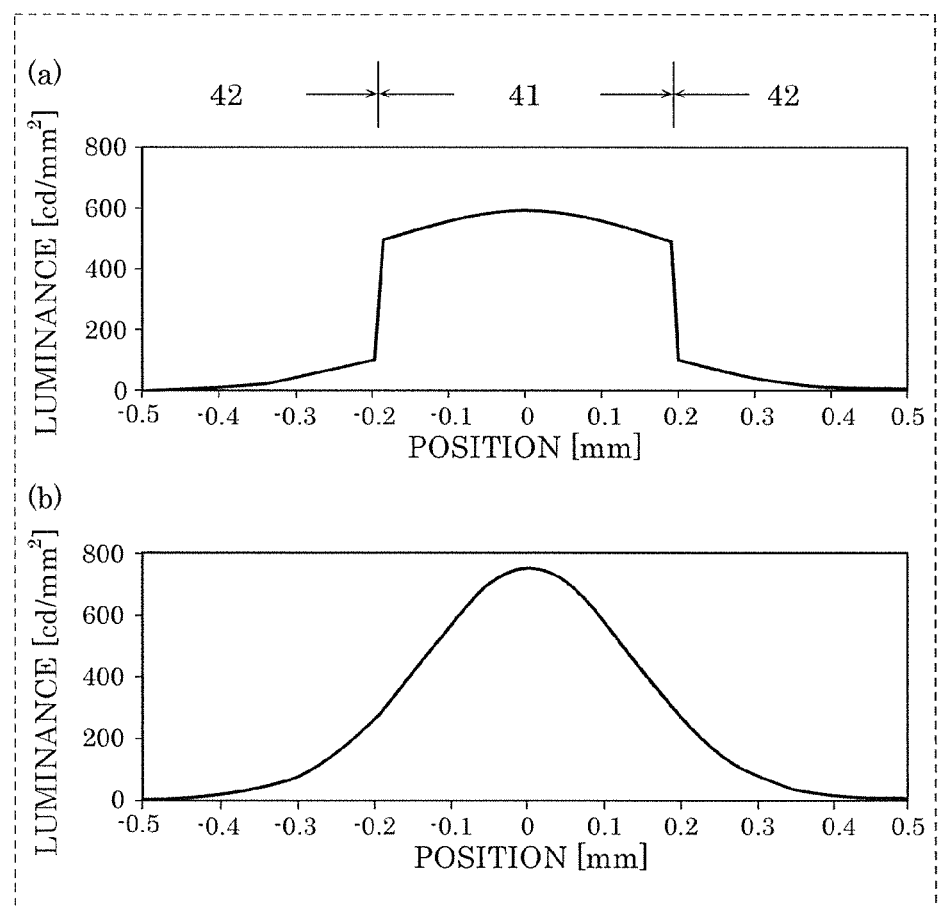
FIG. 4 is graphs illustrating schematic luminance distribution in the emitting region of the wavelength conversion element according to Embodiment 1 and that of a wavelength conversion element according to Comparative Example.

Graph (a) of FIG. 4 schematically illustrates the luminance distribution of the emission light in first emitting region 41 and second emitting region 42 in the case where the incident light above enters wavelength conversion element 30 according to the present embodiment. Graph (b) of FIG. 4 illustrates the luminance distribution in first emitting region 41 and the second emitting region 42 in the case of Comparative Example where the incident light above enters a wavelength conversion element including the first wavelength converter and the second wavelength converter formed of the same material.

As illustrated in graph (b) of FIG. 4, the wavelength conversion element according to Comparative Example has a luminance distribution which reflects the light intensity distribution of the incident light. In contrast, as illustrated in graph (a) of FIG. 4, light source device 100 including wavelength conversion element 30 according to the present embodiment has an approximately uniform luminance distribution is obtained in first emitting region 41, which is a central portion of the emission light, and has a reduced luminance in second emitting region 42, which is a peripheral portion of the emission light. In other words, only the central portion of the emitting region has a luminance distribution where a uniform and high luminance is observed.

This is because incident light 82a is subjected to multiple reflection in first wavelength converter 35, which is the central portion of the emission light, resulting in a uniform intensity of the emission light in first wavelength converter 35 (first emitting region 41). Similarly, fluorescence 86a generated in first wavelength converter 35 is also subjected to multiple reflection in first wavelength converter 35, resulting in a uniform intensity.

The emission light from the entire wavelength converter 38 has a luminous flux substantially identical to the luminous flux of the conventional wavelength conversion element.

The effect of light source device 100 having such a configuration on a projected image will be described with reference to FIGS. 1, 5, and 6A to 6C.

Figure 5:
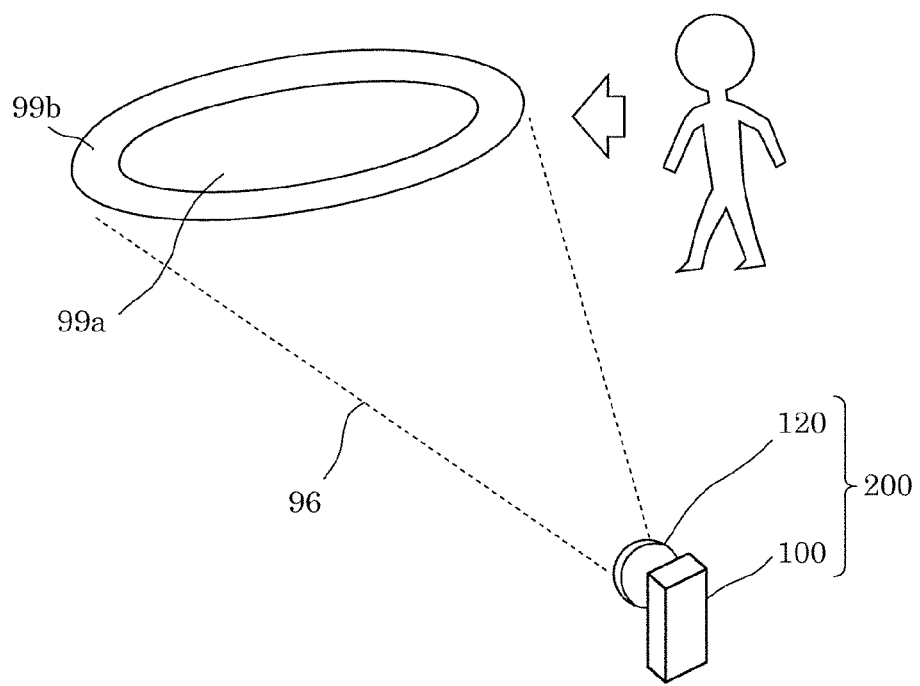
FIG. 5 is a view schematically illustrating a projected image obtained by a lighting device including the light source device according to Embodiment 1 in combination with a light projecting member.
Figure 6A:
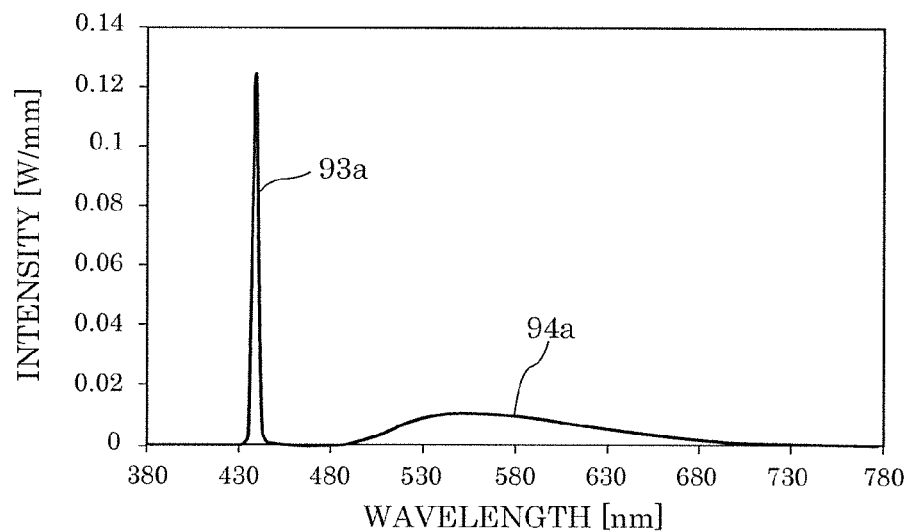
FIG. 6A is a graph illustrating a spectrum of emission light in a first emitting region of the light source device according to Embodiment 1.
Figure 6B:
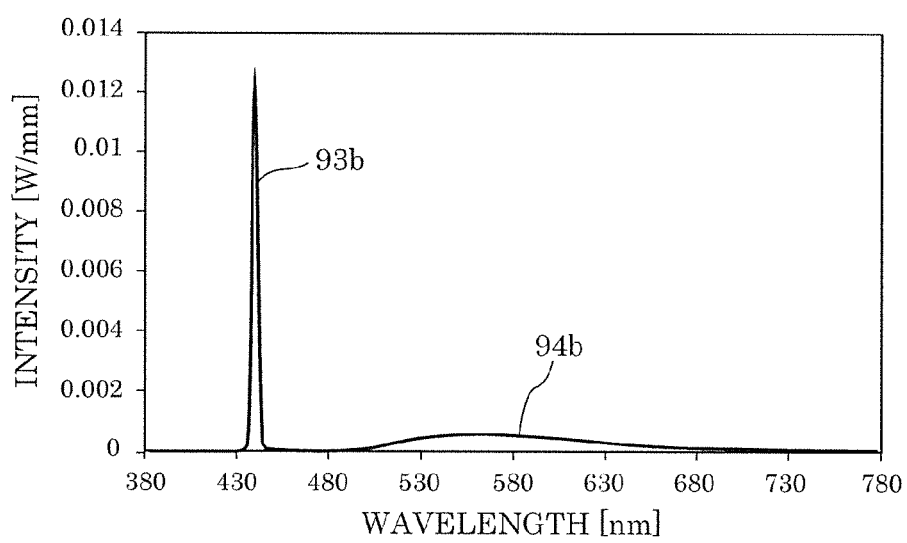
FIG. 6B is a graph illustrating a spectrum of emission light in a second emitting region of the light source device according to Embodiment 1.
Figure 6C:
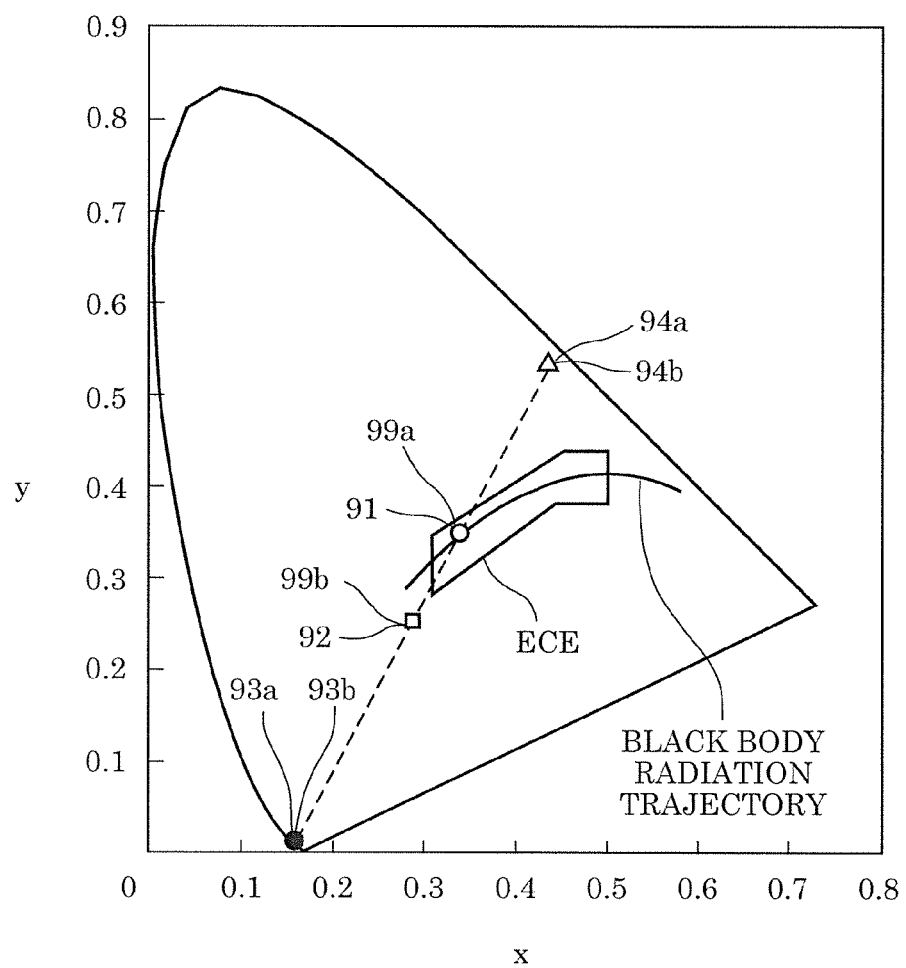
FIG. 6C is a chromaticity diagram illustrating the color distribution of projection light from the light source device according to Embodiment 1.

FIG. 5 is a diagram schematically illustrating a projected image formed by lighting device 200 including a combination of light source device 100 according to the present embodiment with light projecting member 120. FIGS. 6A and 6B are graphs illustrating the spectra of emission light 91 and emission light 92 in first emitting region 41 and second emitting region 42 in light source device 100 according to the present embodiment, respectively. FIG. 6C is a chromaticity diagram illustrating a color distribution of the projection light of light source device 100 according to the present embodiment. FIG. 6C also illustrates the region of white light in the chromaticity coordinates specified by Economic Commission for Europe (ECE) standards.

As illustrated in FIG. 1, emission light 91 and emission light 92 emitted from wavelength conversion element 30 according to the present embodiment are emitted from light source device 100 as emission light 95. Emission light 95 is projected as projection light 96 onto a predetermined position through light projecting member 120, such as a projection lens. As illustrated in FIG. 5, the projection light 96 projected at this time forms projected image 99a with the projection light emitted from first emitting region 41 and projected image 99h with the projection light emitted from second emitting region 42. It should be noted that the projection light forming the projected image 99b has a low illuminance and the projection light forming projected image 99a has a uniform and high illuminance. The illuminance drastically changes at the boundary between projected image 99a and projected image 99b. As described above, lighting device 200 according to the present embodiment can provide projection light 96 providing a high contrast between projected image 99a and projected image 99b around projected image 99a.

For this reason, for example, in the case where lighting device 200 according to the present embodiment is used as a headlamp for vehicles, the illuminance distribution can be readily controlled: for example, the illuminance is increased on the surface of a road far ahead and is decreased in its surrounding are, for example, on a sidewalk.

Furthermore, the chromaticity of the region having a low illuminance, i.e., the chromaticity of projected image 99b corresponds to the chromaticity obtained by mixing the spectrum of excitation light 81 emitted from semiconductor light-emitting device 10 with the spectrum of fluorescence 94b generated in second wavelength converter 36. Accordingly, the formation of projected image 99a and projected image 99b having a large difference in chromaticity can be prevented. Specifically, as illustrated in FIG. 5, for example, when a person passes across the light path of projection light 96, such a configuration can prevent the person from feeing blue light corresponding to the excitation light and feeling white light corresponding to the mixed light of the scattered light and the fluorescence.

Specifically, as illustrated in FIGS. 6A and 6C, for example, first emitting region 41 emits emission light 91, which is white light, at the chromaticity coordinates (0.34, 0.35) where scattered light 93a at the chromaticity coordinates (0.16, 0.01) is mixed with fluorescence 94a at the chromaticity coordinates (0.44, 0.54). Emission light 91 is then projected onto a predetermined position as projected image 99a.

In contrast, as illustrated in FIGS. 6B and 6C, second emitting region 42 emits emission light 92, which is white light, at the chromaticity coordinates (0.29, 0.25) where scattered light 93b at the chromaticity coordinates (0.16, 0.01) is mixed with fluorescence 94b at the chromaticity coordinates (0.44, 0.54). Emission light 92 is then projected onto a predetermined position as projected image 99b. At this time, projected image 99b is formed as a projection of light at the chromaticity coordinates close to that of the light forming projected image 99a, rather than scattered light 93b. For this reason, a chromaticity distribution in which blue irradiation light is present in the region around the projected image can be prevented. Different values of the chromaticity coordinates of emission light 91 and emission light 92 are attributed to the difference in the ratio of the intensity of the fluorescence to that of the scattered light as illustrated in FIGS. 6A and 6B.

As illustrated in FIG. 6C, the chromaticity coordinates of emission light 91 corresponding to most of the components of emission light 95 from light source device 100 are contained in the region of white light in the chromaticity coordinates specified by the ECE standards. For this reason, light source device 100 can be used as a headlamp for vehicles, for example. In other words, light source device 100 can be used as a headlamp for automobiles by controlling the chromaticity coordinates corresponding to the white light components in the whole emission light 95 to fall within the range specified by the ECE standards.

First wavelength converter 35 and second wavelength converter 36 can have any other configuration than the configuration described above. For example, as illustrated in FIG. 2E, first wavelength converter 35 may be formed with a mixed material containing fluorescent particles having an average particle diameter D50 of 5 μm to 20 μm and a transparent bonding material, and second wavelength converter 36 may be formed with a mixed material containing fluorescent particles having an average particle diameter D50 of 0.5 μm to 5 μm and a transparent bonding material. Use of such mixed materials can increase the surface area of the fluorescent particle per unit volume of second wavelength converter 36, that is, interface 356 of the refractive index, compared to the surface area of the fluorescent particle per unit volume of first wavelength converter 35, i.e., interface 355 of the refractive index. As a result, the reflectance on lateral surface 35c of the light from first wavelength converter 35 toward second wavelength converter 36 can be increased, enhancing the multiple reflection. In this case, the same material, such as a silicone resin, can be used as the transparent bonding material for first wavelength converter 35 and second wavelength converter 36.

In the case where a monocrystalline fluorescent substance is used as first wavelength converter 35, as illustrated in FIG. 2F, interfaces 355 or a plurality of crystal grain boundaries may be disposed in first wavelength converter 35 to increase the scattering properties inside first wavelength converter 35. Furthermore, air voids 455a and intraparticulate air voids 455b may be encapsulated. Such a configuration can increase the scattering properties, preventing uneven light emission distribution caused by the multiple reflection of the excitation light inside first wavelength converter 35.

Moreover, as illustrated in FIG. 2D, for example, by selecting fluorescent particles 155 made of a YAG fluorescent substance as a fluorescent substance for first wavelength converter 35 and fluorescent particles 156 made of a silicate fluorescent substance as a fluorescent substance for second wavelength converter 36, first wavelength converter 35 and second wavelength converter 36 may include different fluorescent materials. Such different fluorescent materials can result in different internal degrees of scattering between first wavelength converter 35 and second wavelength converter 36. Thereby, the wavelength conversion efficiencies of first wavelength converter 35 and second wavelength converter 36 can be freely varied.

By varying the configurations of first wavelength converter 35 and second wavelength converter 36 by the method described above, the value of the chromaticity coordinate x of first wavelength converter 35 is made smaller than that of the chromaticity coordinate x of second wavelength converter 36 while the chromaticity coordinates corresponding to the white light components of the whole emission light 95 are controlled to fall within the range specified by the ECE standards. First wavelength converter 35 and second wavelength converter 36 having such configurations may be used in a headlamp for automobiles. In this case, the values of the chromaticity coordinates of the central portion of the projected image can be readily reduced compared to those of the peripheral portion thereof.

The cross-sectional shape and the cross-sectional area of the excitation light (propagation light 82) on the incident surface of first wavelength converter 35 may be substantially identical to the shape and the area of the incident surface of first wavelength converter 35. Such a configuration can improve the uniformity of the luminance distribution in the central portion of the light emission region, and prevent the emission of the excitation light from the surrounding region of light emission region without being mixed with fluorescence.

First wavelength converter 35 includes first emitting region 41 which excitation light (propagation light 82) enters. The cross-sectional shape and the cross-sectional area of the excitation light on the incident surface of first emitting region 41 may be substantially identical to the shape and the area on the incident surface of first emitting region 41. Such a configuration can improve the uniformity of the luminance distribution in the central portion of the light emission region, and prevent the emission of the excitation light from the surrounding region of light emission region without being mixed with fluorescence.

[Example of Specific Configuration]

A more specific configuration of light source device 100 according to the present embodiment will now be described with reference to the drawings.

Figure 7:
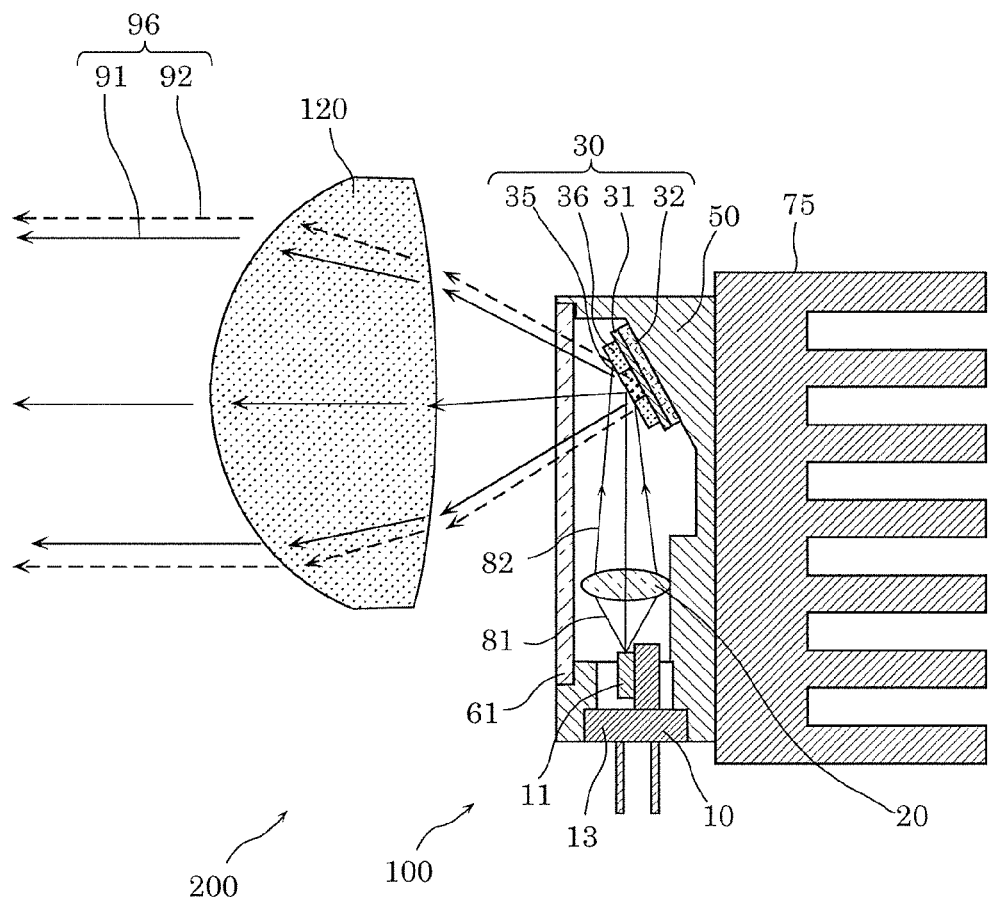
FIG. 7 is a schematic sectional view illustrating a schematic configuration of a lighting device including the light source device according to Embodiment 1.
Figure 8:
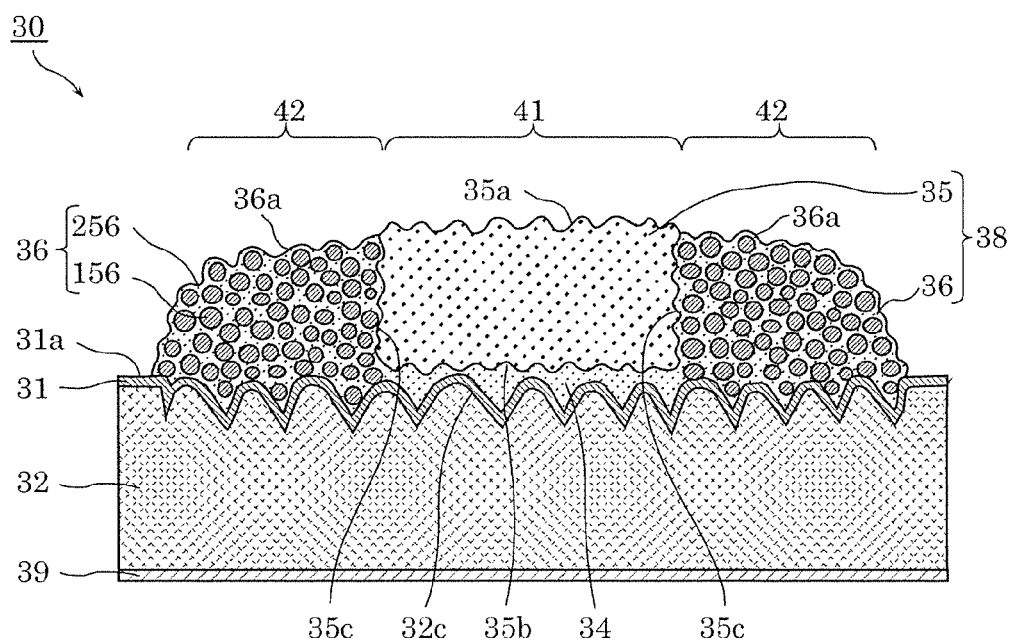
FIG. 8 is a schematic sectional view illustrating a specific configuration of the wavelength conversion element in the light source device according to Embodiment 1.

FIG. 7 is a schematic sectional view illustrating a schematic configuration of lighting device 200 including light source device 100 according to the present embodiment. FIG. 8 is a schematic sectional view illustrating a specific configuration of wavelength conversion element 30 in light source device 100 according to the present embodiment.

In FIG. 7, semiconductor light-emitting device 10, light converging optical system 20, and wavelength conversion element 30 are fixed to housing 50 made of an aluminum alloy, for example. Housing 50 is enclosed with cover member 61, which is a cover glass, for example. The optical axes of excitation light 81 and propagation light 82 are disposed within the space enclosed with housing 50 and cover member 61. In semiconductor light-emitting device 10, semiconductor light-emitting element 11 is mounted on package 13, which is a TO-CAN package, for example. Wavelength conversion element 30 includes support member 32, and reflective member 31 disposed thereon. First wavelength converter 35 is fixed onto reflective member 31, and second wavelength converter 36 is disposed around first wavelength converter 35. Light source device 100 having such a configuration is fixed to heat dissipating member 75, such as a heat dissipating fin. Light projecting member 120, such as a projection lens, is disposed on the light paths of emission light 91 and emission light 92 from light source device 100.

As described above, lighting device 200 can have a configuration including light source device 100, light projecting member 120, and heat dissipating member 75.

A more specific configuration of wavelength conversion element 30 included in light source device 100 illustrated in FIG. 7 will now be described with reference to FIG. 8.

In wavelength conversion element 30, first wavelength converter 35 and second wavelength converter 36 are disposed on surface 31a of reflective member 31 formed of a metal oxide film made of $SiO_2$ or $TiO_2$ or a metal film made of Ag or Al, for example. Reflective member 31 is supported by support member 32 composed of a silicon substrate, for example. Furthermore, for example, projections and depressions 32c illustrated in FIG. 8 may be formed on the surface of support member 32 composed of a silicon substrate by lithography and etching, and reflective member 31 may be formed on the surface of support member 32 having these projections and depressions 32c. Then, first wavelength converter 35, which is a ceramic fluorescent substance prepared through calcining of a mixture of a Ce-activated YAG fluorescent substance and $Al_2O_3$, for example, is fixed to the central portion of surface 31a using bonding material 34, such as a silicone adhesive. At this time, an irregular surface may be formed on first surface 35a, second surface 35b, and lateral surface 35c of first wavelength converter 35 to enhance the multiple reflection and scattering of light. Second wavelength converter 36 is disposed around first wavelength converter 35. Second wavelength converter 36 is formed of a mixed material of fluorescent particles 156 (such as Ce-activated YAG fluorescent particles having an average particle diameter D50 of 2 μm) and transparent bonding material 256 (such as silsesquioxane).

Such a configuration can facilitate of the configuration of wavelength conversion element 30.

Then, adhesive layer 39, which is a metal film made of Ti of Au, for example, is formed on the surface of support member 32 on which wavelength converter 38 is not disposed. Adhesive layer 39 is fixed to housing 50 with solder not illustrated, for example.

Modifications of Embodiment 1

Modifications 1 to 4 of Embodiment 1 will now be described with reference to the drawings.

Figure 9A:
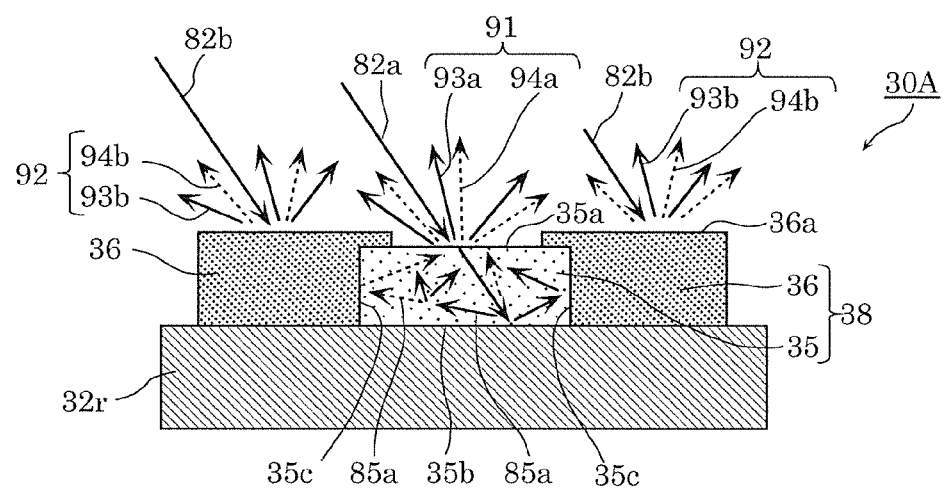
FIG. 9A is a schematic sectional view illustrating a schematic configuration of a wavelength conversion element according to Modification 1 of Embodiment 1.
Figure 9B:
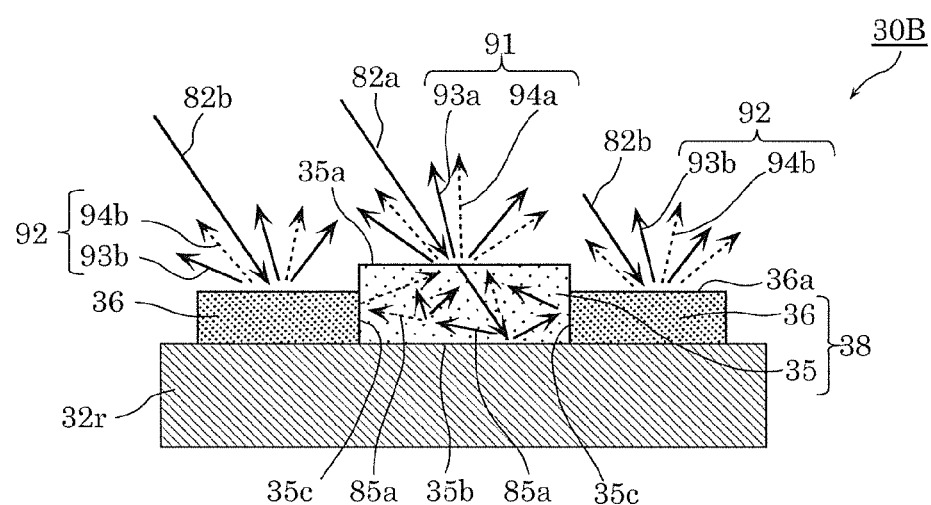
FIG. 9B is a schematic sectional view illustrating a schematic configuration of a wavelength conversion element according to Modification 2 of Embodiment 1.
Figure 10A:
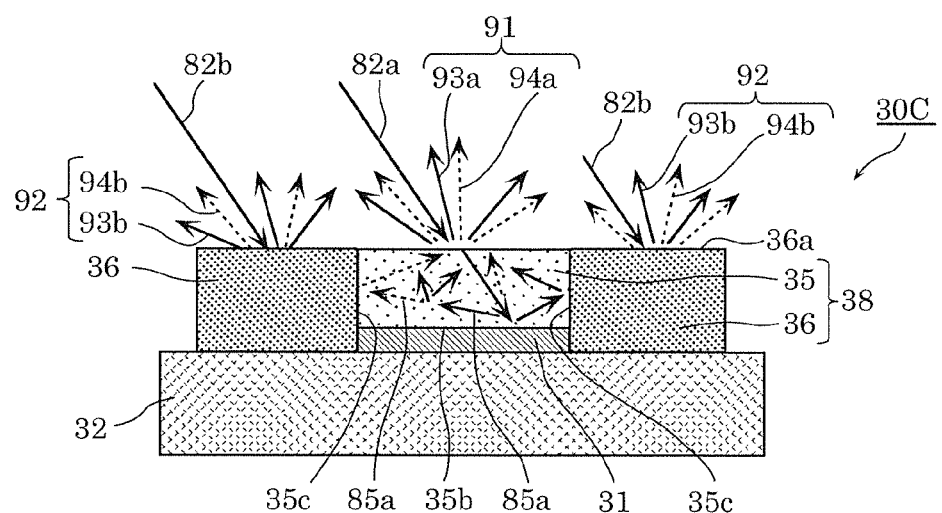
FIG. 10A is a schematic sectional view illustrating a schematic configuration of a wavelength conversion element according to Modification 3 of Embodiment 1.
Figure 10B:
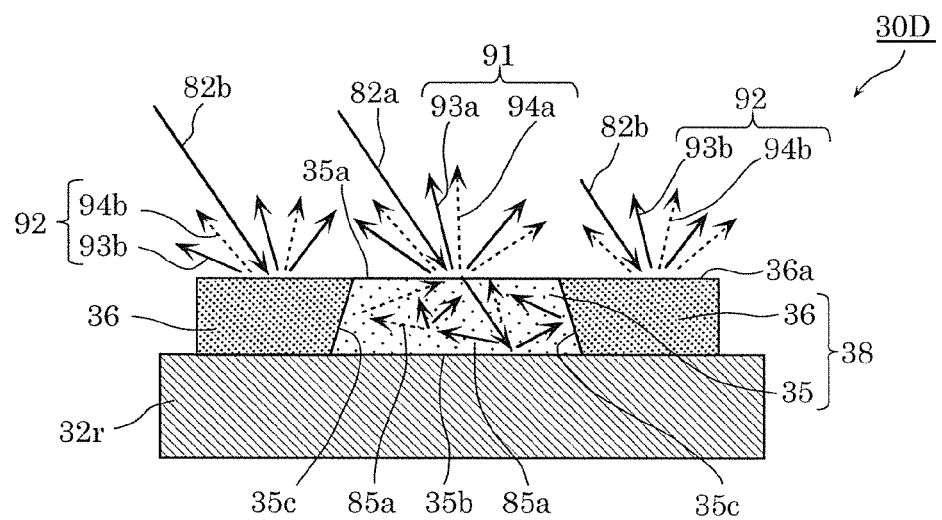
FIG. 10B is a schematic sectional view illustrating a schematic configuration of a wavelength conversion element according to Modification 4 of Embodiment 1.

FIG. 9A is a schematic sectional view illustrating a schematic configuration of wavelength conversion element 30A according to Modification 1 of the present embodiment. FIG. 9B is a schematic sectional view illustrating a schematic configuration of wavelength conversion element 30B according to Modification 2 of the present embodiment. FIG. 10A is a schematic sectional view illustrating a schematic configuration of wavelength conversion element 30C according to Modification 3 of the present embodiment. FIG. 10B is a schematic sectional view illustrating a schematic configuration of wavelength conversion element 30D according to Modification 4 of the present embodiment.

As in wavelength conversion element 30A according to Modification 1 illustrated in FIG. 9A, second wavelength converter 36 may cover a peripheral portion of first surface 35a (top surface in FIG. 9A) of first wavelength converter 35. In other words, portions other than the central portion of first surface 35a of first wavelength converter 35 may be covered with second wavelength converter 36. In wavelength conversion element 30A according to the present modification, first emitting region 41 can be defined as a central region of first surface 35a not covered with second wavelength converter 36, i.e., a region of first surface 35a exposed to the outside.

In wavelength conversion element 30A having such a configuration, incident light 85a subjected to multiple reflection in first wavelength converter 35 is reflected not only on lateral surface 35c and second surface 35b but also on part of first surface 35a, enabling an increase in wavelength conversion efficiency in first wavelength converter 35. At this time, second wavelength converter 36 on first wavelength converter 35 has a thickness smaller than that of first wavelength converter 35. The thickness of second wavelength converter 36 can be equal to or less than a half of the thickness of first wavelength converter 35. In such a configuration, emission light 91 emitted from first wavelength converter 35 can also be emitted through second wavelength converter 36 disposed on first wavelength converter 35. For this reason, as in Embodiment 1, the uniformity of the luminance distribution in the central portion of the light emission region of the wavelength conversion element can be improved.

Moreover, wavelength conversion element 30A according to the present modification includes support member 32r formed of a material having high reflectance to the light having a wavelength of 380 nm to 780 nm. Support member 32r is formed of a metallic material of silver, copper, aluminum, or an alloy thereof, for example. Thereby, it is unnecessary to separately dispose another reflective member on the support member. Furthermore, support member 32r formed of a metallic material having high thermal conductivity can have high heat dissipating performance of support member 32r.

Alternatively, as in wavelength conversion element 30B according to Modification 2 illustrated in FIG. 9B, of lateral surface 35c of first wavelength converter 35, part of lateral surface 35c close to first surface 35a may be uncovered with second wavelength converter 36.

In wavelength conversion element 30B having such a configuration, second wavelength converter 36 can have a thickness smaller than that of first wavelength converter 35. For this reason, the wavelength conversion efficiency of the second wavelength converter can be readily controlled to be lower than that of the first wavelength converter. Accordingly, the contrast of luminance distribution between the central portion of the light emission region of the wavelength conversion element and its surrounding portion can be increased.

In wavelength conversion element 30C according to Modification 3 illustrated in FIG. 10A, first wavelength converter 35 is fixed onto support member 32, and second wavelength converter 36 is disposed so as to surround first wavelength converter 35. At this time, reflective member 31 may be disposed between first wavelength converter 35 and support member 32. In reflective member 31, for example, $TiO_2$ particles having an average particle diameter of 0.1 μm to 10 μm are dispersed in a silicone resin.

At this time, reflective member 31 may be disposed only between first wavelength converter 35 and support member 32. In such a configuration, among the components of the light which enters first wavelength converter 35, the components which reach second surface 35b of first wavelength converter 35 are reflected on reflective member 31. For this reason, first wavelength converter 35 can efficiently convert incident light 82a into fluorescence 94a, and can emit emission light 91 having high luminance. In contrast, reflective member 31 is not disposed between second wavelength converter 36 and support member 32.

Thereby, the conversion efficiency of incident light 82b into fluorescence 94b is reduced in second wavelength converter 36, increasing the contrast.

As in wavelength conversion element 30D according to Modification 4 illustrated in FIG. 10B, first wavelength converter 35 may have an oblique lateral surface 35c. In other words, lateral surface 35c does not need to be orthogonal to the surface of support member 32r on which first wavelength converter 35 is disposed.

The wavelength conversion elements according to the present embodiment and modifications thereof can have any configuration of the fluorescent material and the transparent bonding material other than the configuration described above.

Examples of usable fluorescent materials include oxynitride fluorescent substances (such as $\beta$-SiAlON:$Eu^{2+}$, Ca-$\alpha$-SiAlON:$Eu^{2+}$, and $(Ca,Sr,Ba)SiO_2N_2$:$Eu^{2+}$), nitride fluorescent substances (such as $CaAlSiN_3$:$Eu^{2+}$, and $(La,Y,Gd)_3Si_6N_{11}$:$Ce^{3-}$), silicate fluorescent substances (such as $Sr_3MgSi_2O_8$:$Eu^{2+}$, and $(Ba,Sr,Mg)_2SiO_4$:$Eu^{2+}$), phosphate fluorescent substances ($Sr_5(PO_4)_3Cl$:$Eu^{2+}$), and quantum dot fluorescent substances (such as nanoparticles of InP or CdSe).

At this time, by selecting a fluorescent substance which emits desired fluorescence, light source device 100 can emit emission light having desired chromaticity coordinates. For example, green, yellow, or red emission light can be emitted. Furthermore, light source device 100 can also emit white light by forming first wavelength converter 35 with a combination of several fluorescent substances or by combining the chromaticity coordinates of the fluorescence emitted from first wavelength converter 35 with the chromaticity coordinates of the excitation light reflected on first wavelength converter 35. For example, in the case where semiconductor light-emitting element 11 which emits near-ultraviolet light having a peak wavelength at about 405 nm as excitation light is used, white light is obtained by use of a combination of a blue fluorescent substance $Sr_5(PO_4)_3Cl$:$Eu^{2+}$ and a yellow fluorescent substance YAG:$Ce^{3+}$ as fluorescent materials. In the case where a semiconductor light-emitting element which emits blue excitation light having a peak wavelength at about 445 nm is used, white light is obtained by use of a yellow fluorescent substance YAG:$Ce^{3+}$ or $(La,Y)_3Si_6N_{11}$:$Ce^{3+}$ as a fluorescent material. In the case where a material having siloxane bonds is used as a transparent bonding material which retains the fluorescent material, a highly heat-resistant silicone resin or a bonding material containing silsesquioxane can be used, for example. In the case where an inorganic material is used, a material such as $SiO_2$, ZnO, $ZrO_2$, $Nb_2O_5$, $Al_2O_3$, $TiO_2$, SiN, or AlN can be used.

Embodiment 2

The light source device according to Embodiment 2 will now be described. The light source device according to the present embodiment has the same structure as those of the light source devices according to Embodiment 1 and modifications thereof illustrated in FIGS. 1 to 5 and FIGS. 7 to 10B, and therefore the description thereof will be omitted.

In the light source device according to the present embodiment, second wavelength converter 36 contains a fluorescent material different from that for first wavelength converter 35. Thereby, free design is enabled such that the conversion efficiency into fluorescence in the second wavelength converter and the spectrum of emission light are different from those in the first wavelength converter.

As a feature of the light source device according to the present embodiment, the value on the x-coordinate of the chromaticity coordinates of the fluorescence generated in second wavelength converter 36 is larger than that of the x-coordinate of the chromaticity coordinates of the fluorescence generated in first wavelength converter 35. The light source device according to the present embodiment will now be described with reference to the drawing.

Figure 11:
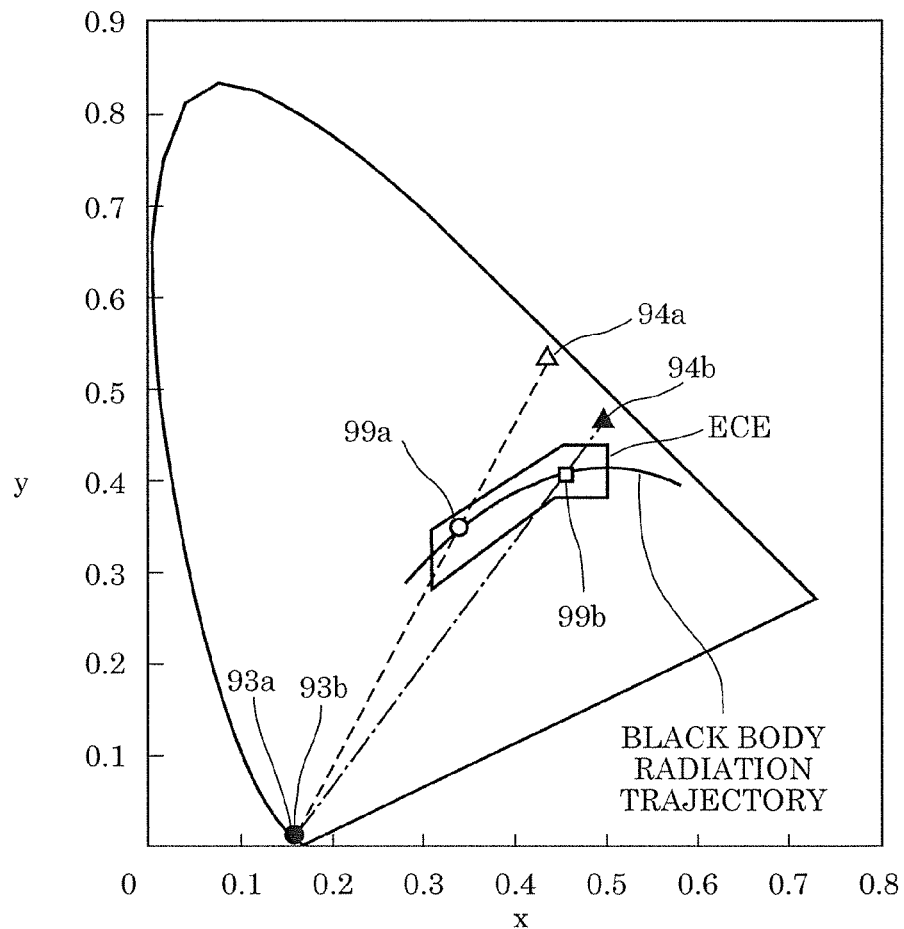
FIG. 11 is a chromaticity diagram illustrating the chromaticity coordinates of light emitted from a light source device according to Embodiment 2.

FIG. 11 is a chromaticity diagram illustrating the chromaticity coordinates of light emitted from the light source device according to the present embodiment.

In the chromaticity diagram illustrated in FIG. 11, scattered light 93a and fluorescence 94a emitted from first wavelength converter 35 of the light source device according to the present embodiment, scattered light 93b and fluorescence 94b emitted from second wavelength converter 36, and the chromaticity coordinates of projected images 99a and 99b, which are mixed light, are plotted. In the present embodiment, the value on the x-coordinate of the chromaticity coordinates of fluorescence 94b generated in second wavelength converter 36 is larger than that on the x-coordinate of the chromaticity coordinates of fluorescence 94a generated in first wavelength converter 35. The chromaticity coordinates of projected image 99a emitted from first wavelength converter 35 and the chromaticity coordinates of projected image 99b emitted from second wavelength converter 36 both are substantially on black body radiation trajectory.

In the present embodiment, due to absorption, the quantity of scattered light 93b in second wavelength converter 36 is much smaller than the quantity of scattered light 93a in first wavelength converter 35. Furthermore, the quantity of wavelength-converted light (fluorescence 94b) in second wavelength converter 36 is smaller than the quantity of wavelength-converted light (fluorescence 94a) in first wavelength converter 35. In other words, the proportion of scattered light 93b to fluorescence 94b in the emission light emitted from second wavelength converter 36 is lower than that of scattered light 93a to fluorescence 94a in the emission light emitted from first wavelength converter 35. At this time, projected image 99b has a color temperature lower than that of projected image 99a. For this reason, projected image 99b has a luminosity factor lower than that of projected image 99a. Accordingly, the contrast between projected image 99a having high light intensity and projected image 99b having low light intensity can be further increased.

Furthermore, the chromaticity coordinates of projected image 99a and the chromaticity coordinates of projected image 99b both are plotted on the black body radiation trajectory. For this reason, the light forming projected image 99a and projected image 99b is not unnatural white light. For example, in the case where the proportion of blue scattered light is high in projected image 99b, a bluish white projected image 99b is projected around a white projected image 99a, and users feel the projection light unnatural. In the light source device according to the present embodiment, however, white light having low light intensity and luminosity factor is projected around the white projected image 99a, preventing the users from feeling the projection light unnatural.

As illustrated in FIG. 11, because the chromaticity coordinates of projected image 99a and the chromaticity coordinates of projected image 99b both are included in the range of white light specified in the ECE standards, the light source device according to the present embodiment can be used as a headlamp for vehicles, for example.

Figure 12:
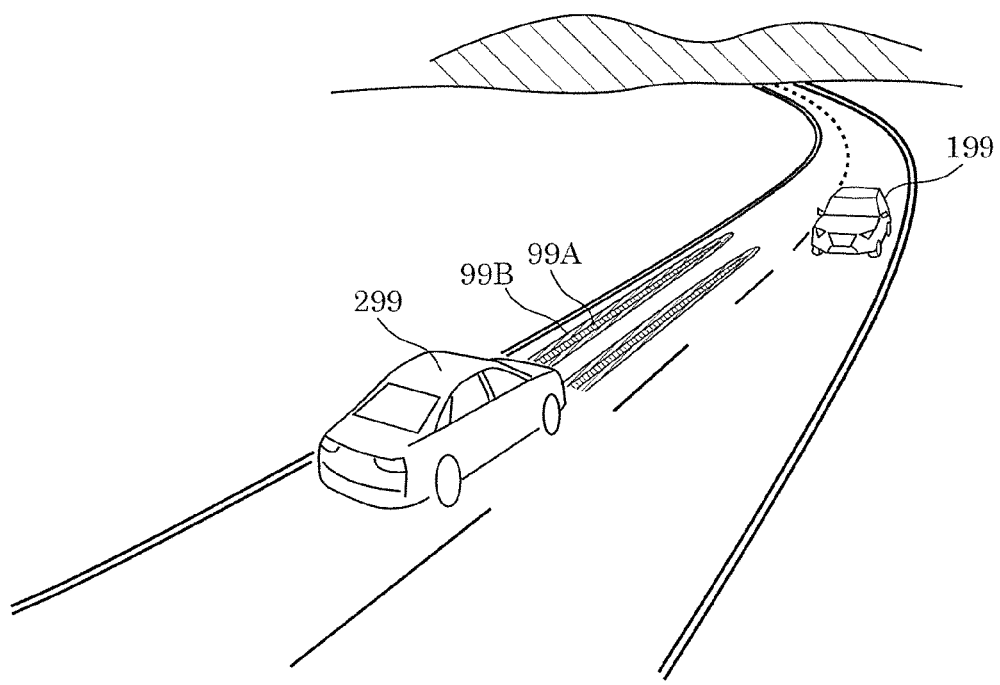
FIG. 12 is a view illustrating a function of a vehicle including the light source device according to Embodiment 2.

FIG. 12 is a diagram illustrating a function of a vehicle including the light source device according to the present embodiment.

As illustrated in FIG. 12, the light source device according to the present embodiment included in vehicle 299 can project light having a high contrast ahead a road.

Furthermore, the light source device according to the present embodiment can prevent a person on oncoming car 199 from feeling the irradiation of unnatural light.

Modification of Embodiment 2

A light source device according to a modification of the present embodiment will now be described. Similarly to Embodiment 2, first wavelength converter 35 and second wavelength converter 36 in the light source device according to the present modification are made of different fluorescent materials.

In the present modification, propagation light 82 enters the wavelength conversion element from the support member thereof. For this reason, the support member of the wavelength conversion element is formed of a material transparent to propagation light 82.

Figure 13:
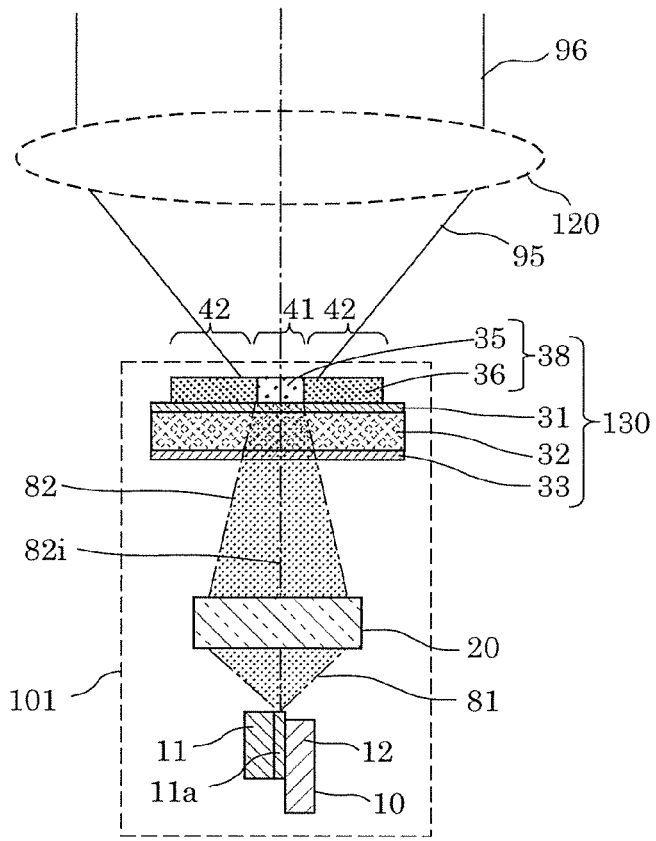
FIG. 13 is a schematic sectional view illustrating a configuration and function of a light source device according to a modification of Embodiment 2.

FIG. 13 is a schematic sectional view illustrating a configuration and function of light source device 101 according to the present modification.

Figure 14:
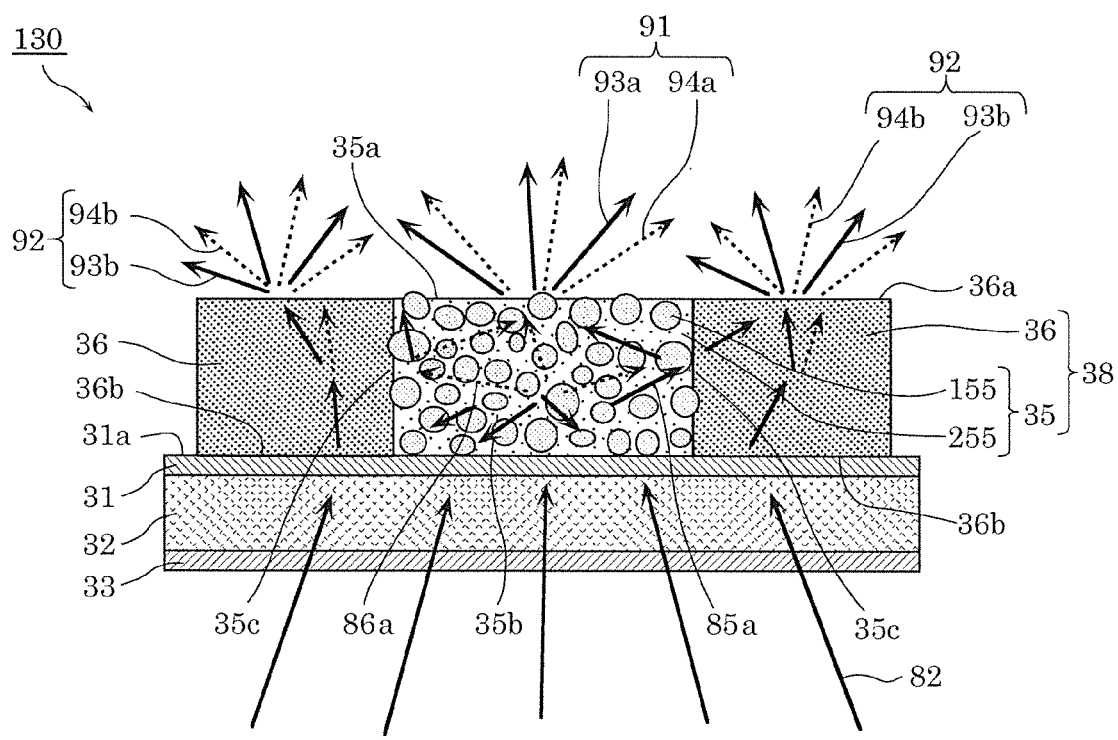
FIG. 14 is a diagram illustrating a specific configuration of a wavelength conversion element included in the light source device according to the modification of Embodiment 2.

FIG. 14 is a diagram illustrating a specific configuration of wavelength conversion element 130 included in light source device 101 according to the present modification.

As illustrated in FIG. 13, light source device 101 according to the present modification includes semiconductor light-emitting device 10, light converging optical system 20, and wavelength conversion element 130.

Semiconductor light-emitting device 10 is identical to semiconductor light-emitting device 10 according to Embodiment 1. Semiconductor light-emitting device 10 includes semiconductor light-emitting element 11 (such as a nitride semiconductor laser) mounted on support member 12. Support member 12 is fixed to a package not illustrated. Excitation light 81 emitted from optical waveguide 11a disposed in semiconductor light-emitting element 11 is emitted toward light converging optical system 20. Light converging optical system 20 converges excitation light 81 emitted from semiconductor light-emitting element 11 and having an emission angle in a horizontal direction and a vertical direction to generate propagation light 82 as excitation light which propagates through the space toward wavelength conversion element 130 while being collimated or converged. Propagation light 82 propagates along central axis 82i, and is emitted to wavelength conversion element 130.

Light converging optical system 20 is a lens, for example.

Wavelength conversion element 130 is spaced from semiconductor light-emitting device 10. Wavelength conversion element 130 generates fluorescence by converting the wavelength of the excitation light emitted from semiconductor light-emitting device 10, and generates transmission light by transmitting the excitation light.

Wavelength conversion element 130 includes support member 32, and wavelength converter 38 disposed on support member 32. Wavelength converter 38 includes first wavelength converter 35, and second wavelength converter 36 disposed around first wavelength converter 35 to surround first wavelength converter 35 in a top view of the surface of support member 32 on which wavelength converter 38 is disposed. Here, the ratio of the intensity of fluorescence to that of the transmission light in second wavelength converter 36 is lower than that in first wavelength converter 35.

In wavelength conversion element 130 according to the present modification, for example, an optical film which reflects fluorescence, i.e., reflective member 31 is disposed on one main surface of support member 32, which is a transparent substrate to propagation light 82. First wavelength converter 35 and second wavelength converter 36 are fixed to surface 31a of reflective member 31.

A specific configuration of wavelength conversion element 130 will now be described with reference to FIG. 14.

Support member 32 to be used is a sapphire substrate having a thickness of 0.33 mm and having two optically polished surfaces, for example. Reflective member 31, such as a dichroic film, is disposed on one main surface (top surface in FIG. 14) of support member 32. Reflective member 31 is composed of a dielectric multi-layer film. In a direction vertical to the surface thereof, reflective member 31 transmits light having a wavelength shorter than 490 nm, and reflects light having a wavelength of 490 nm or more. Reflective member 31 is designed so as to reflect light having a wavelength shorter than 490 nm as the angle of incidence to the surface increases. Antireflection film 33 composed of one or more layers of dielectric film is disposed on the other main surface (bottom surface in FIG. 14) of support member 32.

First wavelength converter 35 and second wavelength converter 36 are fixed to surface 31a of support member 32 close to reflective member 31.

First wavelength converter 35 is fluorescent particles 155 composed of a Ce-activated YAG fluorescent substance, for example. Fluorescent particles 155 have an average particle diameter D50 of 1 μm to 20 μm. Fluorescent particles 155 are fixed onto reflective member 31 with transparent bonding material 255, such as silsesquioxane. First wavelength converter 35 on the surface of reflective member 31 has a diameter of 600 μm and a thickness of 70 μm, for example.

First wavelength converter 35 is placed on reflective member 31 through an opening mask not illustrated. The opening mask has a thickness of 70 μm and has an opening having a diameter of 600 μm in the center thereof. First wavelength converter 35 can be readily formed as follows: A paste material of fluorescent particles 155 mixed with liquid transparent bonding material 255 is transferred with such an opening mask onto reflective member 31, and is cured.

Second wavelength converter 36 is formed by applying a mixed material of different fluorescent particles and a different transparent bonding material from those of first wavelength converter 35 around first wavelength converter 35, and curing the coating.

From antireflection film 33, propagation light 82 enters wavelength conversion element 130, which has such a configuration. Among the components of propagation light 82, the components of incident light entering first wavelength converter 35 are scattered into incident light 85a at interfaces between fluorescent particles 155 and transparent bonding material 255. Incident light 85a is further subjected to multiple reflection on lateral surface 35c, which is an interface between first wavelength converter 35 and second wavelength converter 36, and on second surface 35b, which is an interface of first wavelength converter 35 and reflective member 31. Among the components of incident light 85a subjected to the multiple reflection, part thereof is subjected to the wavelength conversion into fluorescence 86a by fluorescent particles 155. Fluorescence 86a is subjected to the multiple reflection inside first wavelength converter 35 as incident light 85a.

As a result, incident light 85a and fluorescence 86a are uniformly distributed inside first wavelength converter 35, and are emitted from first surface 35a of first wavelength converter 35 as scattered light 93a and fluorescence 94a (which are transmission light).

In contrast, part of the components of propagation light 82 entering second wavelength converter 36 is subjected to the wavelength conversion inside second wavelength converter 36, and is emitted from first surface 36a of second wavelength converter 36 as fluorescence 94b. Another part of the components of propagation light 82 entering second wavelength converter 36 is subjected to the multiple reflection inside second wavelength converter 36, and is emitted as scattered light 93b, which is transmission light.

As described above, wavelength conversion element 130 emits emission light 91, which is mixed light of scattered light 93a (transmission light) and fluorescence 94a, and emission light 92, which is mixed light of scattered light 93b (transmission light) and fluorescence 94b. Emission light 95 composed of emission light 91 and emission light 92 is emitted from light source device 101, is converted into substantially parallel projection light 96 by light projecting member 120 (such as a projection lens) disposed outside light source device 101, and is emitted.

At this time, scattered light 93a and fluorescence 94a emitted from first wavelength converter 35, scattered light 93b and fluorescence 94b emitted from second wavelength converter 36, and the values on the chromaticity coordinates of projected images 99a and 99b are designed, for example, such that the coordinates plotted in the chromaticity diagram of FIG. 11 are obtained. In the present modification, the chromaticity coordinates of projected image 99a emitted from first wavelength converter 35 and the chromaticity coordinates of projected image 99b emitted from second wavelength converter 36 both are substantially on the black body radiation trajectory.

Furthermore, projected image 99b has a color temperature lower than that of projected image 99a. For this reason, projected image 99b has a luminosity factor lower than that of projected image 99a. Accordingly, the contrast between projected image 99a having a high light intensity and projected image 99b having a low light intensity can be increased.

Furthermore, because the chromaticity coordinates of projected image 99a and the chromaticity coordinates of projected image 99b both are on the black body radiation trajectory, unnatural white light is not generated.

Moreover, first wavelength converter 35 in light source device 102 according to the present modification may include first emitting region 41 which propagation light 82 (excitation light) enters and the transmission light is emitted from, and the cross-sectional shape and the cross-sectional area of propagation light 82 on the incident surface of first emitting region 41 which propagation light 82 enters may be substantially equal to the shape and the area of the incident surface in first emitting region 41. Such a configuration can improve the uniformity of the luminance distribution in the central portion of the light emission region, and prevent the emission of the excitation light from the surrounding region of light emission region without being mixed with fluorescence.

The light source device according to the present embodiment can be also used as a headlamp for vehicles, for example, as in the embodiments described above.

Embodiment 3

A light source device according to the present embodiment will now be described. Unlike light source device 100 according to Embodiment 1, not only lateral surface 35c of first wavelength converter 35 but also second surface 35b close to support member 32 are covered with second wavelength converter 36 in the wavelength conversion element included in the light source device according to the present embodiment. The light source device according to the present embodiment, and mainly differences from wavelength conversion element 30 in light source device according to Embodiment 1 will now be described with reference to the drawings.

Figure 15:
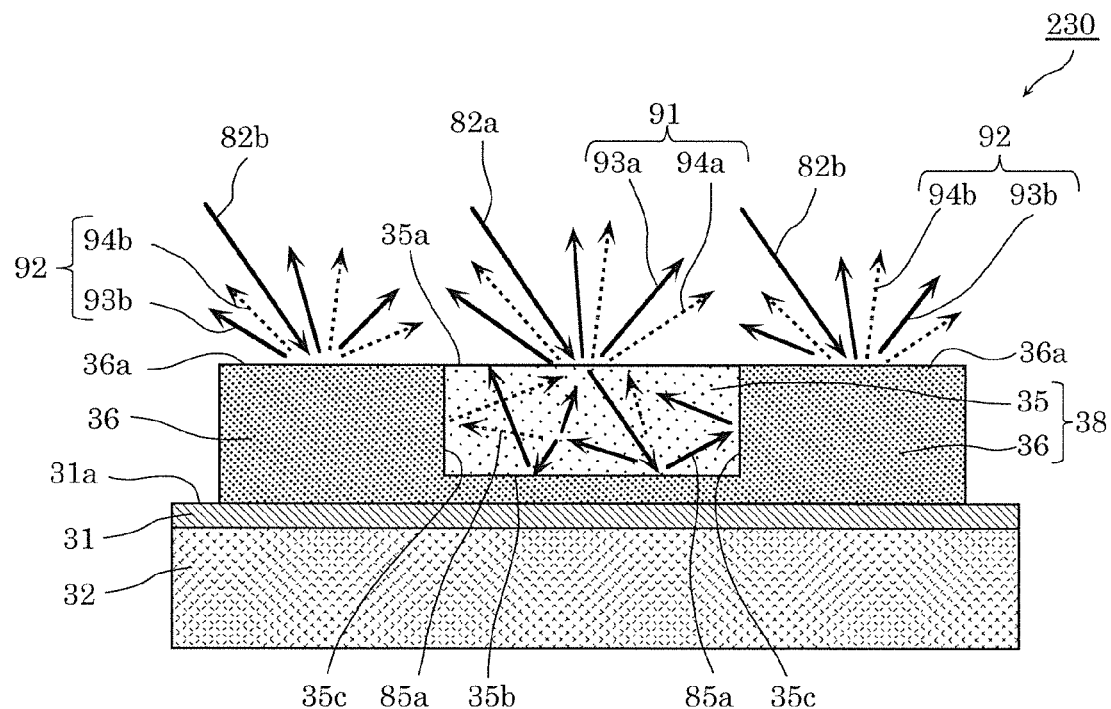
FIG. 15 is a schematic sectional view illustrating a schematic configuration of a wavelength conversion element according to Embodiment 3.

FIG. 15 is a schematic sectional view illustrating a schematic configuration of wavelength conversion element 230 according to the present embodiment.

Wavelength conversion element 230 includes support member 32, reflective member 31, and wavelength converter 38. Support member 32 is a silicon substrate, for example. Reflective member 31 is, for example, a reflective film formed of a metal film made of titanium, platinum, aluminum, or silver, and is disposed on a surface of support member 32 on which wavelength converter 38 is disposed. Support member 32 to be used may be an aluminum plate or an aluminum alloy plate. In this case, reflective member 31 does not need to be disposed separately because support member 32 has a function as a reflective member.

Wavelength converter 38 includes first wavelength converter 35 and second wavelength converter 36. First wavelength converter 35 is a ceramic member containing a YAG fluorescent substance, for example, and is disposed on reflective member 31. As illustrated in FIG. 15, among the surfaces of first wavelength converter 35, lateral surface 35c and second surface 35b close to support member 32 besides first surface 35a (upper surface in FIG. 15) which incident light 82a enters are covered with second wavelength converter 36. A mixed material of fluorescent particles, which are YAG fluorescent substance particles, and transparent bonding material 256, which is silsesquioxane, can be used for second wavelength converter 36, for example.

Such a configuration can provide first wavelength converter 35 and second wavelength converter 36 having different average refractive indices. For this reason, part of the components of incident light 82a entering first wavelength converter 35 can be subjected to multiple reflection on lateral surface 35c, which is an interface between first wavelength converter 35 and second wavelength converter 36 disposed in its outer peripheral region, and on second surface 35b, which is an interface between first wavelength converter 35 and second wavelength converter 36 disposed between first wavelength converter 35 and support member 32. Thereby, emission light 91 having uniform light distribution can be efficiently emitted from first wavelength converter 35.

Figure 16:
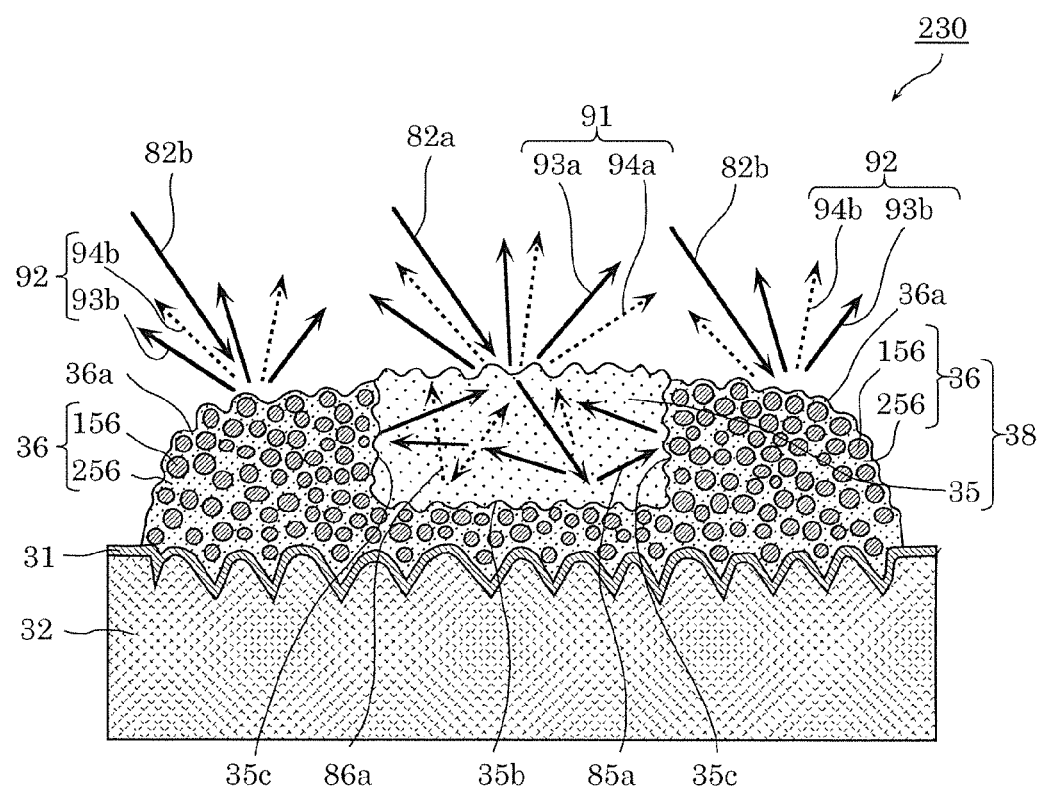
FIG. 16 is a sectional view illustrating a more specific configuration of a wavelength conversion element included in the light source device according to Embodiment 3.

FIG. 16 is a sectional view illustrating a more specific configuration of wavelength conversion element 230 included in the light source device according to the present embodiment.

In FIG. 16, support member 32 is a silicon substrate. The surface of support member 32 on which first wavelength converter 35 is disposed has projections and depressions formed by wet or dry etching. Then, reflective member 31, such as a reflective film made of a metal film of titanium, platinum, aluminum, or silver, is disposed on the surface where the projections and depressions are disposed. Then, first wavelength converter 35, such as a ceramic member containing a YAG fluorescent substance, for example, is disposed on reflective member 31. First wavelength converter 35 is a ceramic YAG fluorescent substance prepared by calcining a mixture of Ce-activated $Y_3Al_5O_{12}$ particles and $Al_2O_3$ particles, and has a shape of a 400 μm square to a 500 μm square having a thickness of 50 μm to 100 μm, for example. A physical process such as polishing, or a chemical process, such as wet or dry etching, is performed on the surface of first wavelength converter 35 to form projections and depressions.

Furthermore, as illustrated in FIG. 16, excluding first surface 35a which incident light 82a enters, all of lateral surface 35c and second surface 35b of first wavelength converter 35 are covered with second wavelength converter 36. At this time, fluorescent particles 156, which are YAG fluorescent substance particles having a particle diameter distributed from 1 μm to 4 μm, are bonded with transparent bonding material 256, such as silsesquioxane, and are used as second wavelength converter 36. Here, the term "particle diameter distributed from 1 μm to 4 μm" indicates that the average particle diameter D50 is 2 μm, D10 is 1 μm, and D90 is 4 μm. At this time, Ce-activated $Y_3Al_5O_{12}$ particles and $Al_2O_3$ particles which form first wavelength converter 35 have refractive indices of about 1.84 and about 1.77, respectively.

In contrast, Ce-activated-$Y_3Al_5O_{12}$ particles and silsesquioxane which form second wavelength converter 36 have refractive indices of about 1.84 and about 1.5, respectively. Accordingly, light is reflected at a position shallower from the surface of second wavelength converter 36 than in the case of first wavelength converter 35 because the difference in refractive index between the fluorescent particles and the transparent bonding material in second wavelength converter 36 is larger than that in first wavelength converter 35.

For this reason, part of the components of incident light 82a entering first wavelength converter 35 can be subjected to the multiple reflection on lateral surface 35c, which is an interface between first wavelength converter 35 and second wavelength converter 36 disposed in its outer peripheral region, and on second surface 35b, which is an interface between first wavelength converter 35 and second wavelength converter 36 disposed between first wavelength converter 35 and support member 32. Accordingly, emission light 91 having uniform light distribution can be efficiently emitted from first wavelength converter 35.

Furthermore, among the components of propagation light 82, part of the components of incident light 82b entering second emitting region 42 is subjected to the wavelength conversion by fluorescent particles 156 of second wavelength converter 36, and is emitted as fluorescence 94b from wavelength conversion element 30.

At this time, the conversion efficiency of second emitting region 42 is lower than that of first emitting region 41, increasing the contrast of the emission light at the boundary between first emitting region 41 and second emitting region 42.

In contrast, part of the components of incident light 82*b* entering second emitting region 42 is converted into fluorescence 94*b*, is mixed with scattered light 93*b* emitted from second emitting region 42, and is emitted from the wavelength conversion element. For this reason, the chromaticity coordinates of emission light 92 emitted from second emitting region 42 are closer to the chromaticity coordinates of emission light 91 emitted from first emitting region 41 than in the case where only scattered incident light 82*b* is emitted from second emitting region 42.

For this reason, the light emitted from the light source device can have a smaller color distribution.

[Production Method]

One example of a method of producing wavelength conversion element 230 according to the present embodiment will now be described with reference to the drawing.

Figure 17:
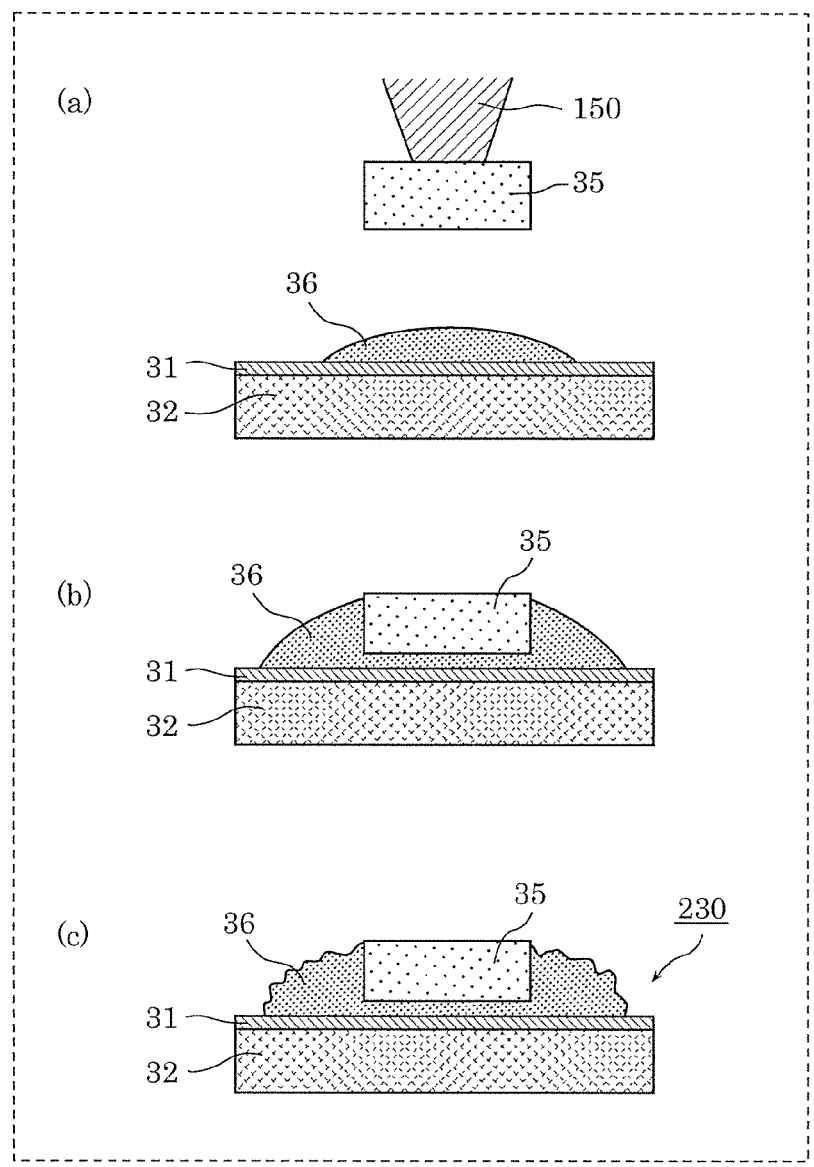
FIG. 17 is a schematic sectional view illustrating the steps of a method of producing the wavelength conversion element according to Embodiment 3.

FIG. 17 is a schematic sectional view illustrating the steps of a method of producing wavelength conversion element 230 according to the present embodiment.

As illustrated in sectional view (a) of FIG. 17, first, for example, a paste material for second wavelength converter 36 prepared with a mixture of fluorescent particles having an average particle diameter D50 distributed between 1 μm and 4 μm and a transparent bonding material is applied, for example, onto reflective member 31 which is made of a metal film and is disposed on support member 32 made of a silicon substrate. At this time, the transparent bonding material used is a paste of transparent bonding material prepared by dissolving silsesquioxane in an organic solvent. First wavelength converter 35 is held with vacuum collet 150.

In the next step, as illustrated in sectional view (b) of FIG. 17, first wavelength converter 35 is disposed on the paste material for second wavelength converter 36. At this time, the paste material for second wavelength converter 36 rises on the lateral surface of first wavelength converter 35 due to an intermolecular force between first wavelength converter 35 and the transparent bonding material. For this reason, at least part of the bottom surface of first wavelength converter 35 and at least part of the lateral surface thereof can be readily covered with the paste material for second wavelength converter 36.

Second wavelength converter 36 is then cured by heating.

At this time, the organic solvent in the paste material for second wavelength converter 36 is evaporated by heating at about 150° C. for about two hours to cure the paste material, for example.

As described above, the wavelength conversion element included in the light source device according to the present embodiment can be readily produced.

Moreover, at this time, because the paste material for second wavelength converter 36 shrinks, projections and depressions can be readily formed on the surface of second wavelength converter 36 along the fluorescent particles. Thereby, propagation light 82 can be scattered on the surface of second wavelength converter 36.

Wavelength conversion element 230 included in the light source device according to the present embodiment can be readily prepared by this production method.

Modifications of Embodiment 3

Light source devices according to Modifications 1 to 3 of the present embodiment will now be described with reference to the drawings.

Figure 18A:
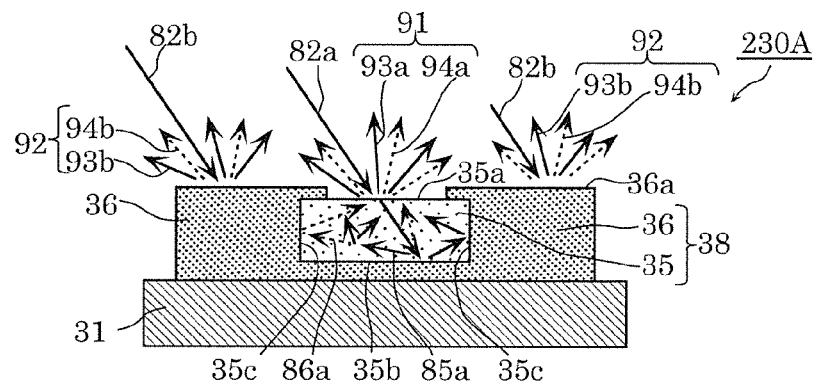
FIG. 18A is a schematic sectional view illustrating a configuration of a wavelength conversion element according to Modification 1 of Embodiment 3.
Figure 18B:
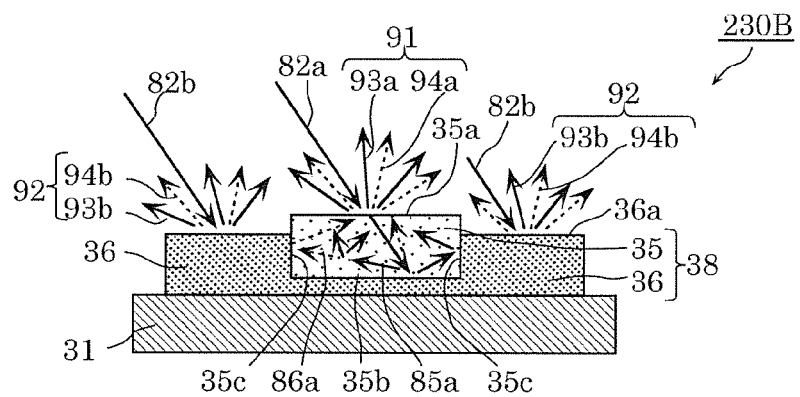
FIG. 18B is a schematic sectional view illustrating a configuration of a wavelength conversion element according to Modification 2 of Embodiment 3.
Figure 18C:
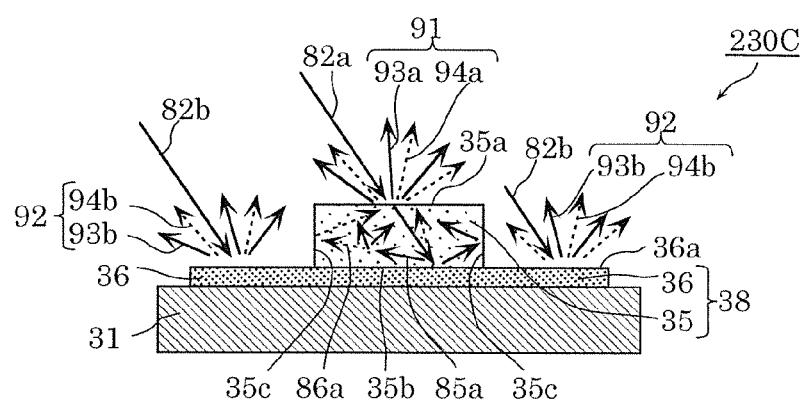
FIG. 18C is a schematic sectional view illustrating a configuration of a wavelength conversion element according to Modification 3 of Embodiment 3.

FIG. 18A is a schematic sectional view illustrating a configuration of wavelength conversion element 230A according to Modification 1 of the present embodiment. FIG. 18B is a schematic sectional view illustrating a configuration of wavelength conversion element 230B according to Modification 2 of the present embodiment. FIG. 18C is a schematic sectional view illustrating a configuration of wavelength conversion element 230C according to Modification 3 of the present embodiment.

As in wavelength conversion element 230A according to Modification 1 illustrated in FIG. 18A, second wavelength converter 36 may cover a peripheral portion of first surface 35*a* (top surface in FIG. 18A) of first wavelength converter 35. In other words, first surface 35*a* of first wavelength converter 35 excluding the central portion thereof may be covered with second wavelength converter 36. Wavelength conversion element 230A having such a configuration can be readily formed by applying an increased amount of paste material for second wavelength converter 36 illustrated in sectional view (a) in the production method of FIG. 17. In wavelength conversion element 230A having such a configuration, incident light 85*a* subjected to multiple reflection in first wavelength converter 35 is reflected not only on lateral surface 35*c* and second surface 35*b* but also on part of first surface 35*a*. For this reason, first wavelength converter 35 can have increased wavelength conversion efficiency. At this time, second wavelength converter 36 on first wavelength converter 35 has a thickness smaller than that of first wavelength converter 35. The thickness of second wavelength converter 36 can be equal to or less than a half of the thickness of first wavelength converter 35. In such a configuration, emission light 91 emitted from first wavelength converter 35 can also be emitted through second wavelength converter 36 on first wavelength converter 35, therefore improving the uniformity of the luminance distribution in the central portion of the light emission region of wavelength conversion element 230A.

As in wavelength conversion element 230B according to Modification 2 illustrated in FIG. 18B, of lateral surface 35*c* of first wavelength converter 35, part thereof close to first surface 35*a* may be uncovered with second wavelength converter 36. Wavelength conversion element 230A having such a configuration can be readily formed by applying a reduced amount of paste material for second wavelength converter 36 illustrated in sectional view (a) in the production method illustrated in FIG. 17.

In wavelength conversion element 230B having such a configuration, second wavelength converter 36 can have a thickness smaller than that of first wavelength converter 35. For this reason, the wavelength conversion efficiency of the second wavelength converter can be readily reduced compared to that of the first wavelength converter. Accordingly, the contrast between the first emitting region and the second emitting region can be increased in the light emission distribution in the light emission region of the wavelength conversion element.

In wavelength conversion element 230C illustrated in FIG. 18C, second wavelength converter 36 covers only second surface 35*b* of first wavelength converter 35. Wavelength conversion element 230A having such a configuration can be readily formed by applying a reduced amount of paste material for second wavelength converter 36 illustrated in sectional view (a) in the production method of FIG. 17.

In wavelength conversion element 30 having such a configuration, second wavelength converter 36 can have a smaller thickness than that of first wavelength converter 35. For this reason, the wavelength conversion efficiency of the second wavelength converter can be readily reduced compared to that of the first wavelength converter.

Embodiment 4

A light source device according to Embodiment 4 will now be described. One main difference is that unlike the light source devices according to the embodiments described above, the light source device according to the present embodiment includes photodetectors. The light source device according to the present embodiment will now be described with reference to the drawings.

Figure 19:
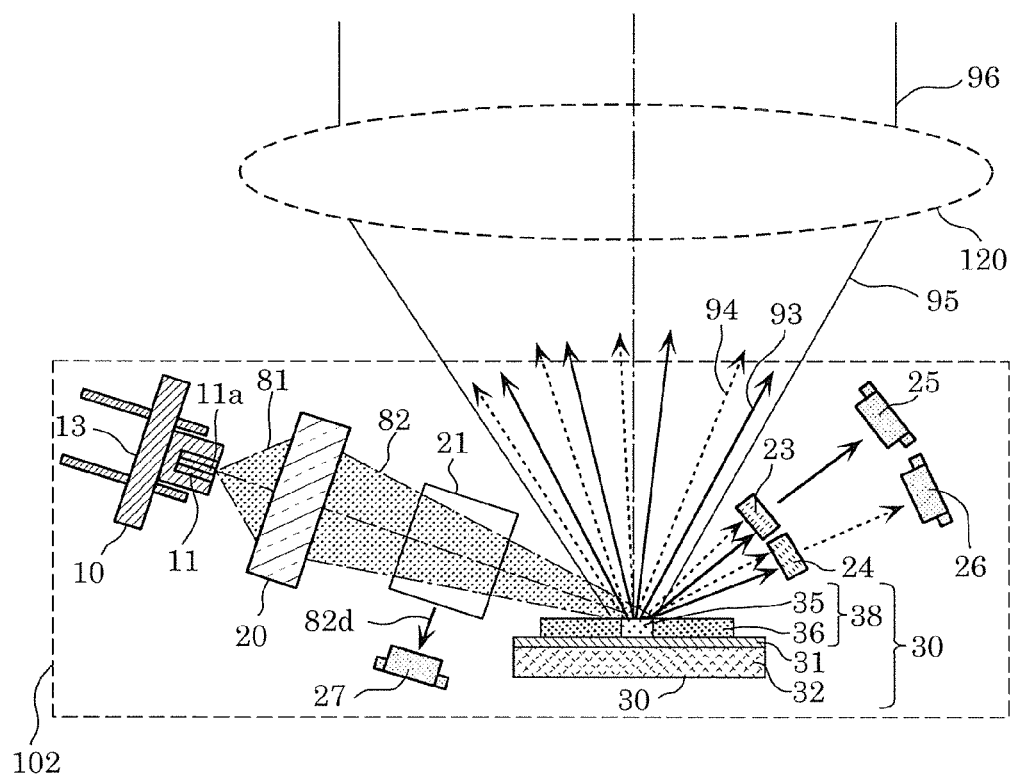
FIG. 19 is a schematic sectional view illustrating a schematic configuration of a light source device according to Embodiment 4.

FIG. 19 is a schematic sectional view illustrating a schematic configuration of light source device 102 according to the present embodiment.

Light source device 102 illustrated in FIG. 19 includes semiconductor light-emitting device 10, wavelength conversion element 30, first filter 23, first photodetector 25, second photodetector 26, and third photodetector 27. In the present embodiment, light source device 102 further includes light converging optical system 20, separating optical element 21, and second filter 24.

Semiconductor light-emitting device 10 emits laser light. In the present embodiment, semiconductor light-emitting device 10 emits coherent excitation light 81, and includes semiconductor light-emitting element 11. Semiconductor light-emitting device 10 is fixed such that the emission light emitted from semiconductor light-emitting element 11 is emitted toward wavelength conversion element 30.

Semiconductor light-emitting element 11 is a semiconductor laser element made of a nitride semiconductor, for example, and emits laser light having a peak wavelength between 380 nm and 490 nm as excitation light 81. In the present embodiment, semiconductor light-emitting element 11 is mounted on package 13, which is a TO-CAN package, for example.

Optical waveguide 11a is disposed in semiconductor light-emitting element 11.

Electricity from the outside of light source device 102 is input into semiconductor light-emitting element 11. The laser light generated in optical waveguide 11a of semiconductor light-emitting element 11 and having a peak wavelength of 445 nm, for example, is emitted toward light converging optical system 20 as excitation light 81.

Light converging optical system 20 converges excitation light 81, which is the laser light emitted from semiconductor light-emitting element 11, and emits the converged light to wavelength conversion element 30. Light converging optical system 20 can have any configuration that can converge excitation light 81. For example, an aspherical convex lens can be used as light converging optical system 20. Light converging optical system 20 converges excitation light 81 emitted from semiconductor light-emitting element 11 and having an emission angle in a horizontal direction and a vertical direction, and generates propagation light 82, which is excitation light that propagates through the space toward wavelength conversion element 30 while being collimated or converged. Propagation light 82 is emitted to wavelength conversion element 30.

Wavelength conversion element 30 is irradiated with laser light emitted from semiconductor light-emitting device 10 as excitation light to emit fluorescence. In the present embodiment, wavelength conversion element 30 is spaced from semiconductor light-emitting device 10. Wavelength conversion element 30 generates fluorescence by converting the wavelength of the excitation light emitted from semiconductor light-emitting device 10, and generates scattered light by scattering the excitation light. In the present embodiment, wavelength conversion element 30 is irradiated with propagation light 82 as excitation light to perform the wavelength conversion on at least part of the components of propagation light 82, and emits the light components subjected to the wavelength conversion.

Wavelength conversion element 30 includes support member 32, and wavelength converter 38 disposed on support member 32. Wavelength converter 38 includes first wavelength converter 35, and a second wavelength converter disposed around first wavelength converter 35 to surround first wavelength converter in a top view of the surface of support member 32 on which wavelength converter 38 is disposed. In the present embodiment, wavelength conversion element 30 includes reflective member 31 disposed between support member 32 and first wavelength converter 35. Light source device 102 according to the present embodiment can include wavelength conversion element 30 having any usable configuration other than the configuration described above. Light source device 102 can include any wavelength conversion element. For example, wavelength converter 38 may include a single wavelength converting member.

Separating optical element 21 is disposed on the light path of propagation light 82 to separate part of components of propagation light 82 and guide the part to another light path 82d. For example, a beam splitter can be used as separating optical element 21.

First filter 23 is an element which part of components of the light emitted from wavelength conversion element 30 enters. In the present embodiment, first filter 23 selectively transmits excitation light 81, and prevents the transmission of fluorescence emitted from wavelength conversion element 30. First filter 23 transmits scattered light 93 emitted from wavelength conversion element 30, and substantially blocks fluorescence 94. As first filter 23, a dielectric multi-layer film filter can be used, for example.

Second filter 24 is an element which part of components of the light emitted from the wavelength conversion element enters. In the present embodiment, second filter 24 is an optical element which selectively transmits fluorescence 94 emitted from wavelength conversion element 30, and prevents the transmission of excitation light 81. Second filter 24 transmits fluorescence 94, and substantially blocks scattered light 93 emitted from wavelength conversion element 30. As second filter 24, a dielectric multi-layer film filter can be used, for example. Light source device 102 does not always need to include second filter 24.

First photodetector 25 is a detector which the light through first filter 23 enters. In the present embodiment, first photodetector 25 detects the intensity of scattered light 93 which enters first photodetector 25 through first filter 23. As first photodetector 25, a photodiode can be used, for example.

Second photodetector 26 is a detector which the light through second filter 24 enters. In the present embodiment, second photodetector 26 detects the intensity of fluorescence 94 which enters second photodetector 26 through second filter 24. As second photodetector 26, a photodiode can be used, for example.

Third photodetector 27 is a detector which excitation light 81 enters. In the present embodiment, third photodetector 27 detects the intensity of propagation light 82 separated by separating optical element 21. As third photodetector 27, a photodiode can be used, for example.

The outline of the operation of light source device 102 having such a configuration will be described.

The emission light emitted from semiconductor light-emitting device 10 is converged into propagation light 82 by light converging optical system 20, and propagation light 82 travels toward wavelength conversion element 30. Before propagation light 82 reaches wavelength conversion element 30, it passes through separating optical element 21. At this time, part of components of propagation light 82 is reflected, and enters third photodetector 27.

Most of the components of propagation light 82 which enters wavelength conversion element 30 enters first wavelength converter 35 of wavelength conversion element 30, and another part of the components of propagation light 82 enters second wavelength converter 36.

Part of the components of propagation light 82 which enters first wavelength converter 35 is then converted into fluorescence 94 in first wavelength converter 35. Another part thereof is scattered into scattered light 93 in first wavelength converter 35. Fluorescence 94 and scattered light 93 are then emitted from wavelength conversion element 30. Scattered light 93 and fluorescence 94 are emitted as emission light 95 from light source device 102.

In contrast, part of components of emission light 95, which is mixed light emitted from wavelength conversion element 30, is guided to first photodetector 25 and second photodetector 26. At this time, emission light 95 toward first photodetector 25 enters first filter 23. Emission light 95 toward second photodetector 26 enters second filter 24.

The function of light source device 102 according to the present embodiment will now be described with reference to the drawing.

Figure 20:
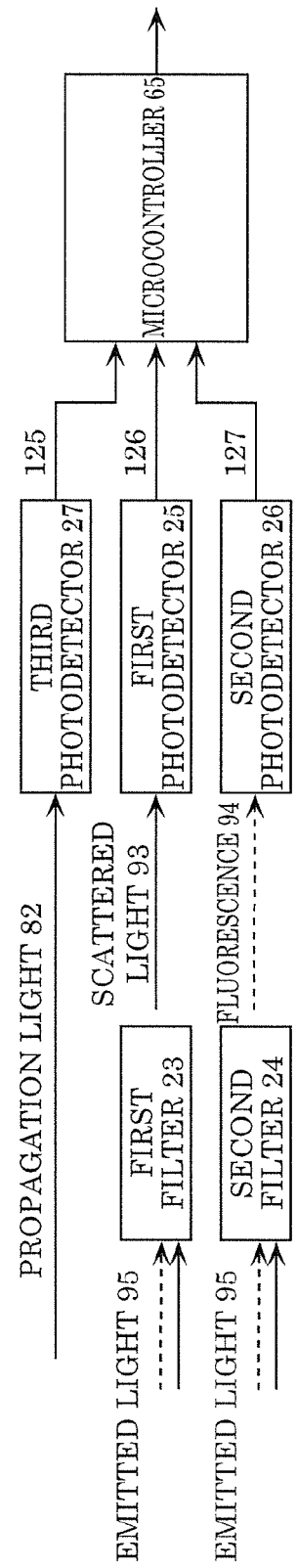
FIG. 20 is a block diagram illustrating propagation light from a semiconductor light-emitting device, a path of emission light from the wavelength conversion element, and the paths of signals from photodetectors in the light source device according to Embodiment 4.

FIG. 20 is a block diagram illustrating the paths of propagation light 82 from semiconductor light-emitting device 10 and emission light 95 from wavelength conversion element 30, and the paths of signals from the photodetectors in light source device 102 according to the present embodiment.

Part of components of propagation light 82 is separated by separating optical element 21, enters third photodetector 27, and is photoelectrically converted into a photocurrent by third photodetector 27. The photocurrent is then converted into a predetermined voltage signal, i.e., signal 125 by a current-voltage converter disposed inside or outside of third photodetector 27, and is input into microcontroller 65. In FIG. 19, microcontroller 65 is not illustrated.

Part of components of emission light 95 from wavelength conversion element 30 enters first filter 23, and another part thereof enters second filter 24.

First filter 23 is an optical filter which transmits light having a wavelength of less than 490 nm and reflects light having a wavelength of 490 nm or more, for example. In other words, first filter 23 is an optical filter which transmits most of components of excitation light 81 at a wavelength emitted from semiconductor light-emitting device 10, and reflects most of components of light having a spectrum of fluorescence 94 generated in wavelength conversion element 30.

Second filter 24 is an optical filter which reflects light having a wavelength of less than 490 nm and transmits light having a wavelength of 490 nm or more, for example. In other words, second filter 24 is an optical filter which reflects most of components of excitation light 81 at a wavelength emitted from semiconductor light-emitting device 10, and transmits most of components of light having a spectrum of fluorescence 94 generated in wavelength conversion element 30.

In emission light 95 which enters first filter 23, substantially only components of scattered light 93 are transmitted through first filter 23, and are received in first photodetector 25.

The components of scattered light 93 received in first photodetector 25 are photoelectrically converted into a photocurrent by first photodetector 25. The photocurrent is then converted into a predetermined voltage signal, i.e., signal 126 by a current-voltage converter disposed inside or outside first photodetector 25, and is input into microcontroller 65.

In emission light 95 which enters second filter 24, substantially only components of fluorescence 94 are transmitted through second filter 24, and are received in second photodetector 26.

The components of fluorescence 94 received in second photodetector 26 are photoelectrically converted into a photocurrent by second photodetector 26. The photocurrent is then converted into a predetermined voltage signal, i.e., signal 127 by a current-voltage converter disposed inside or outside second photodetector 26, and is input into microcontroller 65.

Light source device 102 according to the present embodiment diagnoses the state of light source device 102 using signals 125, 126, and 127 input into microcontroller 65 as described above. The flow of signal processing in microcontroller 65 of light source device 102 will now be described with reference to the drawing.

Figure 21:
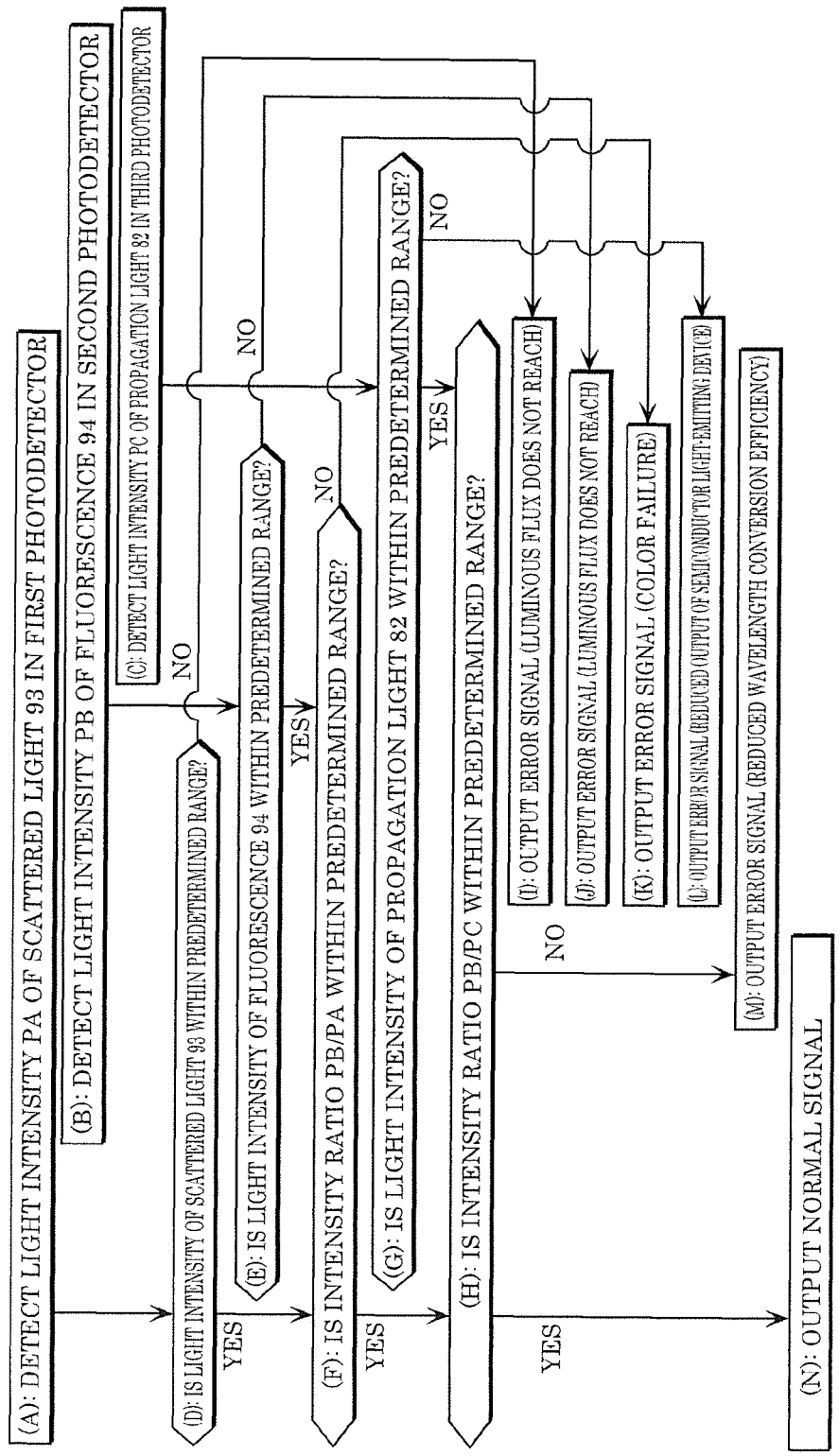
FIG. 21 is a flowchart illustrating a flow of signal processing in the light source device according to Embodiment 4.

FIG. 21 is a flowchart illustrating a flow of signal processing in light source device 102 according to the present embodiment.

As illustrated in FIG. 21, light source device 102 according to the present embodiment diagnoses the state of light source device 102 by the following signal processing.

First, microcontroller 65 detects light intensity PA of scattered light 93 in first photodetector 25 (step (A)).

Microcontroller 65 then detects light intensity PB of fluorescence 94 in second photodetector 26 (step (B)).

Microcontroller 65 then detects light intensity PC of propagation light 82 in third photodetector 27 (step (C)).

In the next step, microcontroller 65 determines whether light intensity PA of scattered light 93 is within a predetermined range or not (step (D)). Here, in the case where light intensity PA of scattered light 93 is within the predetermined range (YES in step (D)), the processing goes to step (F). In the case where light intensity PA of scattered light 93 is not within the predetermined range (NO in step (D)), microcontroller 65 determines that the luminous flux of propagation light 82 does not reach wavelength conversion element 30, and outputs an error signal indicating "luminous flux does not reach" (step (I)).

Microcontroller 65 determines whether light intensity PB of fluorescence 94 is within a predetermined range (step (E)). Here, in the case where light intensity PB of fluorescence 94 is within the predetermined range (YES in step (E)), the processing goes to step (F). In the case where light intensity PB of fluorescence 94 is not within the predetermined range (NO in step (E)), microcontroller 65 determines that the luminous flux of propagation light 82 does not reach wavelength conversion element 30, and outputs an error signal indicating "luminous flux does not reach" (step (J)).

In the case where microcontroller 65 determines in step (D) that light intensity PA of scattered light 93 is within the predetermined range and in the case where microcontroller 65 determines in step (E) that light intensity PB of fluorescence 94 is within the predetermined range, microcontroller 65 calculates intensity ratio PB/PA to determine whether intensity ratio PB/PA is within a predetermined range or not (step (F)). Here, in the case where intensity ratio PB/PA is within the predetermined range (YES in step (F)), the processing goes to step (H). In the case where intensity ratio PB/PA is not within the predetermined range (NO in step (F)), microcontroller 65 determines that the color of the emission light has a failure, and outputs an error signal indicating "color failure" (step (K)).

In the case where microcontroller 65 determines in step (G) that light intensity PC of propagation light 82 is within the predetermined range and the case where microcontroller 65 determines in step (F) that intensity ratio PB/PA is within the predetermined range, microcontroller 65 calculates intensity ratio PB/PC, and determines whether intensity ratio PB/PC is within a predetermined range or not (step (H)). Here, in the case where intensity ratio PB/PC is within the predetermined range (YES in step (H)), microcontroller 65 outputs a normal signal indicating that light source device 102 is in a normal state (step (N)). In the case where intensity ratio PB/PC is not within the predetermined range (NO in step (H)), microcontroller 65 determines that the wavelength conversion efficiency in wavelength conversion element 30 is reduced, and outputs an error signal indicating "reduced wavelength conversion efficiency" (step (M)). In the processing above, intensity ratio PB/PC may be replaced with intensity ratio PA/PC.

As described above, microcontroller 65 diagnoses the state of light source device 102. In the configuration above, the error signals and the normal signal are externally output. The error signals externally output are transmitted to an external circuit not illustrated, and measures for safety, such as stop of electricity applied to light source device 102, are taken.

Such a configuration enables light source device 102 to determine the ratio of the quantity of fluorescence 94 to that of scattered light 93 in emission light from wavelength conversion element 30. For this reason, when operating, light source device 102 can externally output an error signal in the case where the position of light converging optical system 20 or wavelength conversion element 30 is deviated in light source device 102. In other words, in the case where the position of light converging optical system 20 or wavelength conversion element 30 is deviated, the center of the irradiation position of propagation light 82 is deviated from first wavelength converter 35 to second wavelength converter 36. Such a deviation changes the color of the emission light, which can be detected in step (F). As described above, a state of subtle abnormality inside light source device 102 can be detected using a combination of the difference in the values of the chromaticity coordinates of the emission light between first wavelength converter 35 and second wavelength converter 36 with the processing of the signals from several photodetectors.

Light source device 102 can also determine the ratio of the quantity of fluorescence 94 to that of propagation light 82. For this reason, due to the difference in wavelength conversion efficiency between first wavelength converter 35 and second wavelength converter 36, light source device 102 can detect that the center of the irradiation position of propagation light 82 is deviated from first wavelength converter 35 to second wavelength converter 36. For this reason, light source device 102 can detect a state of subtle abnormality inside light source device 102.

Light source device 102 including several photodetectors can output an error signal in the case where a failure such as breakage of wavelength conversion element 30 occurs. For example, in the case where wavelength conversion element 30 is completely peeled off, the values of the chromaticity coordinates of the emission light or the wavelength conversion efficiency significantly changes. For this reason, an error signal can be output based on the signals from the photodetectors. In this case, measures against this failure can be taken based on the error signal output from light source device 102, for example, by stopping the electricity applied to light source device 102 by an external circuit. As a result, wavelength conversion element 30 can be prevented from continuously emitting highly directive propagation light 82 to the outside without being scattered.

In addition to several photodetectors, the light source device according to the present embodiment further includes the wavelength conversion element including first wavelength converter 35 and second wavelength converter 36 surrounding first wavelength converter 35. Such a configuration enables the detection of a state of abnormality (such as slight deviation of the wavelength conversion element) before a state of serious abnormality (such as complete peel-off of wavelength conversion element 30) occurs. For this reason, the operation of the light source device can be stopped in a state of abnormality before the occurrence of a state of abnormality where highly directive propagation light 82 is emitted to the outside.

Light source device 102 according to the present embodiment may also be used in lighting devices.

Modification 1 of Embodiment 4

A configuration of light source device 300 according to Modification 1 of the present embodiment will now be described with reference to FIG. 22.

Figure 22:
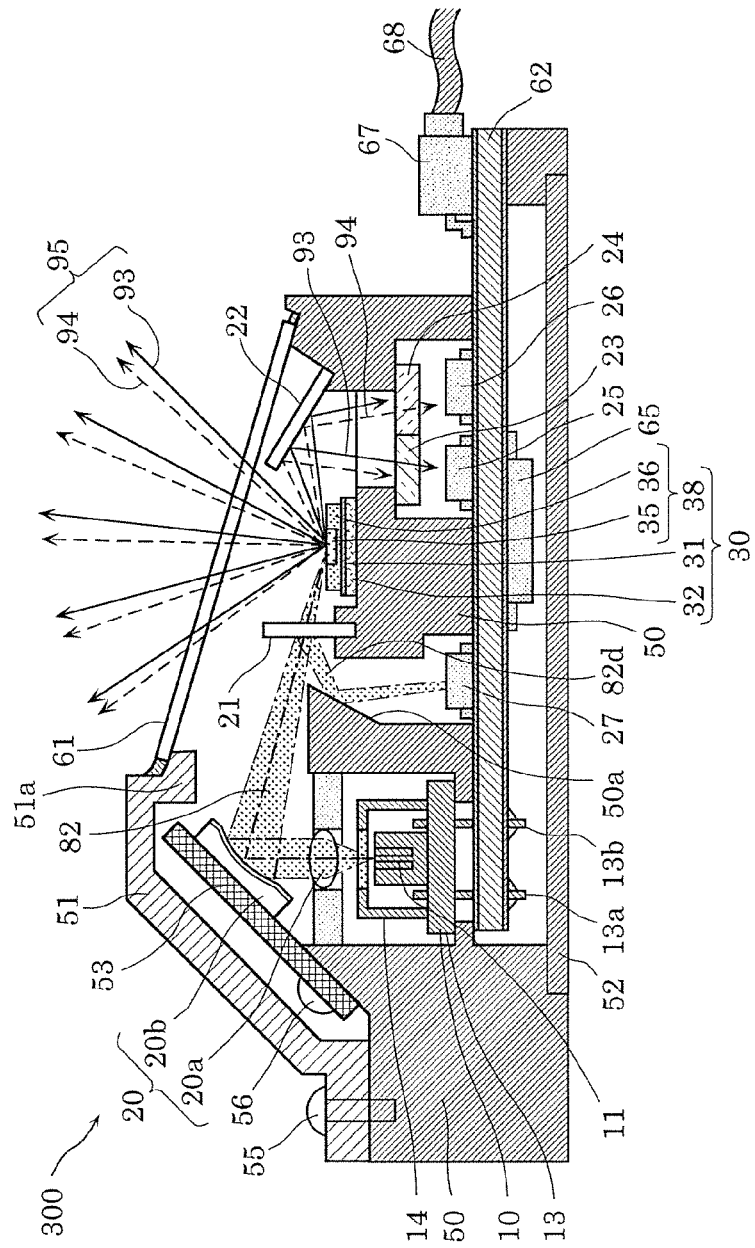
FIG. 22 is a schematic sectional view illustrating a schematic configuration of a light source device according to Modification 1 of Embodiment 4.

FIG. 22 is a schematic sectional view illustrating a schematic configuration of light source device 300 according to the present modification.

As a feature, light source device 300 according to the present modification incorporates first photodetector 25, second photodetector 26, and third photodetector 27, and microcontroller 65 which computes the signals output from the photodetectors. As another feature, the photodetectors and microcontroller 65 are mounted on a single print substrate 62.

In FIG. 22, semiconductor light-emitting device 10, light converging optical system 20, and wavelength conversion element 30 are fixed to housing 50 made of an aluminum alloy, for example. Housing 50 includes cover member 61 which encloses optical axis of excitation light 81 and that of propagation light 82. Cover member 61 is formed with glass, for example.

Semiconductor light-emitting device 10 includes semiconductor light-emitting element 11 mounted on package 13, which is a TO-CAN package, for example.

Semiconductor light-emitting device 10 is fixed such that the excitation light from semiconductor light-emitting element 11 is emitted to an upper portion of the drawing. Metal can 14 having a window glass fixed thereto is then fixed to package 13 so as to cover semiconductor light-emitting element 11.

Light converging optical system 20 according to the present modification includes lens 20a, and reflective optical element 20b, which is a concave reflecting surface, for example. Reflective optical element 20b is fixed to support member 53. Support member 53 is fixed to housing 50 using screw 56.

Wavelength conversion element 30 includes support member 32, and wavelength converter 38 disposed on support member 32. Wavelength converter 38 includes first wavelength converter 35, second wavelength converter disposed around first wavelength converter 35 to surround the first wavelength converter in a top view of the surface of support member 32 on which wavelength converter 38 is disposed. In the present embodiment, wavelength conversion element 30 includes reflective member 31 disposed between support member 32 and first wavelength converter 35. In light source device 300 according to the present modification, wavelength conversion element 30 can have any usable configuration other than the configuration described above. Light source device 300 can include any wavelength conversion element. For example, wavelength converter 38 may include a single wavelength converting member.

Wavelength conversion element 30 is fixed to housing 50. Specifically, an adhesive layer (not illustrated in FIG. 22), which is a metal film of Ti or Au, for example, is disposed on the surface of support member 32 on which wavelength converter 38 is not disposed. The adhesive layer is fixed to housing 50 with solder not illustrated, for example.

Separating optical element 21, such as glass with an antireflection film, is disposed between wavelength conversion element 30 and reflective optical element 20b. Most of components of propagation light 82 from reflective optical element 20b transmits through separating optical element 21, and another part thereof is reflected. Thereby, part of components of propagation light 82 is separated by separating optical element 21.

Reflective member 22, such as glass having a reflecting surface, is fixed to housing 50 on the side of wavelength conversion element 30 opposite to the reflective optical element 20b. Reflective member 22 is an optical member which guides light emitted from wavelength conversion element 30 to first photodetector 25 and second photodetector 26. In the present modification, reflective member 22 is disposed at a position where part of components of emission light 95 from wavelength conversion element 30 which is not emitted to the outside enters.

Lead pins 13a and 13b of semiconductor light-emitting device 10 are connected to print substrate 62 on which first photodetector 25, second photodetector 26, third photodetector 27, and microcontroller 65 are mounted. Print substrate 62 is disposed on a lower portion of housing 50, and is covered with cover member 52. First photodetector 25, second photodetector 26, and third photodetector 27 are mounted on the surface of print substrate 62 close to wavelength conversion element 30. First photodetector 25 is disposed below separating optical element 21 while second photodetector 26 and third photodetector 27 are disposed below reflective member 22.

Connector 67 for connecting to an external circuit is mounted on print substrate 62. External wiring 68 is attached to connector 67 to be electrically connected to the outside.

Cover member 51 and cover member 61, such as transparent glass with an antireflection film, are attached to housing 50 so as to cover the light path of propagation light 82. Cover member 51 is formed of a metallic material of an aluminum alloy, for example, and is fixed to housing 50 with screw 55. Cover member 61 is disposed so as to cover an opening defined by housing 50 and cover member 51. Cover member 61 shields the light path of propagation light 82 from the outside, and emits emission light 95 from wavelength conversion element 30 to the outside.

Housing 50 includes reflecting surface 50a which reflects part of components of propagation light 82 to the light path of propagation light 82 separated by separating optical element 21. Housing 50 also includes first filter 23 and second filter 24 (optical filters) attached thereto.

[Operation]

The operation of light source device 300 will now be described. The emission light emitted from semiconductor light-emitting device 10 is converted into substantially parallel light through lens 20a. The substantially parallel light is converged into propagation light 82 by reflective optical element 20b, and travels toward wavelength conversion element 30. Propagation light 82 transmits through separating optical element 21 before it reaches wavelength conversion element 30. At this time, part of components of propagation light 82 is reflected on separating optical element 21, then reflected on reflecting surface 50a of housing 50, and enters third photodetector 27.

Most of the components of propagation light 82 which enters wavelength conversion element 30 then enters first wavelength converter 35 of wavelength conversion element 30, and another part of the components of propagation light 82 enters second wavelength converter 36. Part of the components of propagation light 82 which enters first wavelength converter 35 is then converted into fluorescence 94 in first wavelength converter 35. Another part thereof is scattered into scattered light 93 in first wavelength converter 35. Fluorescence 94 and scattered light 93 are then emitted from first wavelength converter 35. Scattered light 93 and fluorescence 94 are transmitted through cover member 61, and are emitted as emission light 95 from light source device 300.

In contrast, part of the components of emission light 95 emitted from wavelength conversion element 30 is reflected on reflective member 22, and travels toward first photodetector 25 and second photodetector 26.

In such a configuration, the signals output from first, second, and third photodetectors 25, 26, and 27 are output as an error signal or a signal after the computation of these signals by microcontroller 65 incorporated in light source device 300, according to the flow illustrated in FIG. 21.

The error signal and the normal signal are then output to the outside by connector 67. The error signal output to the outside is transmitted to an external circuit not illustrated, and measures for safety, such as stop of electricity applied to light source device 300, are taken by the external circuit.

[Effects]

Light source device 300 in such a configuration incorporates first photodetector 25, second photodetector 26, third photodetector 27, and microcontroller 65 which computes the signals output from these photodetectors. Furthermore, the photodetectors and microcontroller 65 in light source device 300 are mounted on a single print substrate 62. Accordingly, the information on the states of propagation light 82 and wavelength conversion element 30 is obtained through the reception of the signal from light source device 300 by the external circuit. For example, the configuration above can detect whether propagation light 82 from semiconductor light-emitting device 10 precisely enters wavelength conversion element 30 or not.

Furthermore, light source device 300 can detect propagation light 82 and emission light 95 with a simple configuration including the photodetectors because the photodetectors and microcontroller 65 are disposed on a single print substrate 62. Moreover, light source device 300 can reduce the optical loss accompanied by the detection of propagation light 82 because propagation light 82 is separated by separating optical element 21, which is glass with an antireflection film having high transmittance. Light source device 300 can also reduce the optical loss accompanied by the detection of emission light 95 because part of the components of emission light 95 not emitted from cover member 61 of light source device 300 is guided through reflective member 22 to first photodetector 25 and second photodetector 26.

The luminance distribution and color distribution in the light emission region of wavelength conversion element 30 of light source device 300 according to the present modification as well as those in Comparative Examples will now be illustrated with reference to the drawing, and the effects will be described.

Figure 23:
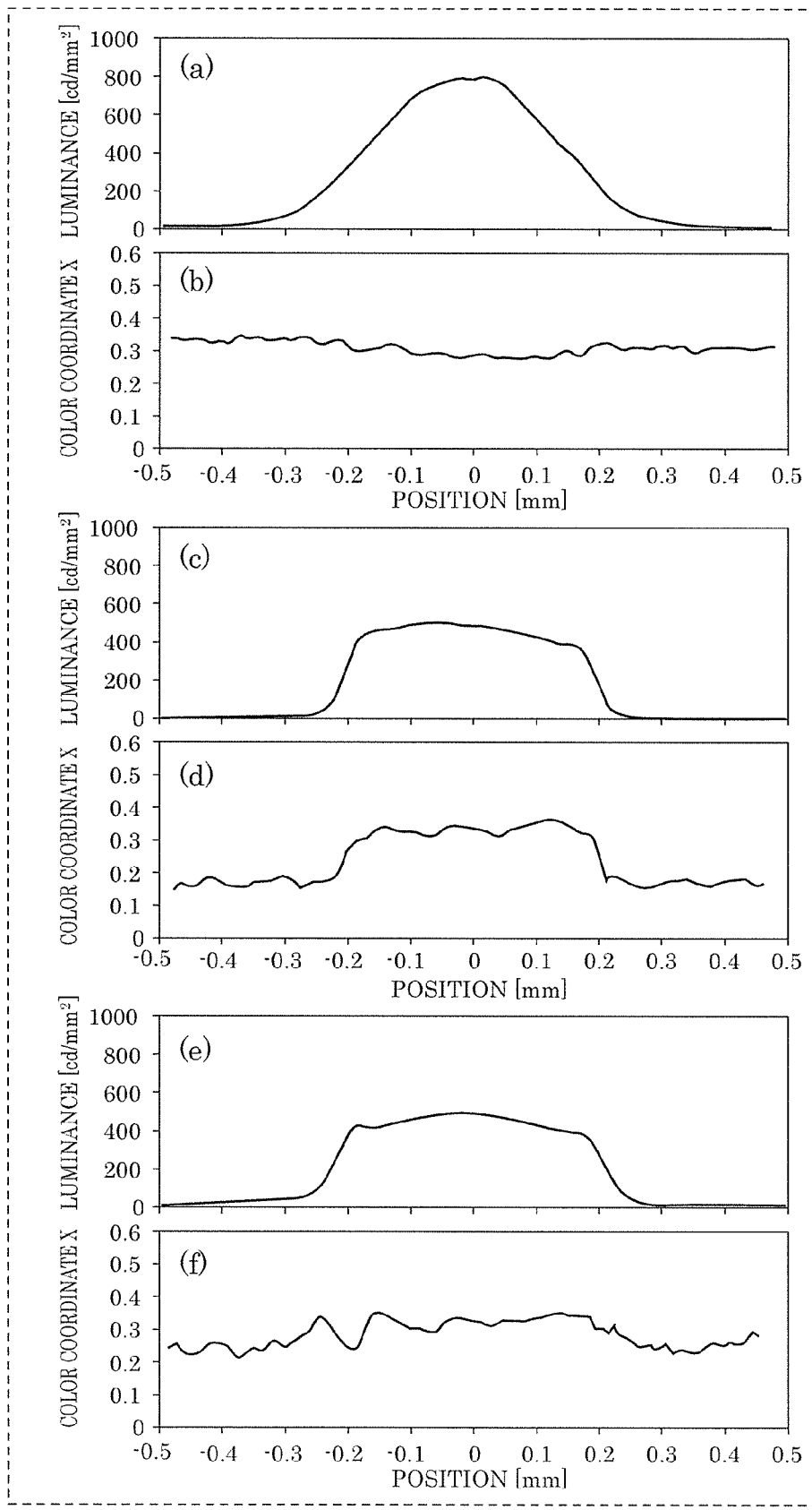
FIG. 23 is graphs illustrating exemplary measurement of the luminance distribution and color distribution of the emission light on a light emitting surface in the light source devices according to Modification 1 of Embodiment 4 and Comparative Example.

FIG. 23 is graphs illustrating examples of the measurement of the luminance distribution and color distribution of the emission light on the light emitting surface in the light source devices according to the present modification and Comparative Examples.

(e) and (f) of FIG. 23 each are a graph illustrating an example of the measurement of the luminance distribution and color distribution of emission light 95 on the light emitting surface (that is, the surface of wavelength converter 38 from which light is emitted) in light source device 300 according to the present modification. Specifically, first wavelength converter 35 used was formed with a ceramic fluorescent substance of YAG fluorescent particles mixed with $Al_2O_3$ into an outer shape of a 0.4 mm square having a thickness of 70 μm, and was fixed onto a support member. Second wavelength converter 36 used was formed around first wavelength converter 35 using YAG fluorescent particles having an average particle diameter of 2 μm mixed with silsesquioxane.

In contrast, (a) and (b) of FIG. 23 each illustrate the luminance distribution and color distribution measured using a wavelength conversion element according to Comparative Example including wavelength converter 38 including first wavelength converter 35 and second wavelength converter 36 both having the exact same structure (that is, including only first wavelength converter 35). Specifically, wavelength converter 38 used was formed with YAG fluorescent particles having an average particle diameter of 8 μm mixed with silsesquioxane into a thickness of 30 μm and a width of 1 mm or more, and was fixed onto a support member.

(c) and (d) of FIG. 23 each illustrate the luminance distribution and color distribution measured using a wavelength conversion element according to Comparative Example including second wavelength converter 36 including only a scattering member and not containing any fluorescent material. At this time, second wavelength converter 36 used was specifically formed with $TiO_2$ particles having an average particle diameter of 2 μm mixed with silsesquioxane. A ceramic fluorescent substance having an outer shape of a 0.4 mm square and having a thickness of 70 μm was used as first wavelength converter 35 as in the present modification.

As illustrated in (e) of FIG. 23, light source device 300 can have a uniform luminance distribution whose central portion has high luminance. In the luminance distribution in (e) of FIG. 23, a high luminance region (region ranging from the center to 0.2 mm) corresponds to first surface 35a (first emitting region 41) of first wavelength converter 35 in wavelength conversion element 30, and its surrounding region corresponds to first surface 36a (second emitting region 42) of second wavelength converter 36 (see FIG. 2A about first surfaces 35a and 36a, first emitting region 41, and second emitting region 42). As described above, light source device 300 has a luminance distribution having a high contrast between first emitting region 41 and second emitting region 42. Furthermore, as illustrated in the color distribution of (f) of FIG. 23, the values of the chromaticity coordinate x of first emitting region 41 and the chromaticity coordinate x of second emitting region 42 both are distributed between 0.2 and 0.4.

In contrast, in the case where second wavelength converter 36 is formed without using any fluorescent material, as illustrated in (c) and (d) of FIG. 23, although a uniform luminance distribution whose central portion has high luminance can be obtained, blue light having a value of a chromaticity coordinate x of less than 0.2 is emitted from the surrounding region. In the case where the wavelength conversion element includes only the first wavelength converter, as illustrated in (a) and (b) of FIG. 23, although white light can be emitted across the light emission region, the luminance distribution cannot have a uniform distribution region.

As described above, the light source device according to the present modification can have a luminance distribution where the luminance of the central portion is uniform and high and that of the surrounding portion is low, and at the same time, can emit white light from the entire light emission region.

Light source device 300 according to the present modification can also be used in lighting devices.

Modification 2 of Embodiment 4

A light source device according to Modification 2 of the present embodiment will now be described with reference to FIG. 24.

Figure 24:
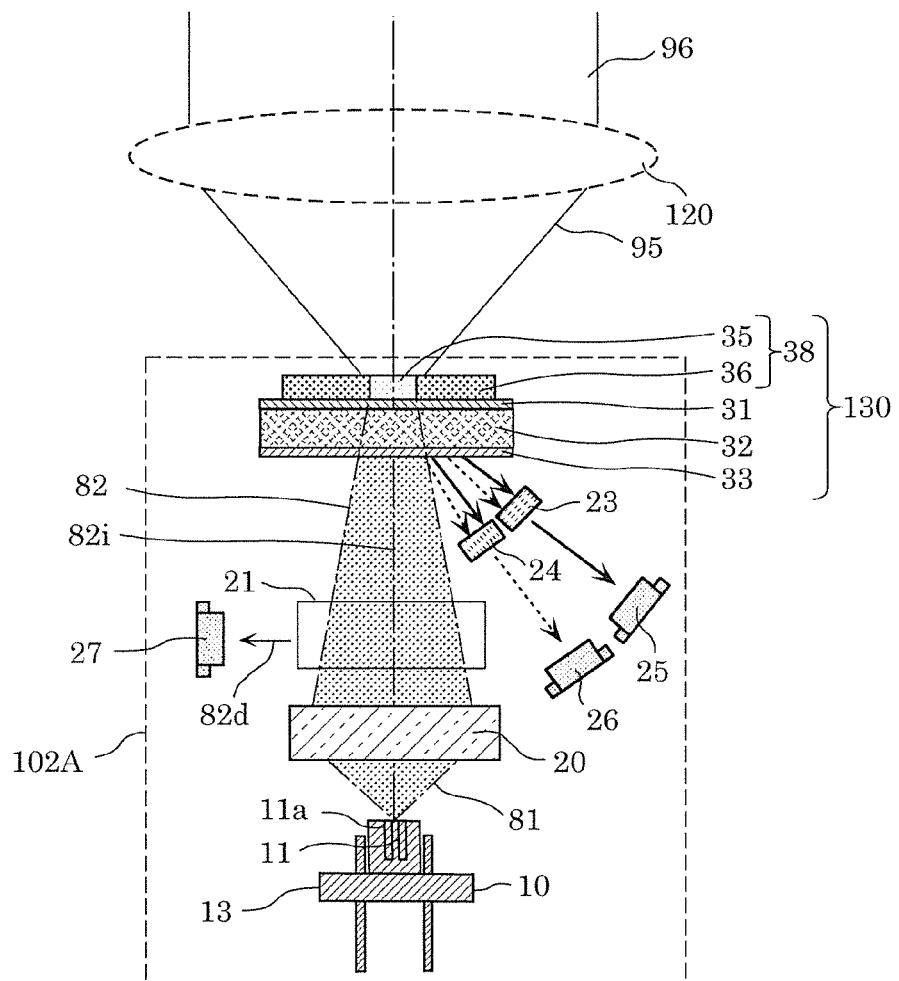
FIG. 24 is a schematic sectional view illustrating a schematic configuration of a light source device according to Modification 2 of Embodiment 4.

FIG. 24 is a schematic sectional view illustrating a schematic configuration of light source device 102A according to the present modification.

Light source device 102A illustrated in FIG. 24 is light source device 101 according to the modification of Embodiment 2 illustrated in FIG. 13, further including separating optical element 21, first photodetector 25, second photodetector 26, third photodetector 27, separating optical element 21, first filter 23, and second filter 24.

Separating optical element 21 guides part of components of light from propagation light 82 to a different light path 82d.

Semiconductor light-emitting device 10 is fixed such that the emission light emitted from semiconductor light-emitting element 11 is emitted toward wavelength conversion element 130. Excitation light 81 emitted from semiconductor light-emitting device 10 is emitted toward light converging optical system 20. Light converging optical system 20 converges excitation light 81 emitted from semiconductor light-emitting device 10 and having an emission angle in a horizontal direction and a vertical direction, and generates propagation light 82 which is excitation light that propagates through the space toward wavelength conversion element 130 while being collimated or converged. Propagation light 82 propagates along central axis 82i, and is emitted to wavelength conversion element 130.

Propagation light 82 transmits through separating optical element 21 before it reaches wavelength conversion element 130. At this time, part of the components of propagation light 82 is reflected on separating optical element 21, and enters third photodetector 27.

Most of the components of propagation light 82 which enters wavelength conversion element 130 enters first wavelength converter 35 of wavelength conversion element 130, and another part of the components of propagation light 82 enters second wavelength converter 36.

Part of the components of propagation light 82 which enters first wavelength converter 35 is converted into fluorescence 94 in first wavelength converter 35, and another part thereof is scattered into scattered light 93 in first wavelength converter 35. Scattered light 93 is emitted from wavelength conversion element 130. Scattered light 93 and fluorescence 94 are emitted as emission light 95 from light source device 300.

In contrast, part of the components of emission light 95 emitted from wavelength conversion element 130 passes through reflective member 31, support member 32, and antireflection film 33, and is emitted to the opposite direction to the surface of wavelength conversion element 130 on which the first wavelength converter 35 is disposed (lower side of FIG. 24). This part of the components of emission light 95 is then guided to first photodetector 25 and second photodetector 26. At this time, part of components of emission light 95 toward first photodetector 25 enters first filter 23. Part of components of emission light 95 toward second photodetector 26 enters second filter 24.

As in the operation of light source device 102 according to Embodiment 4, the light components guided to first photodetector 25, second photodetector 26 and third photodetector 27 in such a configuration are subjected to photoelectric conversion, and are input into a microcontroller not illustrated.

The present modification can also readily diagnose the state of light source device 102A in which the incident surface for excitation light (propagation light 82) of wavelength conversion element 130 is disposed opposite to the surface emitting emission light 95. For example, a change in color of emission light 95 emitted from wavelength converter 38 can be readily detected. More specifically, the state can be detected, for example, in the case where the irradiation position of propagation light 82 (excitation light) is deviated from first wavelength converter 35 to second wavelength converter 36.

Light source device 102A according to the present modification can also be used in lighting devices.

(Light Source Device of Embodiment 5)

A light source device according to Embodiment 5 will now be described. Unlike the wavelength conversion elements according to the embodiments described above, the wavelength conversion element included in the light source device according to the present embodiment has a recess in the reflective member close to the first wavelength converter 35, and first wavelength converter 35 is disposed on the bottom of the recess. For this reason, part or all of the lateral surface of first wavelength converter 35 is surrounded by reflective member 31. Differences between the light source device according to the present embodiment and wavelength conversion element 30 in light source device according to Embodiment 1 will now be mainly described with reference to the drawings.

Figure 25:
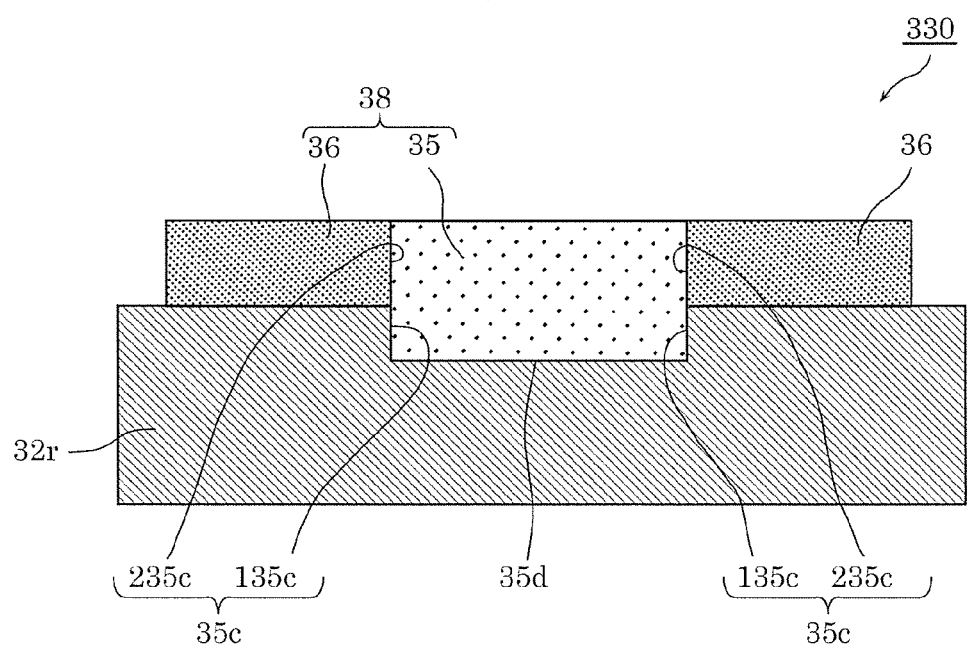
FIG. 25 is a schematic sectional view illustrating a schematic configuration of a wavelength conversion element according to Embodiment 5.

FIG. 25 is a schematic sectional view illustrating a schematic configuration of wavelength conversion element 330 according to the present embodiment.

Wavelength conversion element 330 illustrated in FIG. 25 has a recess formed on a surface of support member 32r (composed of an aluminum plate or aluminum alloy plate, for example) by metal processing or forging. In such a configuration, support member 32r in the present embodiment also functions as a reflective member. First wavelength converter 35 composed of, for example, a mixture of fluorescent particles composed of a YAG fluorescent particle and a transparent bonding material of silsesquioxane is disposed in the recess. Second wavelength converter 36 is disposed to surround first wavelength converter 35. Accordingly, lateral surface 35c of first wavelength converter 35 has lateral surface 135c, which is an interface between first wavelength converter 35 and support member 32r functioning as a reflective member, and lateral surface 235c, which is an interface between first wavelength converter 35 and second wavelength converter 36.

The function of wavelength conversion element 330 according to the present embodiment will now be described with reference to FIG. 26.

Figure 26:
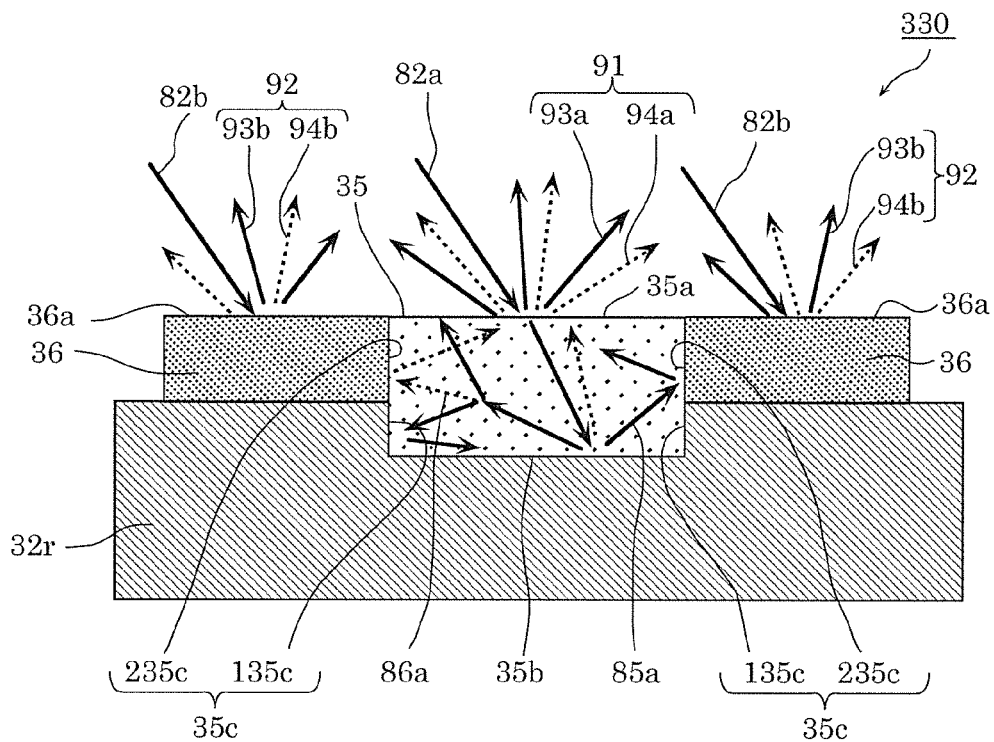
FIG. 26 is a schematic sectional view illustrating a function of the wavelength conversion element according to Embodiment 5.

FIG. 26 is a schematic sectional view illustrating a function of wavelength conversion element 330 according to the present embodiment.

Incident light 82a which enters first wavelength converter 35 is subjected to the multiple reflection inside first wavelength converter 35. At this time, incident light 82a is reflected on second surface 35b, lateral surface 135c, and lateral surface 235c of first wavelength converter 35 into incident light 85a, which is subjected to multiple reflection. Incident light 85a is converted into fluorescence 86a by converting the wavelength in first wavelength converter 35, and are also subjected to multiple reflection. As a result, emission light 91 composed of scattered light 93a and fluorescence 94a is emitted from first wavelength converter 35. At this time, the multiple reflection of scattered light 93a and fluorescence 94a inside first wavelength converter 35 results in uniform light distribution in first wavelength converter 35. Furthermore, second surface 35b and lateral surface 135c of first wavelength converter 35 form interfaces with support member 32r functioning as a reflective member. For this reason, the reflectance of incident light 85a and that of fluorescence 86a on second surface 35b and lateral surface 135c can be increased.

For this reason, light having high luminance can be emitted from first wavelength converter 35.

Modification of Embodiment 5

The light source device according to a modification of the present embodiment will now be described with reference to the drawing. The configuration of the support member is mainly different between the wavelength conversion element included in the light source device according to the present modification and wavelength conversion element 330 according to Embodiment 5. Differences between the wavelength conversion element according to the present modification and wavelength conversion element 330 according to Embodiment 5 will now be mainly described with reference to the drawing.

Figure 27:
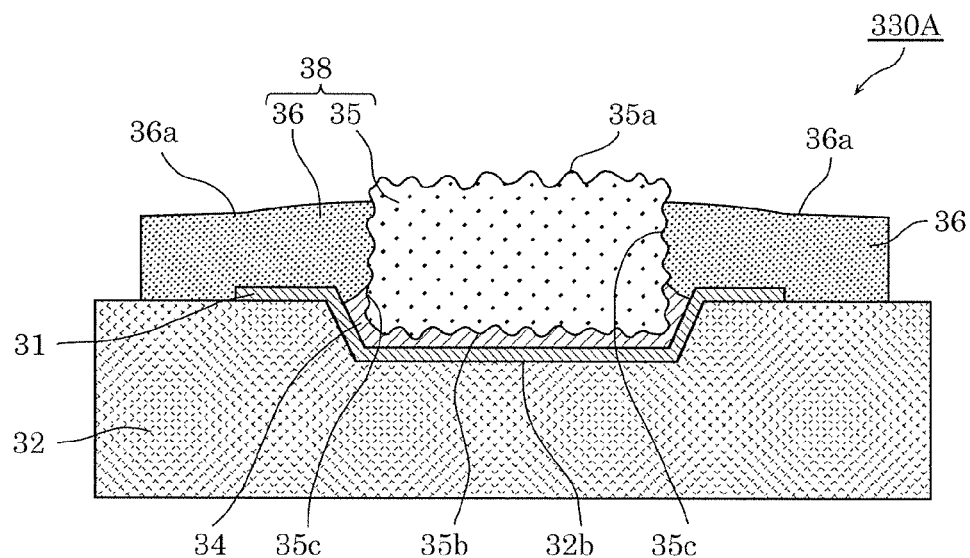
FIG. 27 is a schematic sectional view illustrating a schematic configuration of a wavelength conversion element included in a light source device according to a modification of Embodiment 5.

FIG. 27 is a schematic sectional view illustrating a schematic configuration of wavelength conversion element 330A included in the light source device according to the present modification.

As illustrated in FIG. 27, wavelength conversion element 330A includes support member 32, and reflective member 31 disposed on support member 32. First wavelength converter 35 is formed with a block-shaped wavelength converting member, such as a ceramic YAG fluorescent substance, having projections and depressions on the surfaces of the member.

In the present modification, support member 32 is formed with a silicon substrate whose main surface is a (100) plane, for example. A recess is formed in the center of support member 32 by resist patterning using semiconductor lithographic techniques and anisotropic wet etching using tetramethylammonium hydroxide (TMAH). Such a configuration enables precise formation of inclined surfaces of the recess at a predetermined angle and precise control of the depth of the recess. Furthermore, reflective member 31, such as a metal film made of chromium or aluminum, is disposed on the recess.

In the next step, bonding material 34 is applied to bottom 32b of the recess. For example, bonding material 34 is a liquid silicone resin when applied. A block-shaped first wavelength converter 35 is then mounted from above the recess onto bonding material 34 using a vacuum collet not illustrated, for example.

In the next step, bonding material 34 is cured under a high temperature atmosphere at about 150° C., for example, to fix first wavelength converter 35 to the recess.

In the next step, second wavelength converter 36 is formed around first wavelength converter 35. Specifically, second wavelength converter 36 can be readily formed by applying and curing a paste material for second wavelength converter 36 prepared by mixing fluorescent particles having a predetermined average particle diameter with a transparent bonding material.

Such a configuration can provide wavelength conversion element 330A having the same effects as those of wavelength conversion elements according to the embodiments described above. Furthermore, first wavelength converter 35 can be precisely fixed to an appropriate position on support member 32 in wavelength conversion element 330A because the recess is disposed on support member 32 and first wavelength converter 35 is mounted on the recess.

Embodiment 6

A light source device according to Embodiment 6 will now be described. Unlike wavelength conversion element 230 according to Embodiment 3, the wavelength conversion element included in the light source device according to the present embodiment includes a reflective member which is disposed between first wavelength converter 35 and support member 32 and is different from second wavelength converter 36 surrounding at least part of second surface 35b and at least part of lateral surface 35c of first wavelength converter 35. Differences between the light source device according to the present embodiment and the light source device according to Embodiment 3, and mainly wavelength conversion element 230 will now be described with reference to the drawing.

Figure 28:
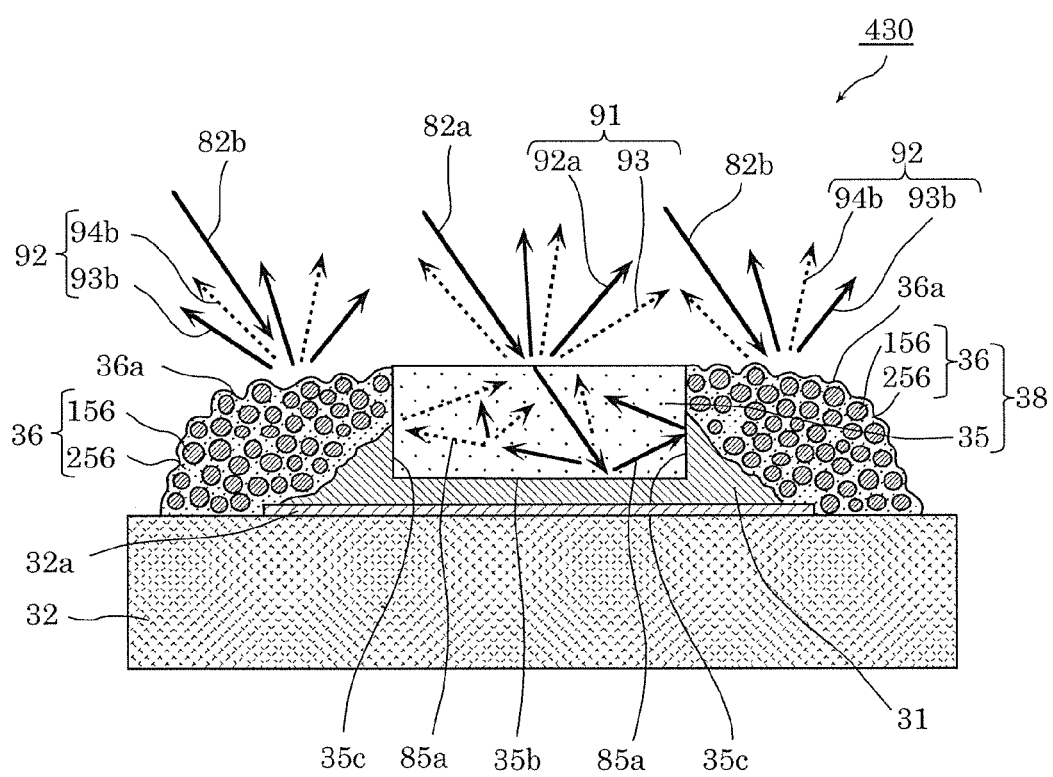
FIG. 28 is a schematic sectional view illustrating a schematic configuration of a wavelength conversion element included in a light source device according to Embodiment 6.

FIG. 28 is a schematic sectional view illustrating a schematic configuration of wavelength conversion element 430 included in the light source device according to the present embodiment.

As illustrated in FIG. 28, wavelength conversion element 430 according to the present embodiment includes reflective member 31 which is disposed between first wavelength converter 35 and support member 32 and is different from second wavelength converter 36, and surrounds at least part of second surface 35b and at least part of lateral surface 35c of first wavelength converter 35. Reflective member 31 used can be a scattering member containing dispersed particles having a high refractive index. This configuration can improve the freedom of the configuration of the scattering member because the bottom surface and the lateral surface of first wavelength converter 35 can be covered with any scattering member other than second wavelength converter 36.

Moreover, reflective film 32a formed with a dielectric multi-layer film or a metal reflective film may be disposed on the main surface of support member 32 on which first wavelength converter 35 is disposed. Reflective film 32a used can be a film made of Ag, for example. In such a configuration, incident light 85a from first wavelength converter 35 toward support member 32 can be efficiently reflected by a double-reflecting structure composed of reflective member 31 and reflective film 32a even in the case where reflective member 31 disposed between first wavelength converter 35 and support member 32 has a reduced thickness. Furthermore, reflective member 31 can have a reduced thickness even in the case where the reflective member disposed between first wavelength converter 35 and support member 32 is formed with a transparent bonding material having a low thermal conductivity. For this reason, heat generated in first wavelength converter 35 can be efficiently dissipated to support member 32. Reflective member 31 disposed between first wavelength converter 35 and support member 32 in this configuration may have a thickness of 1 µm or more and 50 µm or less.

[Method of Producing Wavelength Conversion Element According to Embodiment 6]

A method of producing wavelength conversion element 430 according to Embodiment 6 will now be described with reference to the drawing.

Figure 29:
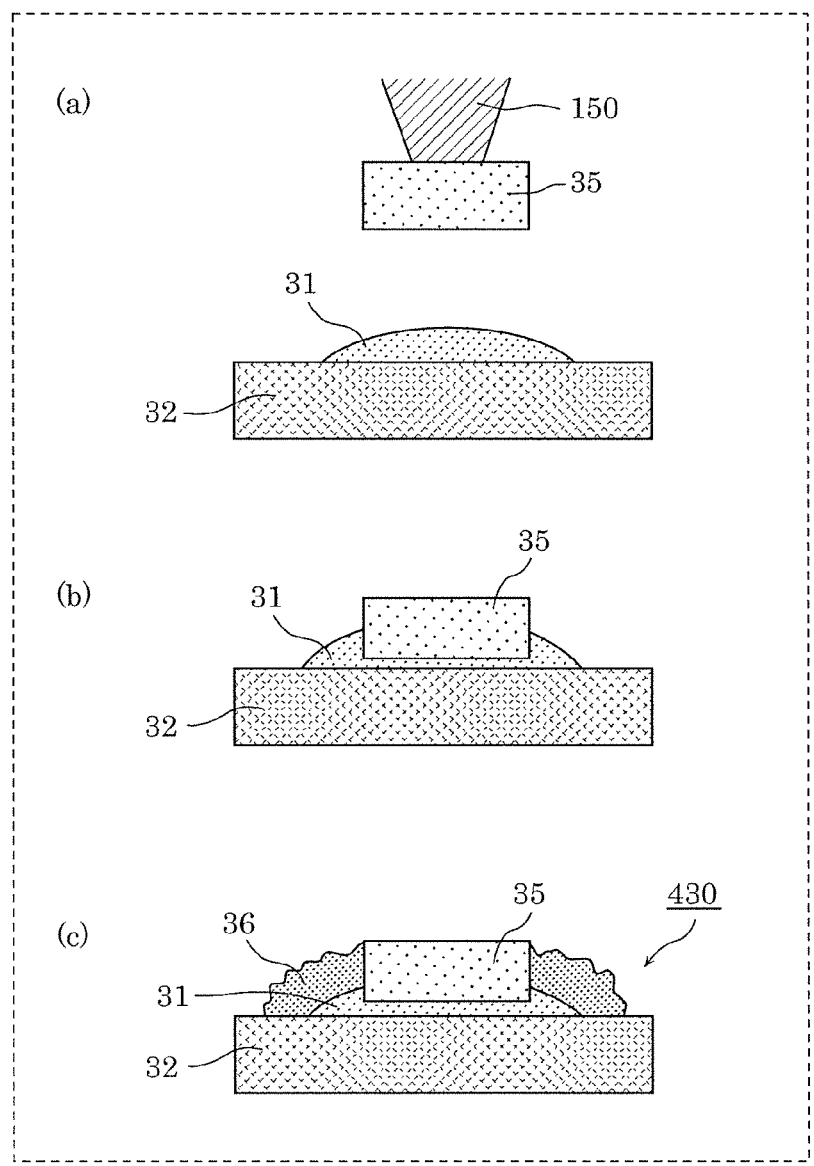
FIG. 29 is a schematic sectional view illustrating the steps of a method of producing the wavelength conversion element according to Embodiment 6.

FIG. 29 is a schematic sectional view illustrating the steps of the method of producing wavelength conversion element 430 according to the present embodiment.

As illustrated in sectional view (a) of FIG. 29, first, a paste material for reflective member 31 prepared with a mixture of $TiO_2$ particles having an average particle diameter of 0.1 µm to 4 µm with a transparent bonding material, for example, is applied onto support member 32, such as a silicon substrate. At this time, the transparent bonding material used is a paste of transparent bonding material, such as silsesquioxane, dissolved in an organic solvent. First wavelength converter 35 is held with vacuum collet 150.

In the next step, as illustrated in sectional view (b) of FIG. 29, first wavelength converter 35 is disposed on the paste material for reflective member 31. At this time, the paste material for reflective member 31 rises on the lateral surface of first wavelength converter 35 due to the intermolecular force between first wavelength converter 35 and the transparent bonding material. Thereby, at least part of the bottom surface of first wavelength converter 35 and at least part of the lateral surface thereof can be readily covered with the paste material for reflective member 31.

Reflective member 31 is then cured by heating.

At this time, the organic solvent in the paste material for reflective member 31 is evaporated by heating at about 150° C. for about two hours, for example, to cure the paste material.

In the next step, as illustrated in sectional view (c) of FIG. 29, second wavelength converter 36 is disposed so as to surround first wavelength converter 35.

At this time, second wavelength converter 36 is formed with a paste material for the wavelength converting member prepared by mixing fluorescent particles having a particle diameter distributed from 1 µm to 4 µm with a transparent bonding material, for example. Here, the term "particle diameter distributed from 1 µm to 4 µm" indicates that the average particle diameter D50 is 2 µm, D10 is 1 µm, and D90 is 4 µm. At this time, the transparent bonding material used is a paste of transparent bonding material, such as silsesquioxane, dissolved in an organic solvent.

The paste material for second wavelength converter 36 described above is applied with a syringe, for example. Second wavelength converter 36 can be formed around first wavelength converter 35. At this time, projections and depressions can be readily formed on the surface of second wavelength converter 36 along the fluorescent particles because the paste material for second wavelength converter 36 shrinks. Thereby, propagation light 82 can be scattered on the surface of second wavelength converter 36.

The method described above can facilitate the production of wavelength conversion element 430 in the light source device according to the present embodiment.

Modification 1 of Embodiment 6

A wavelength conversion element included in the light source device according to a modification of the present embodiment will now be described.

The wavelength conversion element according to the present modification includes a support member, which is a substrate having projections and depressions formed on its surface. A reflective film is disposed on the irregular surface of the support member. The wavelength conversion element included in the light source device according to the present modification will now be described with reference to the drawing.

Figure 30:
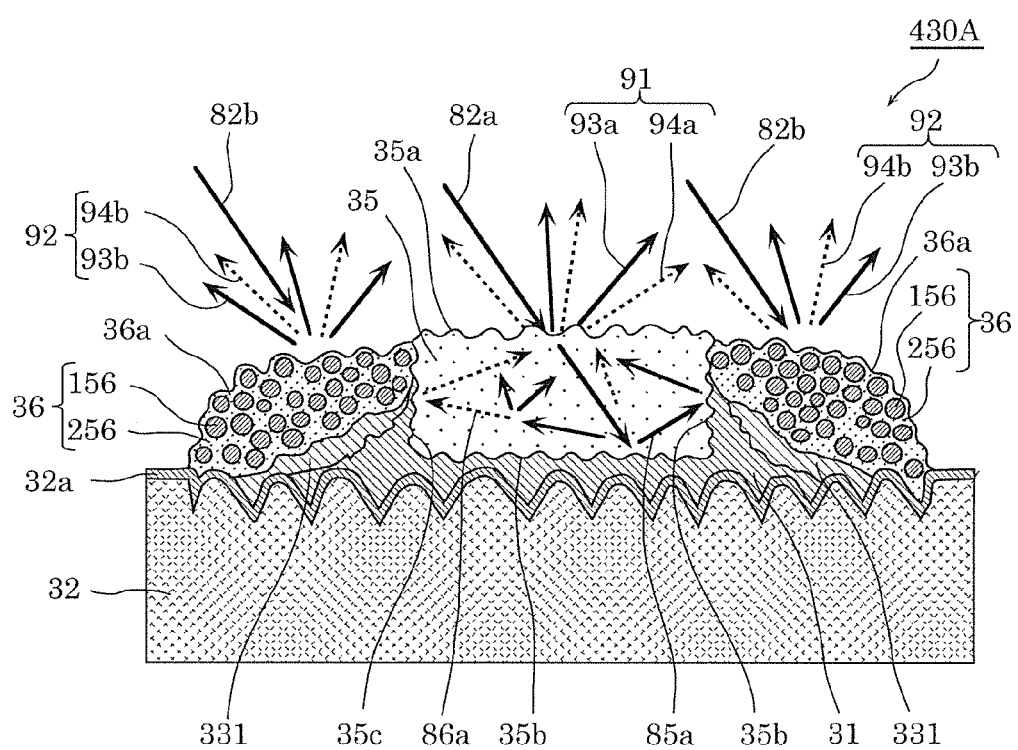
FIG. 30 is a schematic sectional view illustrating a schematic configuration of a wavelength conversion element included in a light source device according to Modification 1 of Embodiment 6.

FIG. 30 is a schematic sectional view illustrating a schematic configuration of wavelength conversion element 430A included in the light source device according to the present modification.

As illustrated in FIG. 30, wavelength conversion element 430A according to the present modification having the above configuration scatters incident light 82a and incident light 82b on the irregular surface of support member 32 even in the case where first wavelength converter 35 or reflective member 31 is detached from support member 32 in wavelength conversion element 30. Accordingly, light source devices including wavelength conversion element 30 can be handled with safety.

Furthermore, as illustrated in FIG. 30, first wavelength converter 35 can have projections and depressions formed on first surface 35a, second surface 35b, and lateral surface 35c such that the surface roughness Ra ranges from 0.5 μm to 5 μm, for example. Because incident light 85a and fluorescence 86a are subjected to multiple reflection and scattering inside first wavelength converter 35 by these projections and depressions, emission light 91 emitted from first emitting region can have more uniform in-plane luminance distribution. Furthermore, because part of components of incident light 82a, when reflected on first surface 35a, can be scattered and reflected by the projections and depressions of first surface 35a, emission light 91 can have more uniform luminance distribution in the emission direction.

Furthermore, as illustrated in FIG. 30, intermediate layer 331 including an absorption member may be disposed between reflective member 31 and second wavelength converter 36. The absorption member used can be formed with a mixture of a transparent bonding material with metal nanoparticles of gold, carbon nanoparticles, or europium-activated fluorescent particles, for example. This configuration can prevent incident light 82b from passing through second wavelength converter 36 to reflective member 31 and being reflected on reflective member 31. For this reason, the freedom can be increased in design of the wavelength conversion efficiencies of first wavelength converter 35 and second wavelength converter 36.

Modifications 2 to 4 of Embodiment 6

Wavelength conversion elements included in light source devices according to Modifications 2 to 4 of the present embodiment will now be described with reference to the drawings. The differences between each modification and wavelength conversion element 430 according to the present embodiment are mainly the configurations of reflective member 31 and second wavelength converter 36.

Figure 31A:
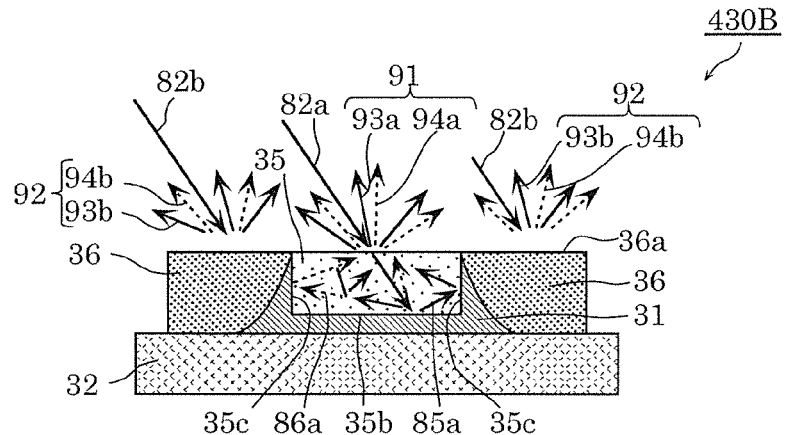
FIG. 31A is a sectional view schematically illustrating a schematic configuration of a wavelength conversion element included in a light source device according to Modification 2 of Embodiment 6.
Figure 31B:
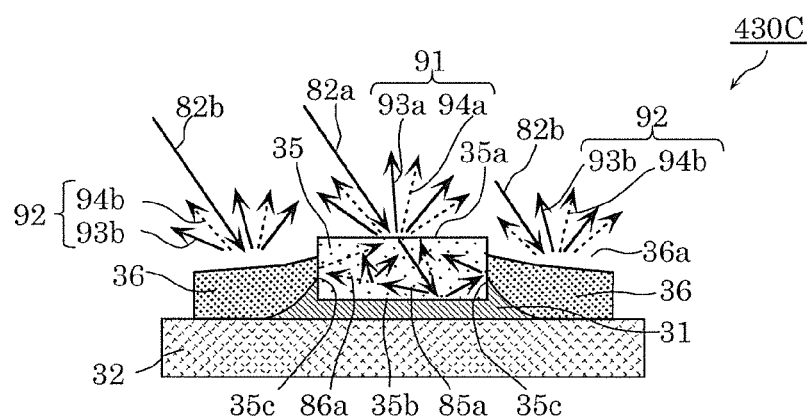
FIG. 31B is a sectional view schematically illustrating a schematic configuration of a wavelength conversion element included in a light source device according to Modification 3 of Embodiment 6.
Figure 31C:
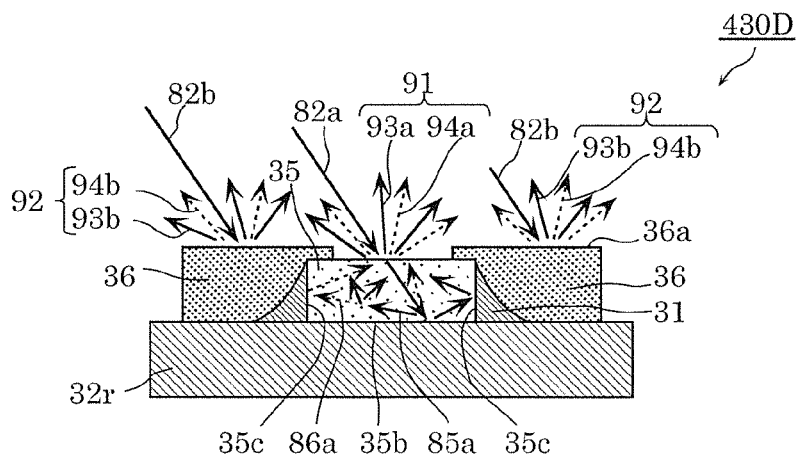
FIG. 31C is a sectional view schematically illustrating a schematic configuration of a wavelength conversion element included in a light source device according to Modification 4 of Embodiment 6.

FIG. 31A is a sectional view schematically illustrating a schematic configuration of wavelength conversion element 430B included in a light source device according to Modification 2 of the present embodiment. FIG. 31B is a sectional view schematically illustrating a schematic configuration of wavelength conversion element 430C included in a light source device according to Modification 3 of the present embodiment. FIG. 31C is a sectional view schematically illustrating a schematic configuration of wavelength conversion element 430D included in a light source device according to Modification 4 of the present embodiment.

In wavelength conversion element 430B according to Modification 2 illustrated in FIG. 31A, reflective member 31 reaches the uppermost portion of lateral surface 35c of first wavelength converter 35. Such a configuration can increase the wavelength conversion efficiency of first wavelength converter 35.

In wavelength conversion element 430C according to Modification 3 illustrated in FIG. 31B, reflective member 31 covers part of lateral surface 35c of first wavelength converter 35. Second wavelength converter 36 covers part of the lateral surface of first wavelength converter 35. At least part of lateral surface 35c of first wavelength converter 35 is covered with reflective member 31 in this configuration, enabling an increase in conversion efficiency of first wavelength converter 35. Second wavelength converter 36 in wavelength conversion element 430C having such a configuration can have a thickness smaller than that of first wavelength converter 35. For this reason, the wavelength conversion efficiency of the second wavelength converter can be readily reduced compared to that of the first wavelength converter.

In wavelength conversion element 430D according to Modification 4 illustrated in FIG. 31C, reflective member 31 reaches the uppermost portion of the lateral surface of first wavelength converter 35. Second wavelength converter 36 covers a peripheral portion of first surface 35a of first wavelength converter 35. In other words, a portion of first surface 35a of first wavelength converter 35 excluding the central portion thereof is covered with second wavelength converter 36. Wavelength conversion element 430D having such a configuration can increase the wavelength conversion efficiency of first wavelength converter 35 because incident light 85a subjected to multiple reflection in first wavelength converter 35 is reflected not only on lateral surface 35c and second surface 35b but also on part of first surface 35a. At this time, second wavelength converter 36 on first wavelength converter 35 has a thickness smaller than the thickness thereof on first wavelength converter 35. The thickness of second wavelength converter 36 can be equal to or less than a half of the thickness of first wavelength converter 35. In such a configuration, emission light 91 emitted from first wavelength converter 35 can pass through second wavelength converter 36 on first wavelength converter 35 and be emitted therefrom, improving the uniformity of the luminance distribution of the central portion of the light emission region in wavelength conversion element 230A.

(Light Source Device of Embodiment 6)

A specific example of the light source device according to the present embodiment will now be described with reference to the drawing.

Figure 32:
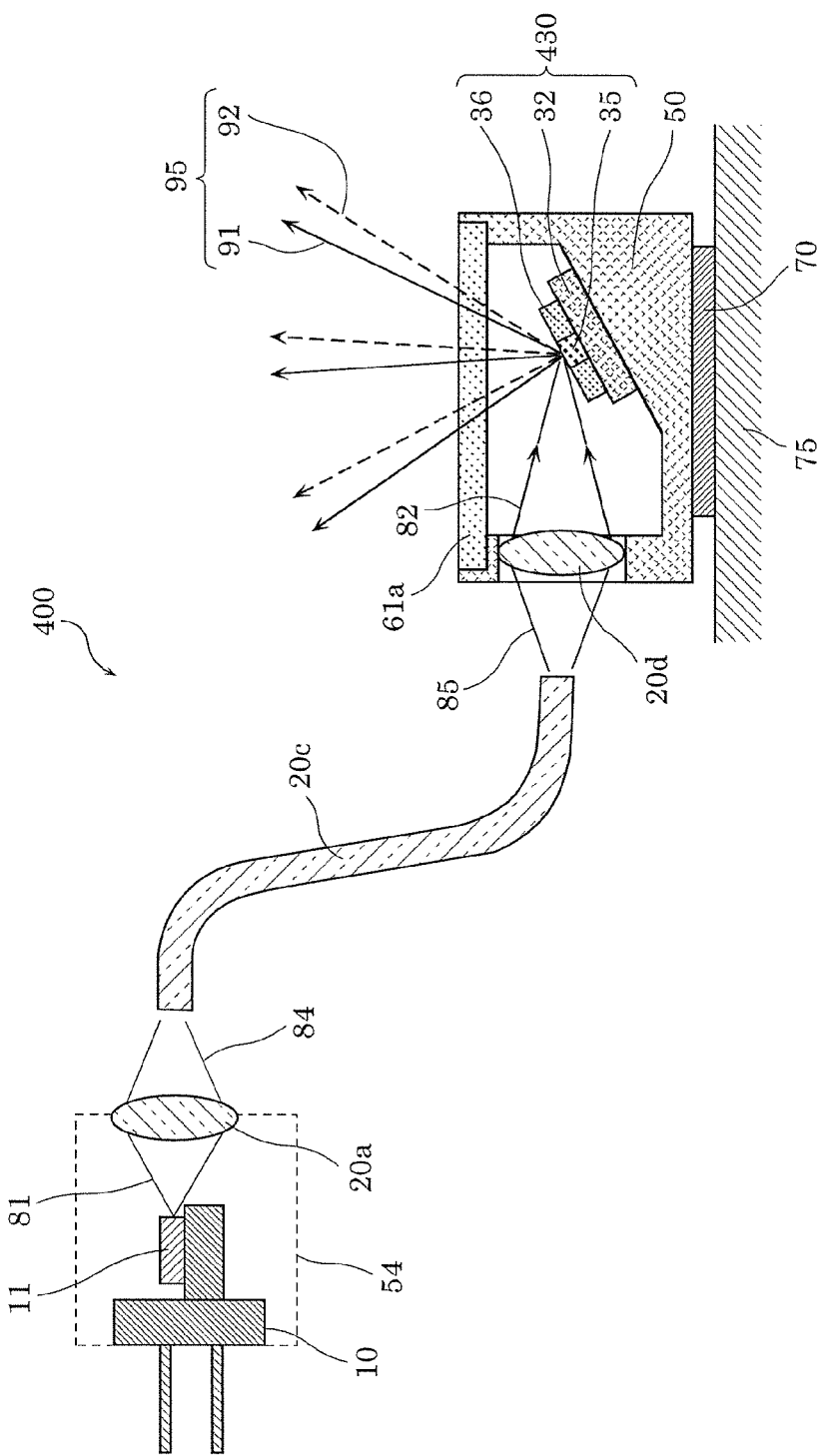
FIG. 32 is a sectional view schematically illustrating a schematic configuration of the light source device according to Embodiment 6.

FIG. 32 is a sectional view schematically illustrating a schematic configuration of light source device 400 according to the present embodiment.

As illustrated in FIG. 32, light source device 400 includes semiconductor light-emitting device 10, holder 54, lenses 20a and 20d, optical fiber 20c, housing 50, heat dissipating mechanism 70, and wavelength conversion element 430.

As illustrated in FIG. 32, semiconductor light-emitting device 10 and lens 20a are held with holder 54. Wavelength conversion element 430 is fixed to housing 50, and is covered with lens 20d and transparent cover member 61a. Housing 50 is attached to heat dissipating member 75 with heat dissipating mechanism 70 interposed therebetween. Here, heat dissipating mechanism 70 promotes heat dissipating of heat generated in housing 50. Examples of heat dissipating mechanism 70 to be used include a Peltier device. Such a configuration can efficiently dissipate heat generated in wavelength conversion element 430.

Excitation light 81 emitted from semiconductor light-emitting element 11 of semiconductor light-emitting device 10 is converted into propagation light 84 through lens 20a. Propagation light 84 is converged at one end of optical fiber 20c, and enters optical fiber 20c. Propagation light 84 which enters optical fiber 20c propagates inside optical fiber 20c, and is emitted from the other end of optical fiber 20c as propagation light 85. Propagation light 85 is converted into converged propagation light 82 through lens 20d. Propagation light 82 is emitted to first wavelength converter 35 and second wavelength converter 36 of wavelength conversion element 430. At this time, propagation light 82 on the incident surface of wavelength conversion element 430 has a light intensity distribution in which the incident surface of first wavelength converter 35 has a high light intensity and the incident surface of second wavelength converter 36 disposed around first wavelength converter 35 has a weak and continuous light intensity. Emission light 91, which is mixed light of the scattered light obtained by scattering propagation light 82 and the fluorescence generated by converting the wavelength of propagation light 82, is emitted from the first surface of first wavelength converter 35. Emission light 92, which is mixed light of scattered light generated by scattering propagation light 82 and the fluorescence generated by converting the wavelength of propagation light 82, is emitted from the first surface of second wavelength converter 36.

Such a configuration enables the emission of white light having high contrast in light emission distribution from wavelength conversion element 430 of light source device 400. Furthermore, the configuration above can thermally separate holder 54, to which a heating body, i.e., semiconductor light-emitting device 10 is fixed, from housing 50 to which wavelength conversion element 430 generating heat through the irradiation with propagation light 82 is fixed. Thereby, light source device 400 can prevent an increase in temperature of first wavelength converter 35, preventing a reduction in conversion efficiency accompanied by an increased in temperature of first wavelength converter 35. Accordingly, light source device 400 can emit light having high luminance.

Embodiment 7

A light source device according to Embodiment 7 will now be described. Unlike the wavelength conversion elements according to the embodiments described above, the wavelength conversion element included in the light source device according to the present embodiment includes two or more first wavelength converters 35. The light source device according to the present embodiment will now be described with reference to the drawings.

Figure 33:
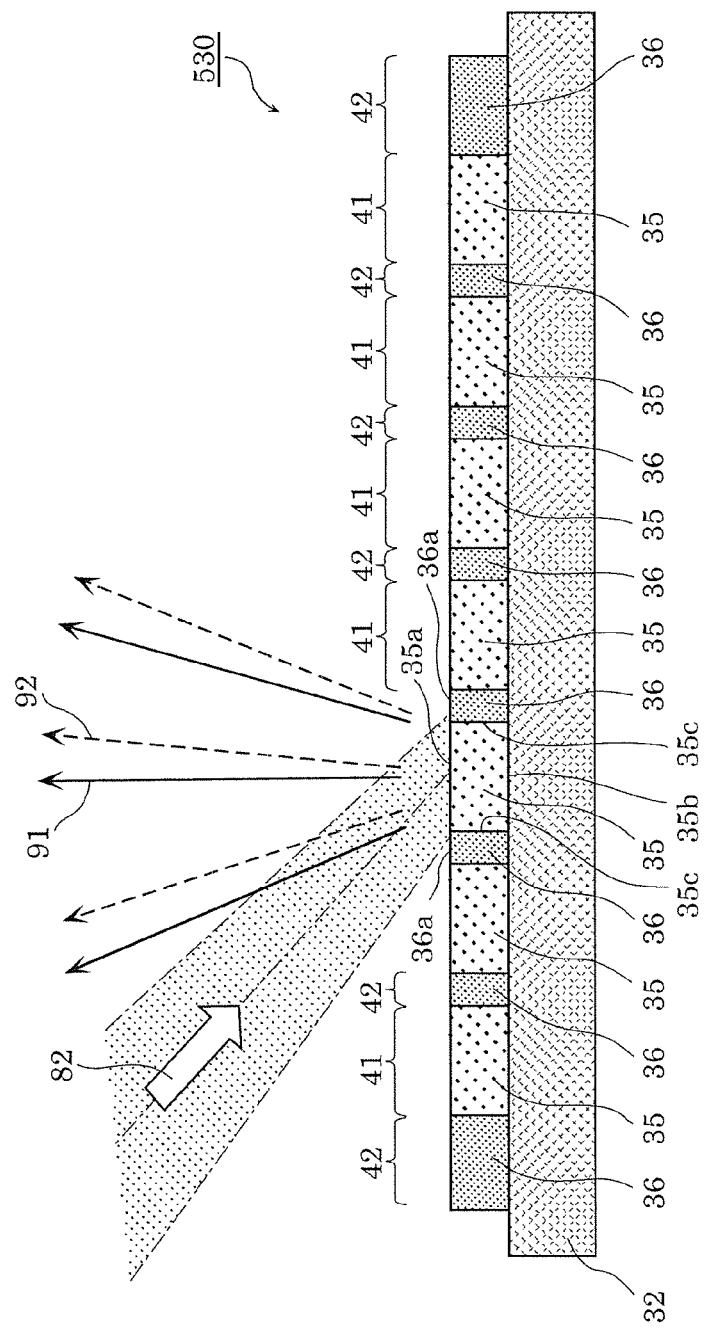
FIG. 33 is a schematic sectional view illustrating a schematic configuration of a wavelength conversion element included in a light source device according to Embodiment 7.
Figure 34:
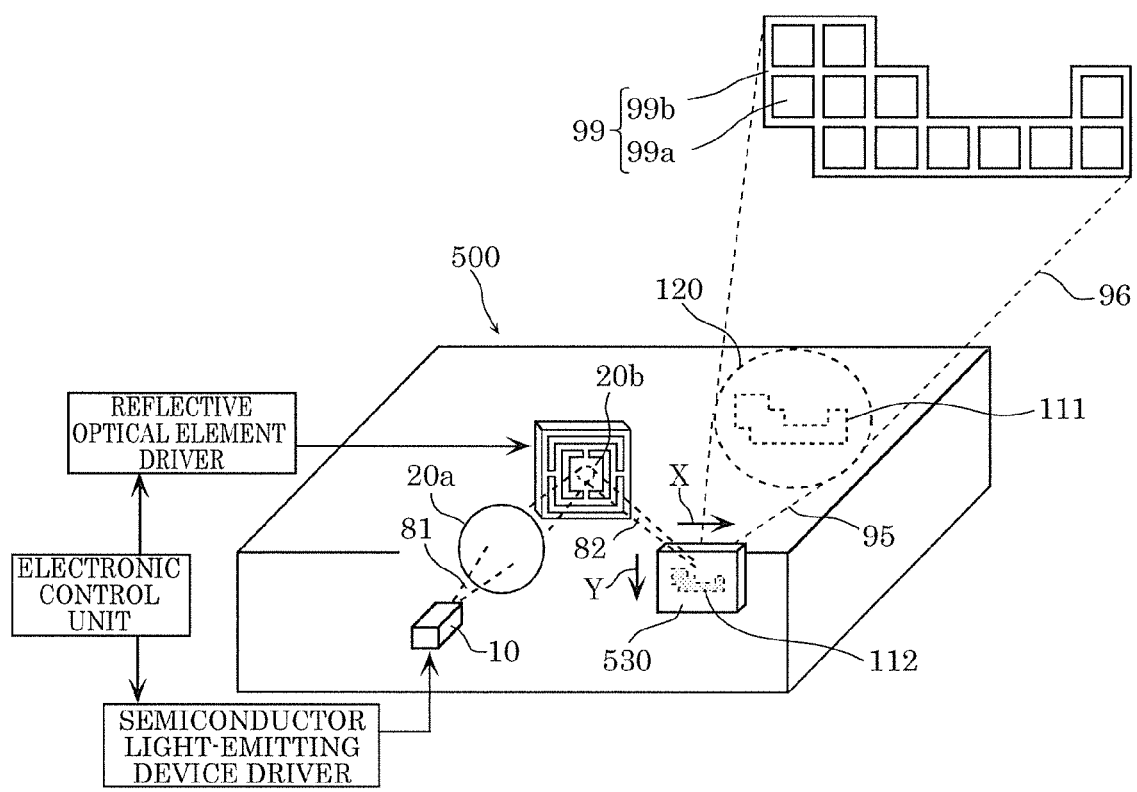
FIG. 34 is a schematic perspective view illustrating an outline of a configuration and operation of the light source device according to Embodiment 7.

FIG. 33 is a schematic sectional view illustrating a schematic configuration of wavelength conversion element 530 included in the light source device according to the present embodiment. FIG. 34 is a schematic perspective view illustrating the outline of a configuration and operation of light source device 500 according to the present embodiment.

As illustrated in FIG. 33, wavelength conversion element 530 according to the present embodiment includes two or more first wavelength converters 35. The two or more first wavelength converters 35 are fixed to a main surface of support member 32. Although not illustrated in FIG. 33, a reflective member may be disposed between support member 32 and this group of the two or more first wavelength converters 35. Second wavelength converter 36 is disposed around each of the first wavelength converters 35.

First wavelength converter 35 includes first emitting region 41 disposed on the surface thereof which propagation light 82 enters, and second wavelength converter 36 includes second emitting region 42 disposed on the surface thereof which propagation light 82 enters.

In the present embodiment, a case where seven first wavelength converters 35 are aligned will be described.

A method of producing wavelength conversion element 530 and a configuration thereof according to the present embodiment will now be described.

First, seven first wavelength converters 35, which are a ceramic YAG fluorescent substance, for example, are arranged at a predetermined interval, and are fixed onto the surface of support member 32 formed with an aluminum plate with an adhesive not illustrated, for example. A paste material for second wavelength converter 36 prepared with a mixture of a liquid transparent bonding material and fluorescent particles, for example, are then filled into the gaps between first wavelength converters 35 to be cured. At this time, second wavelength converter 36 is also disposed around first wavelength converter 35 disposed in the outermost periphery among first wavelength converters 35.

Support member 32 used in the production process above is in the form of a plate-shaped member having an outer shape of a 3 mm square to a 5 mm square having a thickness of 0.1 mm to 0.5 mm, for example.

First wavelength converter 35 used contains a ceramic YAG fluorescent substance having an outer shape of a 0.2 mm square to a 0.6 mm square and having a thickness of 0.03 mm to 0.1 mm, for example.

The interval between two adjacent first wavelength converters 35 is set in the range from 0.05 mm to 0.2 mm.

Second wavelength converter 36 used contains a mixture of YAG fluorescent substance particles having a relatively small particle diameter, for example, an average particle diameter D50 of 0.5 μm to 5 μm, with a transparent bonding material having a refractive index of 1.5 or less, such as silsesquioxane or a silicone resin. As described above, use of fluorescent particles having a small particle diameter and a transparent bonding material having a refractive index significantly different from that of the fluorescent particles can more significantly increase the reflectance to the excitation light (propagation light) than that of first wavelength converter 35.

Wavelength conversion element 530 illustrated in FIG. 33 is produced by the production method described above.

A case where only the region near the third first wavelength converter 35 from the left of FIG. 33 is irradiated with propagation light 82 among first wavelength converters 35 in wavelength conversion element 530 having such a configuration will be described.

In this case, most of components of propagation light 82 are emitted to first surface 35*a* of first wavelength converter 35 and first surfaces 36*a* of two second wavelength converters 36 disposed on two sides of first wavelength converter 35. At this time, part of the components of propagation light 82 entering first wavelength converter 35 from first surface 35*a* is subjected to multiple reflection on second surface 35*b* and lateral surface 35*c* inside first wavelength converter 35, providing a uniform light intensity distribution inside first wavelength converter 35. Part of the components of propagation light 82 is absorbed by the fluorescent substance in first wavelength converter 35, and is converted into fluorescence. The fluorescence is also subjected to multiple reflection on second surface 35*b* and lateral surface 35*c* inside first wavelength converter 35 as in propagation light 82, providing a uniform light intensity distribution inside first wavelength converter 35. Emission light 91 is emitted from first emitting region 41, emission light 91 being mixed light of the fluorescence and the propagation light (scattered light) which is subjected to the multiple reflection and has a uniform light intensity distribution. In contrast, propagation light which enters second wavelength converter 36 around first wavelength converter 35 is converted into emission light 92, which is mixed light of the fluorescence and the propagation light (scattered light) obtained by scattering second wavelength converter 36. Emission light 92 is then emitted from second emitting region 42.

Here, the ratio of the intensity of the fluorescence to that of the scattered light is lower in second wavelength converter 36 than that in first wavelength converter 35. In other words, the conversion efficiency of propagation light 82 into fluorescence per unit incident light amount on first surface 36*a* is lower than that on first surface 35*a*.

As a result, emission light having a uniform light intensity distribution can be emitted from first emitting region 41 disposed in the region near the third first wavelength converter 35 from the left of FIG. 33. At this time, emission light 92 emitted from second emitting region 42 has a low light intensity, and has a mixed spectrum of the spectrum of the propagation light and that of the fluorescence.

For this reason, white emission light 91 having a high uniform luminance can be emitted from the entire first emitting region 41 of the third first wavelength converter 35 from the left of FIG. 33 while white emission light 92 having a low luminance can be emitted from second wavelength converters 36 around the third first wavelength converter. In other words, wavelength conversion element 530 can also emit emission light having a sharp edge in the light intensity distribution and having a small color distribution. The light intensity distribution and the color distribution can be obtained according to the positions of first wavelength converters 35 even when the irradiation position of propagation light 82 is varied. In other words, by varying the irradiation position of propagation light 82, the white emission light having a sharp edge in the light intensity distribution on the light-emitting surface can be emitted from corresponding one of different first wavelength converters 35. In other words, first wavelength converter 35 can be selected corresponding to the light emission position from which the emission light having a sharp edge in the light intensity distribution on the light-emitting surface is emitted.

Furthermore, in the present embodiment, a shift of the irradiation position of propagation light 82 to a two-dimensional direction can lead to a shift of the light emission position of the emission light to the two-dimensional direction.

Such a shift of the light emission position in the two-dimensional direction can be performed by a configuration of wavelength conversion element 530 in which a plurality of first wavelength converters 35 is arranged in one direction and another plurality of first wavelength converters 35 is arranged in a direction orthogonal to the direction, that is, two or more first wavelength converters 35 are arranged in a matrix.

Light source device 500 will be described with reference to FIG. 34. In this example, wavelength conversion element 530 illustrated in FIG. 33 includes seven first wavelength converters 35 arranged in a transverse direction and three first wavelength converters 35 arranged in a direction orthogonal to the paper, and is incorporated into light source device 500.

Light source device 500 includes wavelength conversion element 530, semiconductor light-emitting device 10, lens 20*a*, and reflective optical element 20*b* having a mirror movable by an electromagnetic force, for example. Wavelength conversion element 530, semiconductor light-emitting device 10, lens 20*a*, and reflective optical element 20*b* are fixed to housing 50.

For example, semiconductor light-emitting device 10 in light source device 500 described above is electrically connected to a semiconductor light-emitting device driver which can feed a current pulse according to an instruction of an electronic control unit. Reflective optical element 20*b* is electrically connected to a reflective optical element driver which can feed electricity of any waveform according to an instruction of an electronic control unit. Light projecting member 120, for example, a projection lens is disposed facing the light emitting surface of wavelength conversion element 530.

Semiconductor light-emitting device 10 receives electricity from the semiconductor light-emitting device driver, and emits excitation light 81. Excitation light 81 is converted into propagation light 82 through lens 20*a*. Excitation light 81, i.e., parallel light or converged light enters reflective optical element 20*b*. At this time, reflective optical element 20*b* is set at any angle by the electricity from the reflective optical element driver. Thereby, propagation light 82 can be emitted to any position of wavelength conversion element 530. Here, assume that wavelength conversion element 530 in FIG. 34 includes seven first wavelength converters 35 in the transverse direction of the paper and three first wavelength converters 35 in the vertical direction thereof, and these first wavelength converters are arranged in a matrix.

As represented by arrow X and arrow Y in the drawing, for example, reflective optical element 20*b* emits propagation light 82 to the surface of wavelength conversion element 530 while the surface being scanned from the upper left to the upper right (row 1), from the left of the center (i.e., the left and the center in the vertical direction) to the right of the center (i.e., the right and the center in the vertical direction) (row 2), and from the lower left to the lower right (row 3) in a rear surface view of wavelength conversion element 30. At this time, a current from the semiconductor light-emitting device driver is applied to semiconductor light-emitting device 10, and propagation light 82 is sequentially emitted to columns 1 and 2 from the left in row 1, columns 1, 2, 3, and 7 from the left in row 2, and columns 2 to 7 from the left in row 3, for example. Thereby, projected image 99 is projected to an irradiation portion. Projected image 99 is a projected pattern formed on the surface of wavelength conversion element 530 by light projecting member 120 according to light emission pattern 112 of the light emission region.

At this time, projected image 99 is composed of projected images 99a, which are a plurality of projected patterns having a sharp edge in the light intensity distribution. Here, projected images 99a are projected images corresponding to first wavelength converters 35 which emit light. In addition, white projected images 99b having a weak light intensity are projected between two adjacent projected images 99a from second wavelength converters 36. An edge is formed according to the light intensity distribution of emission light 91 from first wavelength converter 35 at end portions of projected images 99a corresponding to first wavelength converters 35 which emit light.

Accordingly, use of the light source device according to the present embodiment enables the emission of white light having a high contrast in light emission distribution and the projection of projected image 99 having any projected pattern.

Moreover, white light having the values close or identical to those of the chromaticity coordinates of first wavelength converter 35 can be projected from the gaps between first wavelength converters 35, enabling the projection of projection light having a small color distribution.

Modification of Embodiment 7

A light source device according to a modification of Embodiment 7 will now be described with reference to FIG. 35.

Figure 35:
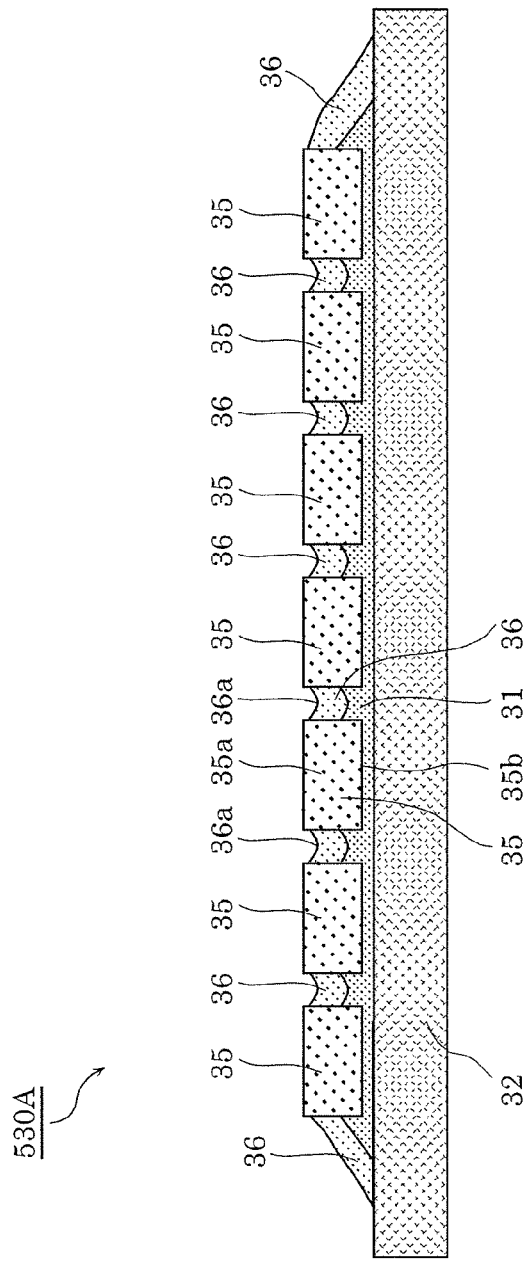
FIG. 35 is a schematic sectional view illustrating a schematic configuration of a wavelength conversion element included in a light source device according to a modification of Embodiment 7.

FIG. 35 is a schematic sectional view illustrating a schematic configuration of wavelength conversion element 530A included in the light source device according to the present modification.

In the present modification, two or more first wavelength converters 35 are fixed onto support member 32, such as a silicon substrate. At this time, reflective member 31 is disposed between this group of the two or more first wavelength converters 35 and support member 32. Reflective member 31 used can contain a mixture of particles having a high refractive index (such as $TiO_2$ particles having an average particle diameter D50 of 10 nm to 3 µm) and a transparent bonding material (such as silsesquioxane or silicone resin).

At this time, reflective member 31 may cover the bottom surface of each first wavelength converter 35 and part of the lateral surface thereof.

In such a configuration, reflective member 31 is disposed on second surface 35b and at least part of lateral surface 35c although propagation light 82 which enters first wavelength converter 35 from first surface 35a is subjected to the multiple reflection on second surface 35b and lateral surface 35c of first wavelength converter 35. For this reason, first wavelength converter 35 can have a higher reflectance to propagation light 82 on second surface 35b and lateral surface 35c, and can efficiently scatter propagation light 82, efficiently providing a uniform light intensity distribution of propagation light 82 and fluorescence inside first wavelength converter 35. Accordingly, the light source device including wavelength conversion element 530A according to the present embodiment can emit white light having a high contrast in light emission distribution.

Embodiment 8

A light source device according to Embodiment 8 will now be described with reference to FIG. 36.

Figure 36:
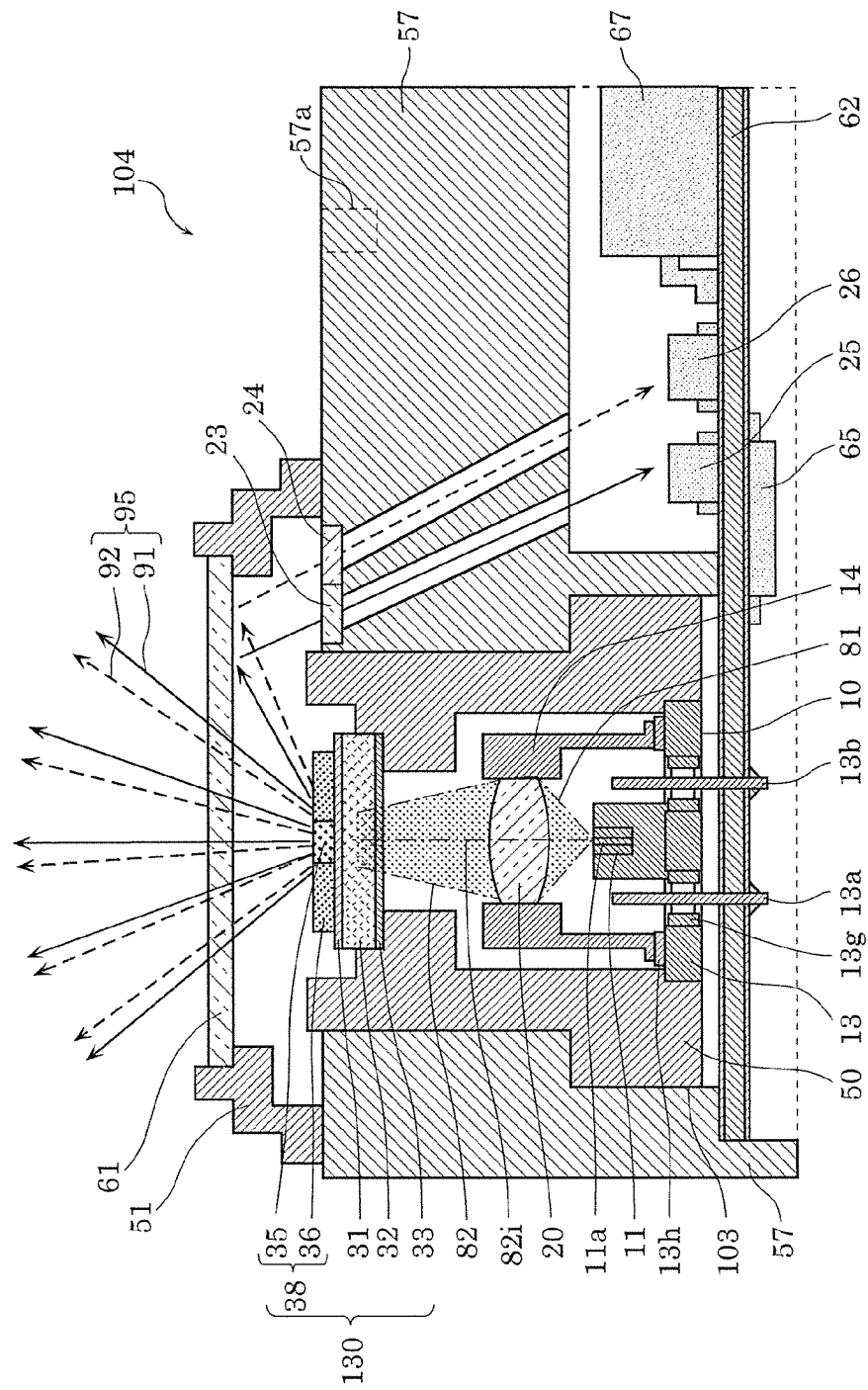
FIG. 36 is a schematic sectional view illustrating a configuration and function of a light source device according to Embodiment 8.

FIG. 36 is a schematic sectional view illustrating a configuration and function of light source device 104 according to the present embodiment.

As illustrated in FIG. 36, light source device 104 according to the present embodiment includes semiconductor light-emitting device 10, light converging optical system 20, wavelength conversion element 130, housing 50, and a second housing. Light source device 104 further includes print substrate 62 on which microcontroller 65, first photodetector 25, second photodetector 26, and connector 67 are mounted.

Similarly to the modification of Embodiment 2 and Modification 2 of Embodiment 4, light source device 104 according to the present embodiment includes wavelength conversion element 130 including first wavelength converter 35 and second wavelength converter 36 made of different fluorescent materials. Support member 32 of wavelength conversion element 130 is made of a transparent material to propagation light 82, and propagation light 82 enters wavelength conversion element 130 from the side of support member 32.

In the present embodiment, light converging optical system 20 is attached to semiconductor light-emitting device 10. Semiconductor light-emitting device 10 and wavelength conversion element 130 are fixed to housing 50, forming light source device 103 having the same configuration as that of light source device 101 according to the modification of Embodiment 2. Furthermore, housing 50 is fixed to second housing 57 in the present embodiment. Semiconductor light-emitting device 10 is connected to print substrate 62 on which microcontroller 65 and first photodetector 25 are mounted. Print substrate 62 is fixed to second housing 57, forming light source device 104.

Semiconductor light-emitting device 10 includes semiconductor light-emitting element 11, such as a nitride semiconductor laser, and package 13 to which semiconductor light-emitting element 11 is fixed. Package 13 includes a disc base, and posts. Lead pins 13a and 13b are attached to the base. The base and the posts are made of oxygen-free copper, for example. Lead pins 13a and 13b are fixed to the base through buffer ring 13g and an insulation material.

Light converging optical system 20 is a lens, for example. In the present embodiment, light converging optical system 20 is fixed to the base of package 13 with metal can 14. At this time, metal can 14 is fixed to welding support 13h disposed on the base.

Housing 50 is a base made of a metal, such as an aluminum alloy and having a through hole in the center thereof. Semiconductor light-emitting device 10 is fixed to one surface of housing 50 connecting to the through hole. The other surface of housing 50 connecting to the through hole includes wavelength conversion element 130 fixed thereto. As described above, light source device 104 includes an optical system substantially identical to that in the modification of Embodiment 2 illustrated in FIG. 13.

Second housing 57 is a base made of a metal, such as an aluminum alloy, and includes a through hole for fixing housing 50, and two through holes for guiding light emitted from wavelength conversion element 130 to first photodetector 25 and second photodetector 26.

Print substrate 62 is connected to semiconductor light-emitting device 10, and is fixed to the surface opposite to the surface of second housing 57 in which wavelength conversion element 130 is disposed.

Light source device 104 further includes first filter 23, second filter 24, and cover members 51 and 61 on the surface opposite to the surface of second housing 57 to which print substrate 62 is fixed.

Cover member 61 is made of a transparent material, such as transparent glass. Cover member 61 is held with cover member 51 made of a metal member, for example, and is fixed to second housing 57 so as to cover wavelength conversion element 130, first filter 23, and second filter 24.

Cover member 61 also has a function to guide part of the components of emission light 95 emitted from wavelength conversion element 130 to first photodetector 25 and second photodetector 26. The action on emission light 95 by cover member 61, for example, will now be described.

Excitation light 81 emitted from semiconductor light-emitting device 10 is converged by light converging optical system 20, and is emitted to wavelength conversion element 130. When emission light 95 emitted from wavelength conversion element 130 passes through cover member 61, part of the components of emission light 95 is reflected on cover member 61, and enters first filter 23 and second filter 24. At this time, emission light 95 toward first photodetector 25 enters first filter 23. Emission light 95 toward second photodetector 26 enters second filter 24.

The operation of the light source device having the configuration above is the same as those in the light source devices according to other embodiments, that is, the light guided to first photodetector 25 and second photodetector 26 is photoelectrically converted, and is input into a microcontroller not illustrated.

As described above, the configuration of light source device 104 according to the present embodiment can readily impart a desired function to light source device.

Modification of Embodiment 8

A light source device according to a modification of Embodiment 8 will now be described. The light source device according to the present modification includes first photodetector 25 as in light source device 104 according to Embodiment 8, and is different from light source device 104 according to Embodiment 8 in the arrangement of first photodetector 25. Differences between the light source device according to the present modification and light source device 104 according to Embodiment 8 will now be mainly described with reference to the drawings.

Figure 37:
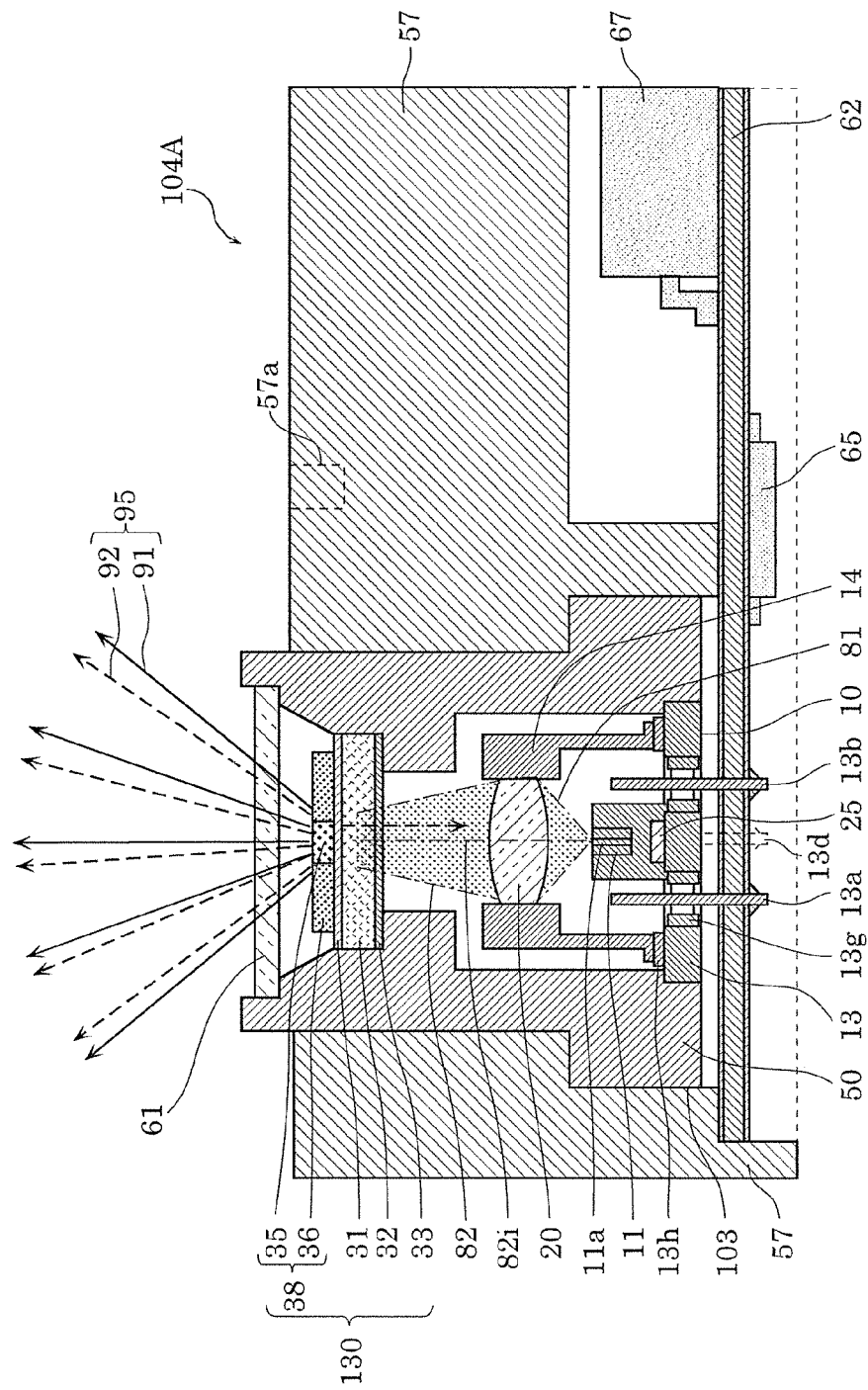
FIG. 37 is a schematic sectional view illustrating a configuration and function of a light source device according to a modification of Embodiment 8.
Figure 38:
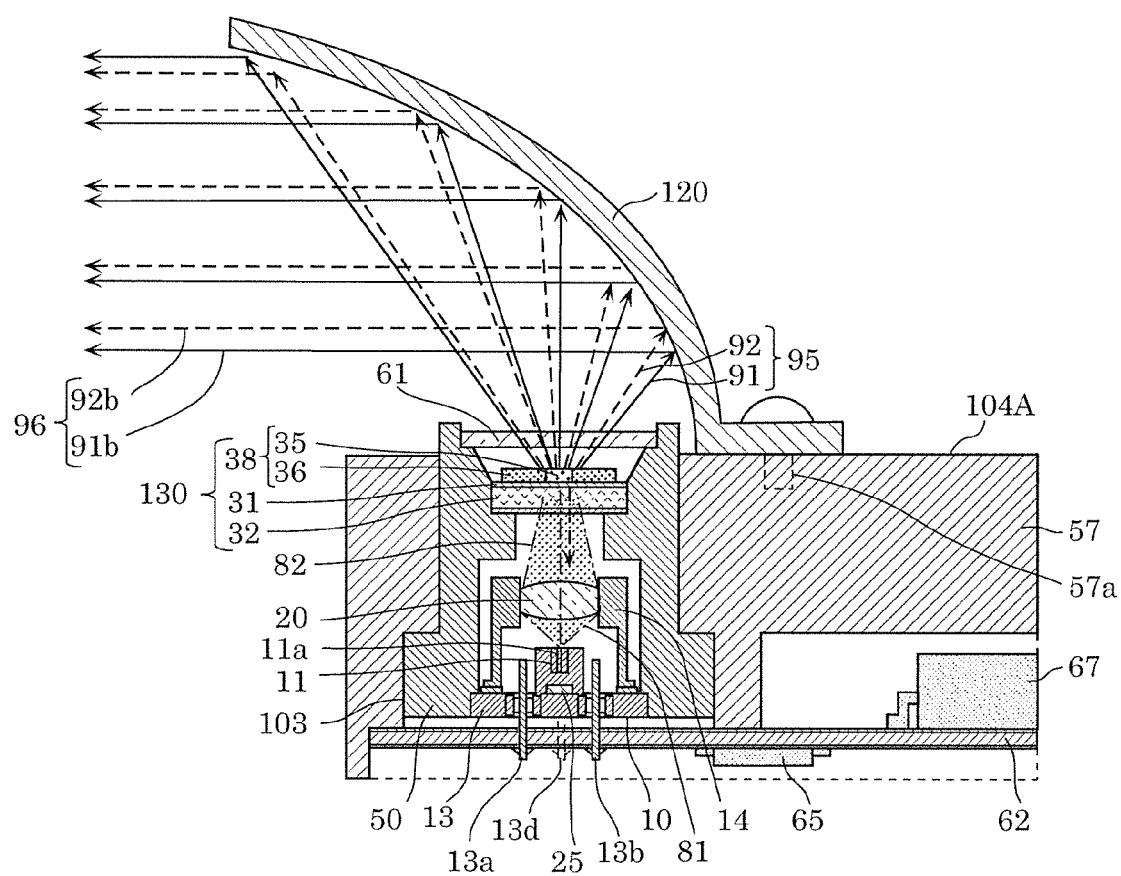
FIG. 38 is a schematic sectional view illustrating a specific configuration of the light source device according to the modification of Embodiment 8 to which a light projecting member is attached.
Figure 39:
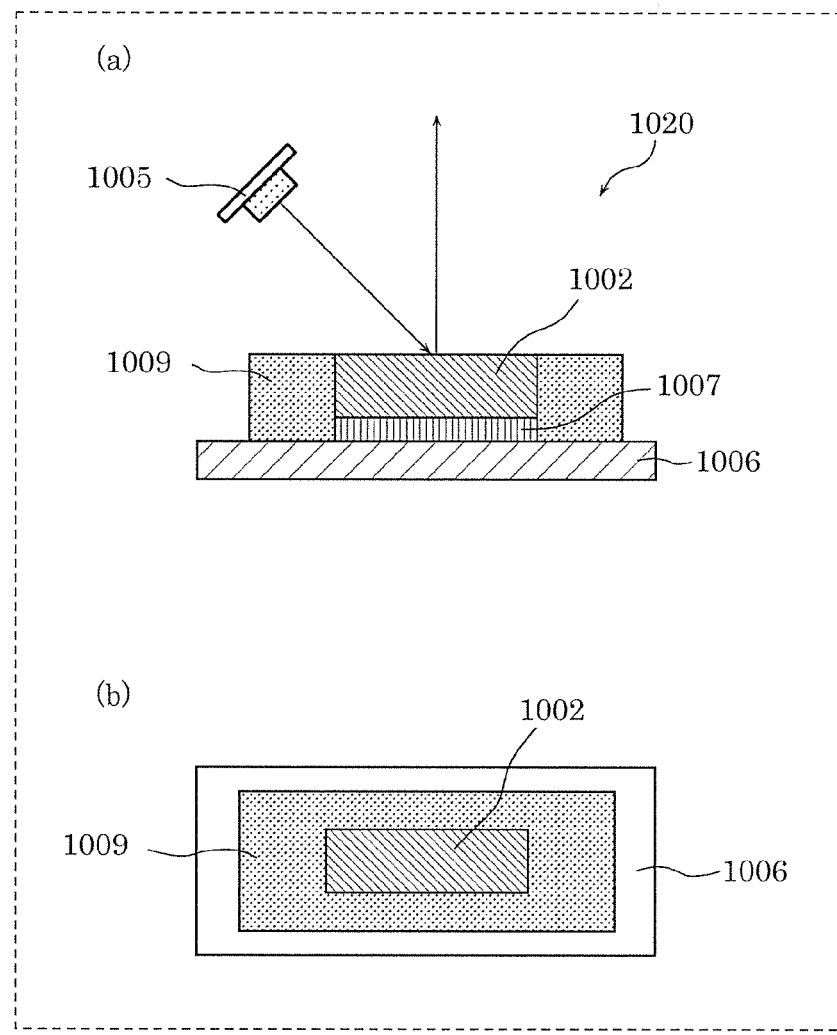
FIG. 39 is a schematic view illustrating a conventional light source device.

FIG. 37 is a schematic sectional view illustrating a configuration and function of light source device 104A according to the present modification. FIG. 38 is a schematic sectional view illustrating a specific configuration of light source device 104A according to the present modification to which light projecting member 120 is attached.

As illustrated in FIG. 37, light source device 104A according to the present modification includes semiconductor light-emitting device 10, and wavelength conversion element 130. Light source device 104A further includes housing 50 to which semiconductor light-emitting device 10 and wavelength conversion element 130 are fixed, and second housing to which housing 50 is fixed, print substrate 62, and first photodetector 25.

Similarly to the modification of Embodiment 2, Modification 2 of Embodiment 4, and Embodiment 8, light source device 104A according to the present modification includes wavelength conversion element 130 including first wavelength converter 35 and second wavelength converter 36 made of different fluorescent materials. Support member 32 of wavelength conversion element 130 is made of a transparent material to propagation light 82, and propagation light 82 enters wavelength conversion element 130 from the side of support member 32.

In the present modification, first photodetector 25 is fixed to semiconductor light-emitting device 10.

Semiconductor light-emitting device 10 according to the present modification includes package 13 having a base, to which lead pins 13a and 13b, lead pin 13c (not illustrated), and lead pin 13d are attached. Semiconductor light-emitting element 11 and first photodetector 25 are fixed to package 13. In semiconductor light-emitting device 10 including semiconductor light-emitting element 11 and first photodetector 25, semiconductor light-emitting element 11 is electrically connected to lead pins 13a and 13b. First photodetector 25 is electrically connected to lead pins 13c and 13d.

As described above, housing 50 in light source device 104A is fixed to second housing 57. Print substrate 62 on which microcontroller 65 and connector 67 are mounted is electrically connected to lead pins 13a, 13b, 13c, and 13d of semiconductor light-emitting device 10, and is fixed to second housing 57.

Excitation light 81 emitted from optical waveguide 11a disposed on semiconductor light-emitting element 11 is emitted to wavelength conversion element 130 by light converging optical system 20. Excitation light 81 passes through reflective member 31, and is emitted to first wavelength converter 35 and second wavelength converter 36. At this time, reflective member 31 passes light having a wavelength identical to that of excitation light 81, and reflects light generated in first wavelength converter 35 and second wavelength converter 36. Accordingly, reflective member 31 has the same function as that of first filter 23.

The operation of the light source device having the configuration is the same as those in the light source devices according to other embodiments, that is, the light guided to first photodetector 25 is photoelectrically converted, and is input into a microcontroller not illustrated.

As illustrated in FIG. 38, light projecting member 120 may be attached to light source device 104A. In the example illustrated in FIG. 38, light projecting member 120, such as a parabolic mirror, is attached to light source device 104A illustrated in FIG. 37. Here, second housing 57 has screw hole 57a formed on the surface thereof close to wavelength conversion element 130. Light projecting member 120 can be readily fixed to light source device 104A with this screw hole 57a. In a light projector including such a light source device 104A and light projecting member 120, emission light 91 and emission light 92 forming emission light 95 emitted from light source device 104A are converted into emission light 91b and 92b by light projecting member 120, respectively. Emission light 91b and emission light 92b traveling substantially parallel are emitted. In other words, projection light 96 having high directivity can be emitted from the light projector.

As described above, the configuration of light source device 104A according to the present embodiment can readily provide light source device 104A having a desired function.

Other Modifications

Although the light source devices and the lighting devices according to the present disclosure have been described based on the embodiments, these embodiments will not be limitative to the present disclosure.

For example, although two wavelength converters are used in the configurations of the embodiments and modifications thereof described above, three or more wavelength converters may be used. Thereby, the wavelength distribution of emission light can be more freely designed.

In the embodiments and modifications thereof described above, the term "surround first wavelength converter 35" encompasses any other configuration than the configuration in which the second wavelength converter is completely disposed around the entire circumference of the first wavelength converter. The second wavelength converter is disposed around at least a half of the entire circumference of the first wavelength converter.

Besides, embodiments obtained by a variety of modifications of the embodiments conceived and made by persons skilled in the art and embodiments implemented with any combination of components and functions in the embodiments without departing the gist of the present disclosure are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

As described above, the light source devices and lighting devices according to the present disclosure can have high usage efficiency of excitation light, and enables free design of the luminance distribution and color distribution around spot images. For this reason, the light source devices and the lighting devices according to the present disclosure are useful as a variety of light source devices and lighting devices, such as headlamps for vehicles, railroad vehicles, and bicycles, and light sources for spotlights.

What is claimed is:

1. A light source device, comprising:
a semiconductor light-emitting device which emits excitation light that is coherent; and
a wavelength conversion element which is spaced from the semiconductor light-emitting device, generates fluorescence by converting a wavelength of the excitation light emitted from the semiconductor light-emitting device, and generates scattered light by scattering the excitation light,
wherein the wavelength conversion element includes a support member, and a wavelength converter disposed on the support member,
the wavelength converter includes a first wavelength converter, and a second wavelength converter which is disposed around the first wavelength converter to surround the first wavelength converter in a top view of a surface of the support member on which the wavelength converter is disposed,
the first wavelength converter has a first surface, a second surface and a lateral surface, the second surface faces the support member, the first surface is opposite to the second surface, and the lateral surface connects the first surface to the second surface,
the wavelength conversion element includes a reflective member which covers part of at least part of the lateral surface, and
the second wavelength converter is in direct contact with part of the lateral surface.

2. The light source device according to claim 1, wherein the first wavelength converter contains fluorescent particles and a transparent bonding material.

3. The light source device according to claim 2, wherein the first wavelength converter is a ceramic YAG fluorescent substance.

4. The light source device according to claim 2, wherein fluorescent particles contained in the second wavelength converter have an average particle diameter different from an average particle diameter of fluorescent particles contained in the first wavelength converter.

5. The light source device according to claim 2, wherein the fluorescent particles contained in the first wavelength converter have a volume proportion different from a volume proportion of the fluorescent particles contained in the second wavelength converter.

6. The light source device according to claim 1, wherein the second wavelength converter contains a fluorescent material different from a fluorescent material contained in the first wavelength converter.

7. The light source device according to claim 1,
wherein the wavelength converter includes two or more first wavelength converters, and
the second wavelength converter is disposed around the two or more first wavelength converters.

8. The light source device according to claim 7, wherein the two or more first wavelength converters are scanned with the excitation light.

9. A light source device, comprising:
a semiconductor light-emitting device which emits excitation light that is coherent; and
a wavelength conversion element which is spaced from the semiconductor light-emitting device, generates fluorescence by converting a wavelength of the excitation light emitted from the semiconductor light-emitting device, and generates scattered light by scattering the excitation light,
wherein the wavelength conversion element includes a support member, and a wavelength converter disposed on the support member,
the wavelength converter includes two or more first wavelength converters disposed on the support member to be spaced from each other, and a second wavelength converter disposed around the two or more first wavelength converters to be in direct contact with each of the two or more first wavelength converters,
each of the two or more first wavelength converters includes a first emitting region which emits a first emission light,
the second wavelength converter includes a second emitting region which emits a second emission light,
a chromaticity coordinate x of the first emission light of the first emitting region and chromaticity coordinate x of the second emission light of the second emitting region are each distributed between 0.2 and 0.4, and
the two or more first wavelength converters are scanned with the excitation light.

10. The light source device according to claim 9, wherein the second wavelength converter has an average refractive index smaller than an average refractive index of the two or more first wavelength converters.

11. The light source device according to claim 7, wherein the two or more first wavelength converters are arranged in a matrix.

12. The light source device according to claim 7, wherein a projected pattern is formed corresponding to a pattern of the excitation light which scans the two or more first wavelength converters.

13. The light source device according to claim 9, wherein the two or more first wavelength converters are a ceramic YAG fluorescent substance.

14. The light source device according to claim 1, wherein the first wavelength converter contains a plurality of air voids.

15. The light source device according to claim 9,
wherein the wavelength conversion element includes a reflective member disposed between the wavelength converter and the support member, and
the reflective member covers at least part of each of lateral surfaces of the two or more first wavelength converters.

16. A lighting device, comprising:
the light source device according to claim 1.

17. The light source device according to claim 1, wherein a ratio of an intensity of the fluorescence to an intensity of the scattered light is lower in the second wavelength converter than in the first wavelength converter.

18. The light source device according to claim 1,
wherein the first wavelength converter includes a first emitting region into which part of the excitation light enters, and which emits a first emission light,
the second wavelength converter includes a second emitting region into which another part of the excitation light enters, and which emits a second emission light,
a chromaticity coordinate x of the first emission light of the first emitting region and chromaticity coordinate x of the second emission light of the second emitting region are each distributed between 0.2 and 0.4.

19. The light source device according to claim 9,
wherein part of the excitation light enters the first emitting region, and another part of the excitation light enters the second emitting region.

20. A light source device, comprising:
a semiconductor light-emitting device which emits excitation light that is coherent; and
a wavelength conversion element which is spaced from the semiconductor light-emitting device, generates fluorescence by converting a wavelength of the excitation light emitted from the semiconductor light-emitting device, and generates scattered light by scattering the excitation light,
wherein the wavelength conversion element includes a support member, and a wavelength converter disposed on the support member,
the wavelength converter includes a first wavelength converter, and a second wavelength converter which is disposed around the first wavelength converter to surround the first wavelength converter in a top view of a surface of the support member on which the wavelength converter is disposed,
the first wavelength converter has a first surface, a second surface and a lateral surface, the second surface faces the support member, the first surface is opposite to the second surface, and the lateral surface connects the first surface to the second surface,
the wavelength conversion element includes a reflective member which covers at least part of the lateral surface,
a maximum height of the first wavelength converter from the surface of the support member is greater than a maximum height of the reflective member from the surface of the support member, and
the second wavelength converter is in direct contact with at least part of the lateral surface which is located farther from the support member than the at least part of the lateral surface covered by the reflective member is.

* * * * *